(12) United States Patent  
Fujii et al.

(10) Patent No.: US 9,122,151 B2  
(45) Date of Patent: Sep. 1, 2015

(54) RESIST COMPOSITION, RESIST FILM THEREFROM AND METHOD OF FORMING NEGATIVE PATTERN USING THE COMPOSITION

(75) Inventors: Kana Fujii, Shizuoka (JP); Hidenori Takahashi, Shizuoka (JP); Fumiyuki Nishiyama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/406,165

(22) Filed: Feb. 27, 2012

(65) Prior Publication Data

US 2012/0219891 A1 Aug. 30, 2012

(30) Foreign Application Priority Data

Feb. 28, 2011 (JP) ................ 2011-042891

(51) Int. Cl.
| | |
|---|---|
| *G03F 7/004* | (2006.01) |
| *G03F 7/20* | (2006.01) |
| *G03F 7/039* | (2006.01) |
| *G03F 7/32* | (2006.01) |
| *B23B 3/10* | (2006.01) |

(52) U.S. Cl.
CPC .............. *G03F 7/004* (2013.01); *G03F 7/0397* (2013.01); *G03F 7/20* (2013.01); *G03F 7/2041* (2013.01); *G03F 7/325* (2013.01); *B23B 3/10* (2013.01); *G03F 7/0045* (2013.01); *G03F 7/0046* (2013.01)

(58) Field of Classification Search
None
See application file for complete search history.

(56) References Cited

U.S. PATENT DOCUMENTS

| 7,304,175 | B2 | 12/2007 | Harada et al. | |
|---|---|---|---|---|
| 2006/0264528 | A1* | 11/2006 | Wada .......................... | 522/130 |
| 2007/0122750 | A1* | 5/2007 | Yamaguchi et al. .......... | 430/311 |
| 2008/0153030 | A1* | 6/2008 | Kobayashi et al. ......... | 430/270.1 |
| 2008/0213695 | A1* | 9/2008 | Yamaguchi et al. ........ | 430/281.1 |
| 2009/0075202 | A1 | 3/2009 | Kodama et al. | |
| 2010/0190106 | A1 | 7/2010 | Tsubaki | |
| 2010/0233629 | A1 | 9/2010 | Wada | |
| 2010/0323305 | A1* | 12/2010 | Tsubaki et al. .............. | 430/325 |
| 2010/0330497 | A1 | 12/2010 | Ichikawa et al. | |
| 2011/0014570 | A1 | 1/2011 | Mizutani et al. | |

FOREIGN PATENT DOCUMENTS

| JP | 2003-173026 A | | 6/2003 |
|---|---|---|---|
| JP | 2005-266766 A | | 9/2005 |
| JP | 2005266766 A | * | 9/2005 |
| JP | 2006-257078 A | | 9/2006 |
| JP | 2006-330098 A | | 12/2006 |
| JP | 2007241107 A | * | 9/2007 |
| JP | 2008-195868 A | | 8/2008 |
| JP | 2008268744 A | * | 11/2008 |
| JP | 2009-093011 A | | 4/2009 |
| JP | 2009-222939 A | | 10/2009 |
| JP | 2010-020204 A | | 1/2010 |
| JP | 2010-039145 A | | 2/2010 |
| JP | 2010-039146 A | | 2/2010 |
| JP | 2010-164958 A | | 7/2010 |
| JP | 2010-271686 A | | 12/2010 |
| JP | 2011-028231 A | | 2/2011 |
| WO | WO 2008/153110 A1 | | 12/2008 |
| WO | 2010-123101 A1 | | 10/2010 |
| WO | WO 2010114107 A1 | * | 10/2010 |

OTHER PUBLICATIONS

Machine translation JP 2008-195868. Aug. 28, 2008.*
Machine translation JP 2005-266766. Sep. 29, 2005.*
Machine translation JP 2008-268744. Nov. 6, 2008.*
Machine translation JP 2007-241107. Sep. 20, 2007.*
Japanese Office Action dated Jan. 22, 2013, issued in corresponding Japanese Patent Application No. 2011-042891.
Korean Office Action issued in corresponding application No. 2012-19699 dated Nov. 30, 2013.

* cited by examiner

*Primary Examiner* — Cynthia H Kelly
*Assistant Examiner* — Alyssa L Cepluch
(74) *Attorney, Agent, or Firm* — Sughrue Mion, PLLC

(57) ABSTRACT

A resist composition includes a resin (A) containing any of repeating units (a) of general formulae (I-a) and (I-b) below and any of repeating units (b) of general formula (II) below but containing substantially no repeating unit in which an alcoholic hydroxyl group is introduced, and any of compounds (B) of general formulae (III-a) and (III-b) below.
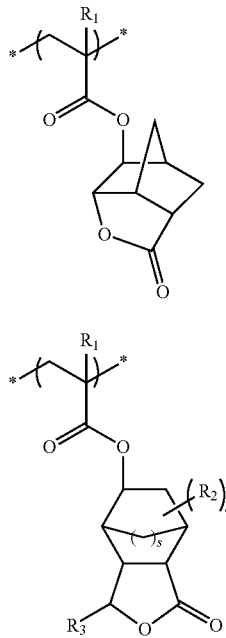
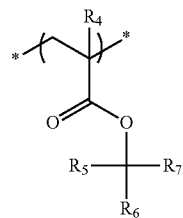
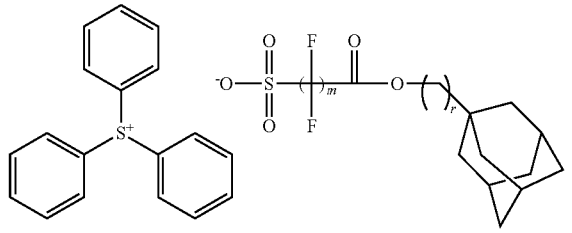
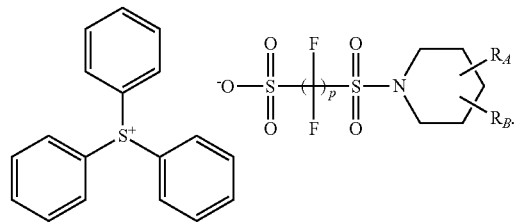
12 Claims, 2 Drawing Sheets 52.8nm
0.2μm 63.8nm
0.2μm

RESIST COMPOSITION, RESIST FILM THEREFROM AND METHOD OF FORMING NEGATIVE PATTERN USING THE COMPOSITION

CROSS-REFERENCE TO RELATED APPLICATIONS

This application is based upon and claims the benefit of priority from prior Japanese Patent Application No. 2011-042891, filed Feb. 28, 2011, the entire contents of which are incorporated herein by reference.

BACKGROUND OF THE INVENTION

1. Field of the Invention

The present invention relates to a resist composition, a resist film therefrom and a method of forming a negative pattern using the composition. More particularly, the present invention relates to a resist composition that finds application in, for example, a semiconductor production process for an IC or the like, a circuit board production process for a liquid crystal, a thermal head or the like and other photofabrication lithography processes, and also to a resist film from the composition and a method of forming a negative pattern using the composition.

2. Description of the Related Art

Since the development of the resist for a KrF excimer laser (248 nm), it has been of common practice to employ a pattern forming method through chemical amplification in order to compensate for any sensitivity deterioration caused by light absorption.

Heretofore, a vast variety of formulations have been proposed for the pattern forming method using a positive developer (namely, an alkali developer) and the positive resist composition for use in the method (see, for example, patent references 1 to 3). In addition, in recent years, research and development are being promoted for the pattern forming method using a negative developer (namely, a developer containing an organic solvent) and the negative resist composition for use in the method (see, for example, patent references 4 to 7).

Relatively favorable resist performance can be attained by employing the achieved formulations and developments. However, with respect to the depth of focus margin (DOF) in forming an isolated-contact-hole pattern, there is room for further improvements.

Herein, the expression "isolated-contact-hole pattern" refers to a pattern in which the inter-hole pitch is greater than twice the hole size.

PATENT LITERATURE

[Patent reference 1] Jpn. Pat. Appln. KOKAI Publication No. (hereinafter referred to as JP-A-) 2006-257078,
[Patent reference 2] JP-A-2005-266766,
[Patent reference 3] JP-A-2006-330098,
[Patent reference 4] JP-A-2007-325915,
[Patent reference 5] International Publication No. 2008-153110 (pamphlet),
[Patent reference 6] JP-A-2010-039146, and
[Patent reference 7] JP-A-2010-164958.

BRIEF SUMMARY OF THE INVENTION

It is an object of the present invention to provide a resist composition that excels in the depth of focus margin (DOF) in forming an isolated-contact-hole pattern. It is further objects of the present invention to provide a resist film therefrom and a method of forming a negative pattern using the composition.

Followings are some aspects of the present invention.

[1] A resist composition comprising:
a resin (A) containing any of repeating units (a) of general formulae (I-a) and (I-b) below and any of repeating units (b) of general formula (II) below but containing substantially no repeating unit in which an alcoholic hydroxyl group is introduced, and
any of compounds (B) of general formulae (III-a) and (III-b) below.

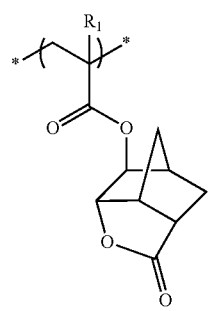

(I-a)

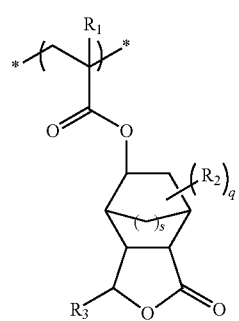

(I-b)

In the formulae,
$R_1$ represents a hydrogen atom or a methyl group,
$R_2$, when $q \geq 2$ each independently, represents an alkyl group,
$R_3$ represents a hydrogen atom or an alkyl group,
q is an integer of 0 to 3, and
s is an integer of 1 to 3.

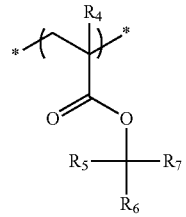

(II)

In the formula,
$R_4$ represents a hydrogen atom or a methyl group, and
each of $R_5$, $R_6$ and $R_7$ independently represents an alkyl group or a monocycloalkyl group, provided that any two of $R_5$, $R_6$ and $R_7$ may be bonded to each other to thereby form a monocyclic ring.

(III-a)

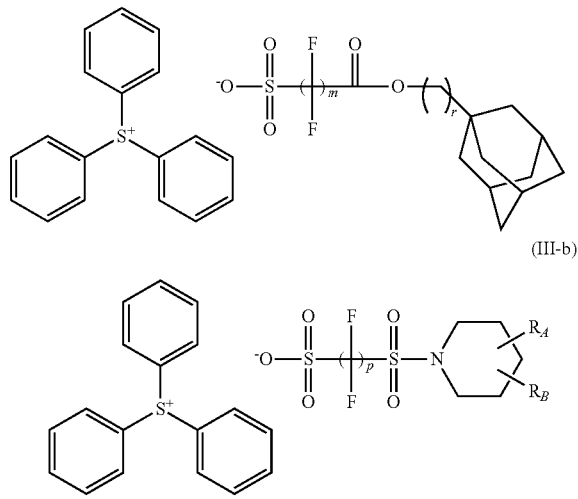

(III-b)

In the formulae,
m is an integer of 1 to 5,
r is an integer of 0 to 3,
each of $R_A$ and $R_B$ independently represents an alkyl group, provided that $R_A$ and $R_B$ may be bonded to each other to thereby form a ring, and
p is an integer of 1 to 5.

[2] The composition according to item [1], wherein the resin (A) further contains a repeating unit (c) different from the repeating units (b), the repeating unit (c) containing a group that when acted on by an acid, is decomposed.

[3] The composition according to item [2], wherein the repeating unit (c) is expressed by general formula (IV) below.

(IV)

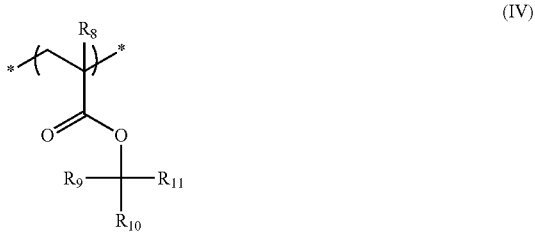

In the formula,
$R_8$ represents a hydrogen atom or a methyl group, and
each of $R_9$, $R_{10}$ and $R_{11}$ independently represents an alkyl group or a cycloalkyl group, provided that at least one of $R_9$, $R_{10}$ and $R_{11}$ represents a polycycloalkyl group and that any two of $R_9$, $R_{10}$ and $R_{11}$ may be bonded to each other to thereby form a polycyclic hydrocarbon structure.

[4] The composition according to item [2] or [3], wherein the resin (A) contains the repeating unit (a) in an amount of 30 to 55 mol %, the repeating unit (b) in an amount of 30 to 65 mol % and the repeating unit (c) in an amount of 5 to 30 mol %.

[5] The composition according to any of items [1] to [4], wherein the resin (A) has a weight average molecular weight ranging from 5000 to 30,000.

[6] The composition according to any of items [1] to [5], further comprising any of compounds of general formula (PDA-1) below.

(PDA-1)

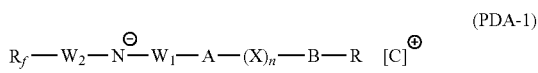

In the formula,
Rf represents an alkyl group, a cycloalkyl group or an aryl group,
each of $W_1$ and $W_2$ independently represents $-SO_2-$ or $-CO-$,
A represents a single bond or a bivalent connecting group,
X represents $-SO_2-$ or $-CO-$,
n is 0 or 1,
B represents a single bond, an oxygen atom or $-N(Rx)Ry-$, in which Rx represents a hydrogen atom or a monovalent organic group, and Ry represents a single bond or a bivalent organic group, provided that Rx may be bonded to Ry to thereby form a ring or may be bonded to R to thereby form a ring,
R represents a monovalent organic group containing the functional group with proton acceptor properties, and
$[C]^+$ represents a counter cation.

[7] The composition according to any of items [1] to [6], further comprising a solvent containing propylene glycol monomethyl ether acetate and cyclohexanone.

[8] A resist film produced from the composition according to any of items [1] to [7].

[9] A method of forming a negative pattern, comprising:
forming the composition according to any of claims 1 to 7 into a film,
exposing the film to light, and
developing the exposed film with a developer containing an organic solvent.

[10] The method of forming a negative pattern according to item [9], further comprising rinsing the developed film.

[11] A process for manufacturing an electronic device, comprising the pattern forming method according to item [9] or [10].

[12] An electronic device manufactured by the process according to item [11].

The present invention has made it feasible to provide a resist composition that excels in the depth of focus margin (DOF) in forming an isolated-contact-hole pattern and further to provide a resist film therefrom and a method of forming a negative pattern using the composition.

DETAILED DESCRIPTION OF THE INVENTION

Figure 1:
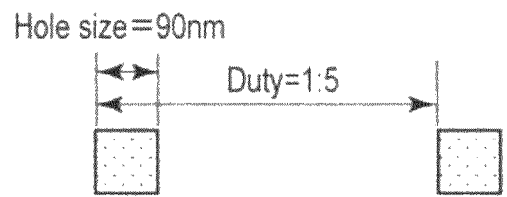
FIG. 1 is a view schematically showing the mask employed in the first exposure condition.

The present invention will be described below.
Note that, with respect to the expression of a group (or an atomic group) used in this specification, the expression without explicitly referring to whether the group is substituted or unsubstituted encompasses not only groups with no substituents but also groups having one or more substituents. For example, the expression "alkyl group" encompasses not only alkyl groups having no substituents (viz. unsubstituted alkyl groups) but also alkyl groups having one or more substituents (viz. substituted alkyl groups).

In the present invention, the terms "actinic rays" and "radiation" mean, for example, a mercury lamp bright line spectrum, far ultraviolet rays represented by an excimer laser, extreme ultraviolet rays, X-rays, electron beams and the like. In the present invention, the term "light" means actinic rays or radiation.

The expression "exposure" used herein, unless otherwise noted, means not only light irradiation using a mercury lamp, far ultraviolet, X-rays, EUV light, etc. but also lithography using particle beams, such as an electron beam and an ion beam.

The resist composition of the present invention comprises (A) a resin that when acted on by an acid, is decomposed to thereby decrease its solubility in a developer containing an organic solvent (hereinafter also referred to as an acid-decomposable resin) and (B) a compound that when exposed to actinic rays or radiation, generates an acid (hereinafter also referred to as a photoacid generator).

The inventors have found that the depth of focus margin (DOF) in forming an isolated-contact-hole pattern can be enhanced by employing the resin (A) of specified structure as the acid-decomposable resin and employing the compound (B) of specified structure as the photoacid generator. These components will be described in detail below.

(A) Acid-Decomposable Resin

The resist composition of the present invention comprises the following resin (A) as the acid-decomposable resin.

The resin (A) contains the following repeating units (a) and (b) but contains substantially no repeating unit in which an alcoholic hydroxyl group is introduced.

<Repeating Unit (a)>

The repeating unit (a) is any of those of general formulae (I-a) and (I-b) below. It is preferred for the resin (A) to contain any of the repeating units of general formula (I-a) below as the repeating unit (a). If so, the solubility of the resin (A) can be enhanced.

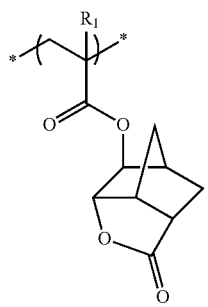

(I-a)

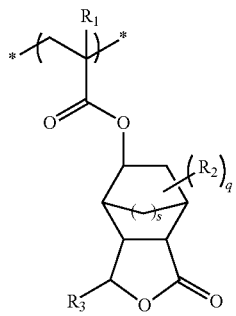

(I-b)

In the formulae,
$R_1$ represents a hydrogen atom or a methyl group.
$R_2$, when $q \geq 2$ each independently, represents an alkyl group.
$R_3$ represents a hydrogen atom or an alkyl group,
q is an integer of 0 to 3, and
s is an integer of 1 to 3.

The alkyl group represented by $R_2$ or $R_3$ may be in the form of a linear or branched chain. This alkyl group preferably has 1 to 5 carbon atoms, more preferably 1 to 3 carbon atoms. As such an alkyl group, there can be mentioned, for example, a methyl group, an ethyl group, an n-propyl group, an isopropyl group, an n-butyl group, an isobutyl group or a t-butyl group.

A substituent other than an alcoholic hydroxyl group may further be introduced in the alkyl group represented by $R_2$ or $R_3$. As such a substituent, there can be mentioned, for example, a halogen atom, an alkoxy group, a cyano group, a nitro group, a sulfonyl group or a silyl group.

In the formula, q is preferably an integer of 0 to 2, and s is preferably 1 or 2.

Specific examples of the repeating units (a) are shown below.

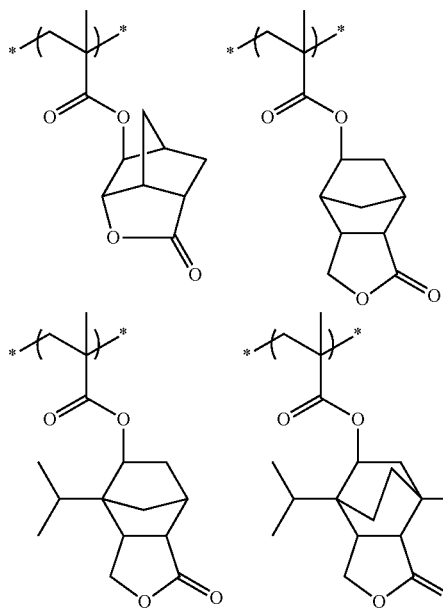

Two or more types of repeating units (a) may be contained in the resin (A).

The content of repeating unit (a) in the resin (A) based on all the repeating units of the resin (A) is preferably in the range of 30 to 55 mol %, more preferably 35 to 55 mol %.

<Repeating Unit (b)>

The repeating unit (b) is expressed by general formula (II) below. The repeating unit (b) is so structured as to be decomposed by the action of an acid to thereby change the rate of dissolution in the developer.

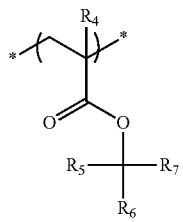

(II)

In the formula, $R_4$ represents a hydrogen atom or a methyl group.

Each of $R_5$, $R_6$ and $R_7$ independently represents an alkyl group or a monocycloalkyl group, provided that any two of $R_5$, $R_6$ and $R_7$ may be bonded to each other to thereby form a monocyclic ring.

The alkyl group represented by $R_5$, $R_6$ or $R_7$ may be in the form of a linear or branched chain. This alkyl group preferably has 1 to 7 carbon atoms, more preferably 1 to 5 carbon atoms and further more preferably 1 to 3 carbon atoms. As such an alkyl group, there can be mentioned, for example, a methyl group, an ethyl group, an n-propyl group, an isopropyl group, an n-butyl group, an isobutyl group or a t-butyl group.

The monocycloalkyl group represented by $R_5$, $R_6$ or $R_7$ is preferably in the form of a 3- to 8-membered ring, more preferably a 5- or 6-membered ring and most preferably a 6-membered ring. As such a cycloalkyl group, there can be mentioned, for example, a cyclopentyl group, a cyclohexyl group, a cyclobutyl group or a cyclooctyl group.

The monocyclic ring formed by the mutual bonding of two of $R_5$, $R_6$ and $R_7$ is preferably in the form of a 3- to 8-membered ring, more preferably a 5- or 6-membered ring.

Substituents other than an alcoholic hydroxyl group may further be introduced in the alkyl group and monocycloalkyl group represented by $R_5$, $R_6$ or $R_7$ and the monocyclic ring formed by the mutual bonding of two thereof. As such substituents, there can be mentioned, for example, a halogen atom, an alkoxy group, a cyano group, a nitro group, a sulfonyl group and a silyl group.

In general formula (II), preferably, two of $R_5$, $R_6$ and $R_7$ are bonded to each other to thereby form a monocyclic ring. Namely, it is preferred for the repeating unit (b) to be expressed by general formula (II-1) below. If so, the MEEF can be enhanced.

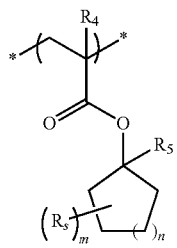

(II-1)

In the formula, $R_4$ represents a hydrogen atom or a methyl group.

$R_5$ represents an alkyl group.

$R_{5'}$ represents a substituent, m is an integer of 0 to 3, and n is an integer of 1 to 3.

The alkyl group represented by $R_5$ is, for example, the same as mentioned above in connection with general formula (II).

As the substituent represented by $R_{5'}$, there can be mentioned, for example, a halogen atom, an alkoxy group, a cyano group, a nitro group, a sulfonyl group or a silyl group.

In the formula, m is preferably an integer of 0 to 2, more preferably 0 or 1, and n is preferably 1 or 2, more preferably 1.

Specific examples of the repeating units (b) are shown below.

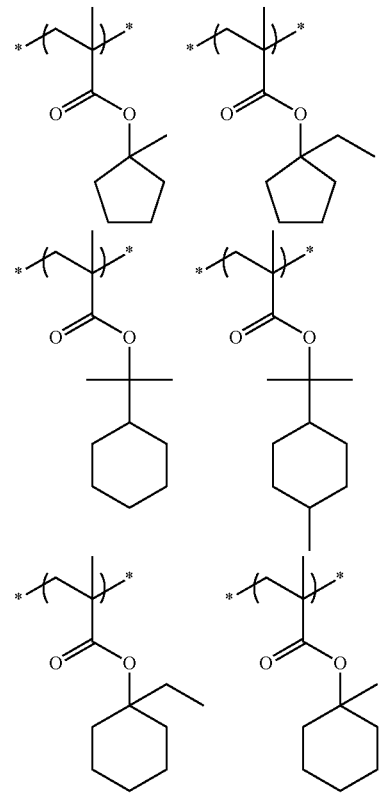

Two or more types of repeating units (b) may be contained in the resin (A).

The content of repeating unit (b) in the resin (A) based on all the repeating units of the resin (A) is preferably in the range of 30 to 65 mol %, more preferably 30 to 50 mol %.

<Other Repeating Unit>

Repeating units other than the repeating units (a) and (b) may further be contained in the resin (A).

<<Repeating Unit (c)>>

The resin (A) may further contain a repeating unit (c). The repeating unit (c) has a structure different from that of the repeating unit (b) and contains a group that is decomposed under the action of an acid. The DOF can be enhanced by causing the resin (A) to further contain the repeating unit (c).

The repeating unit (c) is preferably expressed by general formula (IV) below,

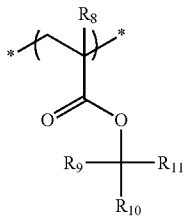

(IV)

In the formula, $R_8$ represents a hydrogen atom or a methyl group.

Each of $R_9$, $R_{10}$ and $R_{11}$ independently represents an alkyl group or a cycloalkyl group, provided that at least one of $R_9$, $R_{10}$ and $R_{11}$ represents a polycycloalkyl group or that any two of $R_9$, $R_{10}$ and $R_{11}$ may be bonded to each other to thereby form a polycyclic hydrocarbon structure.

The alkyl group represented by $R_9$, $R_{10}$ or $R_{11}$ may be in the form of a linear or branched chain. This alkyl group preferably has 1 to 7 carbon atoms, more preferably 1 to 5 carbon atoms and further more preferably 1 to 3 carbon atoms. As such an alkyl group, there can be mentioned, for example, a methyl group, an ethyl group, an n-propyl group, an isopropyl group, an n-butyl group, an isobutyl group or a t-butyl group.

The monocycloalkyl group represented by $R_9$, $R_{10}$ or $R_{11}$ is preferably in the form of a 3- to 8-membered ring, more preferably a 5- or 6-membered ring and most preferably a 6-membered ring. As such a cycloalkyl group, there can be mentioned, for example, a cyclopentyl group, a cyclohexyl group, a cyclobutyl group or a cyclooctyl group.

The polycycloalkyl group represented by $R_9$, $R_{10}$ or $R_{11}$ preferably has 7 to 25 carbon atoms. An adamantyl group is most preferred.

Substituents other than an alcoholic hydroxyl group may further be introduced in the alkyl group and cycloalkyl groups represented by $R_9$, $R_{10}$ or $R_{11}$ and the ring formed by the mutual bonding of two thereof. As such substituents, there can be mentioned, for example, a halogen atom, an alkoxy group, a cyano group, a nitro group, a sulfonyl group and a silyl group.

In general formula (IV), preferably, two of $R_9$, $R_{10}$ or $R_{11}$ are alkyl groups and the rest one thereof is a polycycloalkyl group. More preferably, two of $R_9$, $R_{10}$ or $R_{11}$ are linear alkyl groups and the rest one thereof is an adamantyl group. Further more preferably, two of $R_9$, $R_{10}$ or $R_{11}$ are methyl groups and the rest one thereof is an adamantyl group.

Specific examples of the repeating units (c) are shown below.

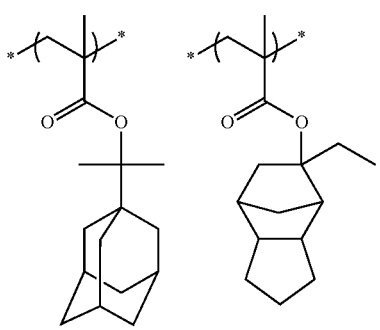

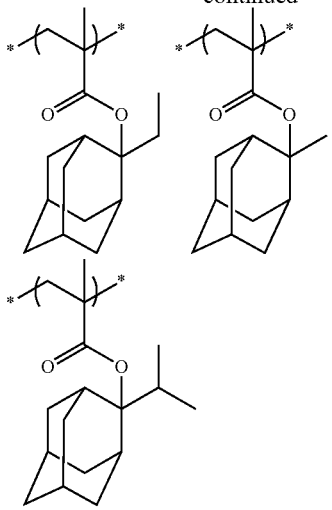

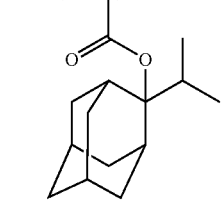

Two or more types of repeating units (c) may be contained in the resin (A).

When the resin (A) contains the repeating unit (c), the content thereof based on all the repeating units of the resin (A) is preferably in the range of 5 to 30 mol %.

When the resin (A) contains the repeating units (a), (b) and (c), preferably, the content of repeating unit (a) is in the range of 30 to 55 mol %, the content of repeating unit (b) in the range of 30 to 65 mol % and the content of repeating unit (c) in the range of 5 to 30 mol %. More preferably, the content of repeating unit (a) is in the range of 35 to 55 mol %, the content of repeating unit (b) in the range of 30 to 50 mol % and the content of repeating unit (c) in the range of 5 to 30 mol %. If so, the etching resistance and solubility can be enhanced.

<<Repeating Unit Containing Acid Group>>

The resin (A) may further contain a repeating unit containing an acid group [hereinafter also referred to as a repeating unit (d)]. The resolution at contact hole usage can be enhanced by causing the resin (A) to further contain the repeating unit (d).

As the acid group, there can be mentioned, for example, a carboxyl group, a sulfonamido group, a sulfonylimido group or a bissulfonylimido group. It is preferred for the repeating unit (d) to contain a carboxyl group.

The repeating unit containing an acid group is, for example, a repeating unit wherein the above acid group is directly bonded to the principal chain of a resin, such as a repeating unit derived from acrylic acid or methacrylic acid. Alternatively, this repeating unit may be a repeating unit wherein the above acid group is bonded via a connecting group to the principal chain of a resin. Still alternatively, this repeating unit may be a repeating unit wherein the acid group is introduced in a terminal of the polymer chain by using a chain transfer agent or polymerization initiator containing the acid group in the stage of polymerization. All of these repeating units are preferred. The connecting group may have a monocyclic or polycyclic hydrocarbon structure. The repeating unit from acrylic acid or methacrylic acid is most preferred.

Two or more types of repeating units (d) may be contained in the resin (A).

When the resin (A) contains the repeating unit (d), the content thereof based on all the repeating units of the resin (A) is preferably 10 mol % or below, more preferably 5 mol % or below. Further, in that instance, the content of repeating unit (d) is generally not lower than 1 mol %.

Particular examples of the repeating units (d) are shown below. In the formulae, Rx represents H, CH$_3$ or CF$_3$.

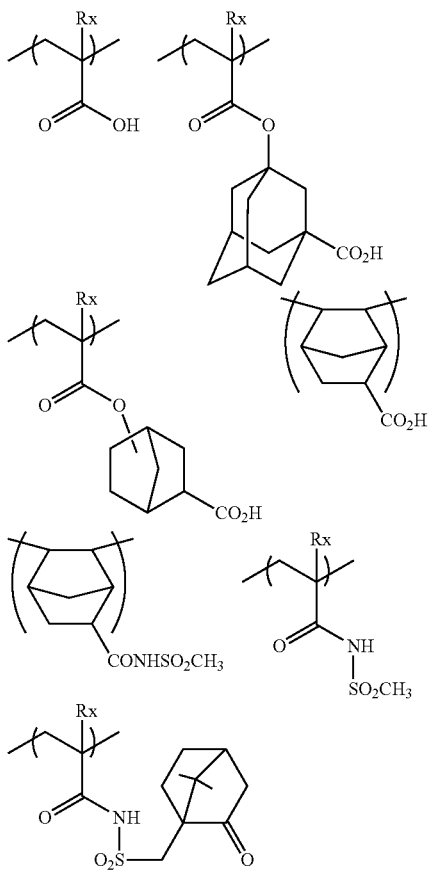

<<Repeating Unit Having Alicyclic Hydrocarbon Structure in which No Polar Group is Introduced and Exhibiting No Acid-Decomposability>>

The resin (A) may further contain a repeating unit having an alicyclic hydrocarbon structure in which no polar group is introduced and exhibiting no acid-decomposability [hereinafter also referred to as a repeating unit (e)]. This makes it feasible to reduce the leaching of low-molecular components from the resist film into the immersion liquid in the stage of liquid-immersion exposure and further to appropriately regulate the solubility of the resin (A) in the stage of development using a developer containing an organic solvent.

As the repeating unit (e), there can be mentioned, for example, any of the repeating units of general formula (V) below.

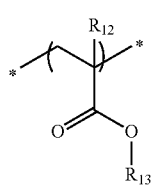

(V)

In the formula, $R_{12}$ represents a hydrogen atom, an alkyl group or a group of the formula —CH$_2$—O—Ra$_2$ in which Ra$_2$ represents a hydrogen atom, an alkyl group or an acyl group.

$R_{13}$ represents a hydrocarbon group having at least one cyclic structure in which neither a hydroxyl group nor a cyano group is contained.

Preferably, $R_{12}$ is a hydrogen atom, a methyl group, a hydroxymethyl group or a trifluoromethyl group. A hydrogen atom and a methyl group are more preferred.

The cyclic structures introduced in $R_{13}$ include a monocyclic hydrocarbon group and a polycyclic hydrocarbon group. As the monocyclic hydrocarbon group, there can be mentioned, for example, a cycloalkyl group having 3 to 12 carbon atoms, such as a cyclopentyl group, a cyclohexyl group, a cycloheptyl group or a cyclooctyl group, or a cycloalkenyl group having 3 to 12 carbon atoms, such as a cyclohexenyl group. Preferably, the monocyclic hydrocarbon group is a monocyclic hydrocarbon group having 3 to 7 carbon atoms. A cyclopentyl group and a cyclohexyl group can be mentioned as more preferred monocyclic hydrocarbon groups.

The polycyclic hydrocarbon groups include ring-assembly hydrocarbon groups and crosslinked-ring hydrocarbon groups. Examples of the ring-assembly hydrocarbon groups include a bicyclohexyl group and a perhydronaphthalenyl group. As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as homobledane, adamantane, tricyclo[5.2.1.0$^{2,6}$]decane and tricyclo[4.3.1.1$^{2,5}$] undecane rings; and tetracyclic hydrocarbon rings, such as tetracyclo[4.4.0.1$^{2,5}$.1$^{7,10}$]dodecane and perhydro-1,4-methano-5,8-methanonaphthalene rings. Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenalene rings.

As preferred crosslinked-ring hydrocarbon rings, there can be mentioned, for example, a norbornyl group, an adamantyl group, a bicyclooctanyl group and a tricyclo[5,2,1,0$^{2,6}$]decanyl group. As more preferred crosslinked-ring hydrocarbon rings, there can be mentioned a norbornyl group and an adamantyl group.

Substituents may be introduced in these alicyclic hydrocarbon groups. As preferred substituents, there can be mentioned, for example, a halogen atom, an alkyl group, a hydroxyl group having its hydrogen atom substituted and an amino group having its hydrogen atom substituted. The halogen atom is preferably a bromine, chlorine or fluorine atom, and the alkyl group is preferably a methyl, ethyl, butyl or t-butyl group. A substituent may further be introduced in the alkyl group. As the optional further substituent, there can be mentioned a halogen atom, an alkyl group, a hydroxyl group having its hydrogen atom substituted or an amino group having its hydrogen atom substituted.

As the substituent for the hydrogen atom, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

Two or more types of repeating units (e) may be contained in the resin (A).

When the resin (A) contains the repeating unit (e), the content thereof is preferably in the range of 1 to 40 mol %, more preferably 5 to 20 mol %.

Particular examples of the repeating units (e) are shown below. In the formulae, Ra represents H, $CH_3$ or $CF_3$.

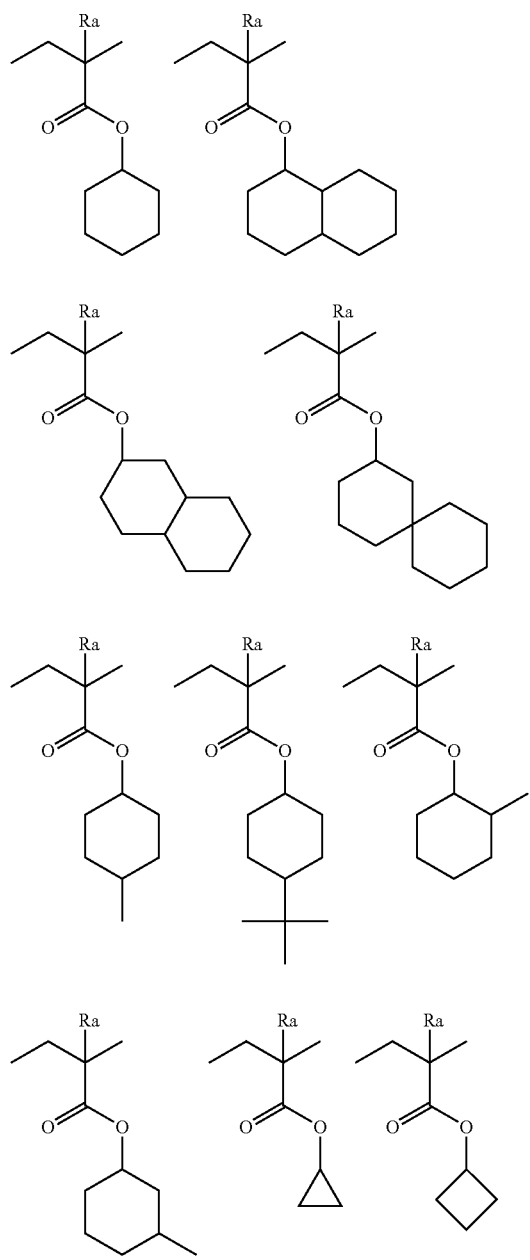

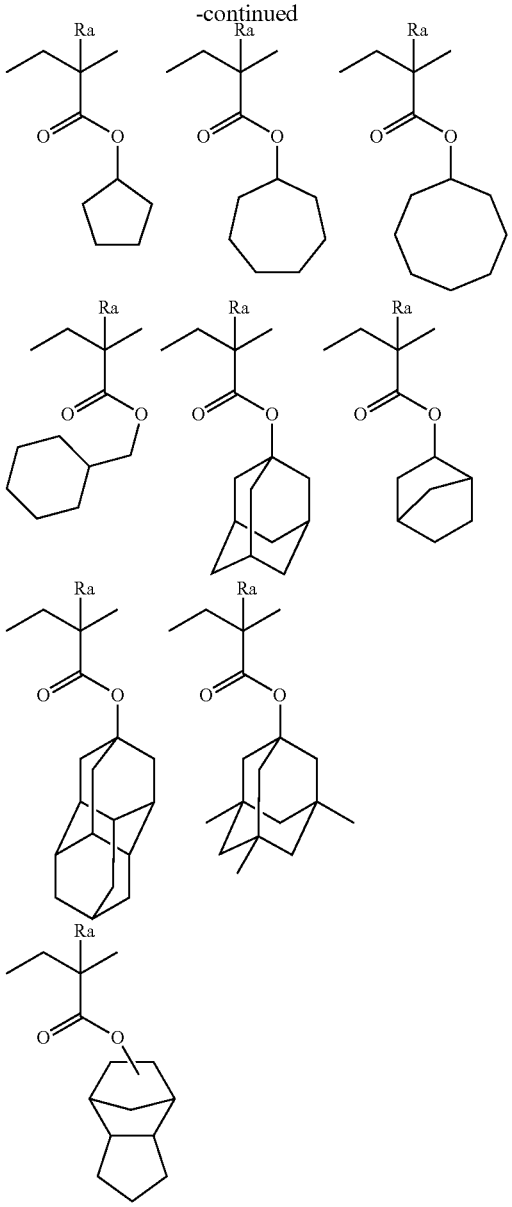

-continued

The resin (A) may contain, in addition to the foregoing repeating units, various repeating units for the purpose of regulating the dry etching resistance, standard developer adaptability, substrate adhesion, resist profile and generally required properties of the resist such as resolving power, heat resistance and sensitivity.

As such repeating units, there can be mentioned, for example, those corresponding to the following monomers. Namely, as an appropriate monomer, there can be mentioned, for example, a compound having one unsaturated bond capable of addition polymerization, selected from among acrylic esters, methacrylic esters, acrylamides, methacrylamides, allyl compounds, vinyl ethers and vinyl esters.

In addition, any unsaturated compound capable of addition polymerization that is copolymerizable with monomers corresponding to the above various repeating units may be copolymerized therewith.

It is preferred for the resin (A) to contain the repeating units (a), (b) and (c). More preferably, the resin (A) contains substantially only the repeating units (a), (b) and (c). The content of repeating units other than the repeating units (a), (b) and (c) based on all the repeating units of the resin (A) is preferably 3 mol % or less, more preferably 1 mol % or less.

The weight average molecular weight of the resin (A) in terms of polystyrene-equivalent value as measured by the GPC method is preferably in the range of 5000 to 30,000, more preferably 7000 to 15,000. If so, the occurrence of defects can be reduced.

The molecular weight dispersity of the resin (A) is generally in the range of 1 to 3, preferably 1 to 2.6, more preferably 1 to 2 and most preferably 1.4 to 2.0. The narrower the molecular weight distribution, the more excellent the resolution and resist shape and also the smoother the side wall of the resist pattern to thereby attain an excellence in roughness characteristics.

One type of resin (A) may be used alone, or two or more types thereof may be used in combination.

The ratio of added resin (A) to the whole composition is preferably in the range of 30 to 99 mass %, more preferably 60 to 95 mass %, based on the total solids thereof.

The resist composition of the present invention may further contain a resin other than the resin (A) as an acid-decomposable resin in an amount not detrimental to the effects of the present invention. In that instance, the ratio of resin (A) to the whole amount of acid-decomposable resins is, for example, in the range of 80 to 99 mass %, typically 90 to 99 mass %. The ratio of added acid-decomposable resins to the whole composition is preferably in the range of 30 to 99 mass %, more preferably 60 to 95 mass %, based on the total solids thereof.

(B) Photoacid Generator

The resist composition of the present invention contains the following compound (B) as a photoacid generator.

The compound (B) is expressed by general formula (III-a) or (III-b) below.

(III-a)

(III-b)

In the formulae,
m is an integer of 1 to 5, and
r is an integer of 0 to 3,
Each of $R_A$ and $R_B$ independently represents an alkyl group, provided that $R_A$ and $R_B$ may be bonded to each other to thereby form a ring, and
p is an integer of 1 to 5.

In general formula (III-a), m is preferably an integer of 1 to 3, more preferably 1 or 2 and most preferably 1; and r is preferably 1 or 2, most preferably 1.

The alkyl group represented by $R_A$ or $R_B$ in general formula (III-b) may be in the form of a linear or branched chain. This alkyl group preferably has 1 to 5 carbon atoms, more preferably 1 to 3 carbon atoms. As such an alkyl group, there can be mentioned, for example, a methyl group, an ethyl group, an n-propyl group, an isopropyl group, an n-butyl group, an isobutyl group or a t-butyl group.

The ring formed by the mutual bonding of $R_A$ and $R_B$ may be monocyclic or polycyclic. This ring is preferably a monocyclic ring, more preferably a 5- or 6-membered ring and most preferably a 6-membered ring.

Substituents other than an alcoholic hydroxyl group may further be introduced in the alkyl group represented by $R_A$ or $R_B$ and the ring formed by the mutual bonding thereof. As such substituents, there can be mentioned, for example, a halogen atom, an alkoxy group, a cyano group, a nitro group, a sulfonyl group and a silyl group.

In general formula (III-b), p is preferably an integer of 1 to 3, most preferably 3.

Specific examples of the compounds (B) are shown below.

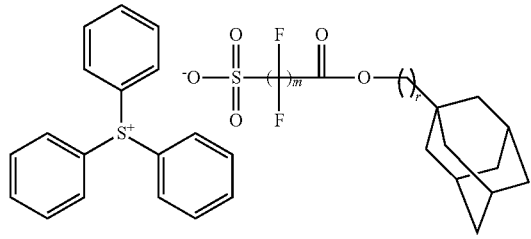

-continued

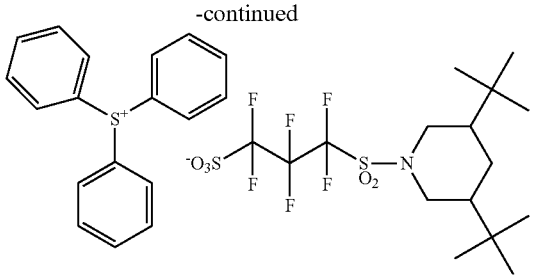

One type of compound (B) may be used alone, or two or more types thereof may be used in combination.

The ratio of added compound (B) to the whole composition is preferably in the range of 0.1 to 20 mass %, more preferably 0.5 to 15 mass % and further more preferably 3 to 15 mass %, based on the total solids thereof.

The resist composition of the present invention may further contain a compound other than the compound (B) (hereinafter also referred to as a concomitant acid generator) as a photoacid generator in an amount not detrimental to the effects of the present invention.

As the concomitant acid generator, there can be mentioned, for example, any of the compounds of general formulae (ZI), (ZII) and (ZIII) below.

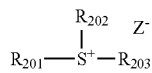 (ZI)

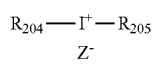 (ZII)

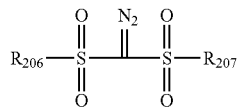 (ZIII)

In general formula (ZI) above, each of $R_{201}$, $R_{202}$ and $R_{203}$ independently represents an organic group.

The number of carbon atoms of each of the organic groups represented by $R_{201}$, $R_{202}$ and $R_{203}$ is generally in the range of 1 to 30, preferably 1 to 20.

Two of $R_{201}$ to $R_{203}$ may be bonded to each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

$Z^-$ represents a nonnucleophilic anion. The nonnucleophilic anion means an anion whose capability of inducing a nucleophilic reaction is extremely low.

As the nonnucleophilic anion represented by $Z^-$, there can be mentioned, for example, a sulfonate anion (for example, an aliphatic sulfonate anion, an aromatic sulfonate anion, a camphor sulfonate anion or the like), a carboxylate anion (for example, an aliphatic carboxylate anion, an aromatic carboxylate anion, an aralkyl carboxylate anion or the like), a sulfonylimido anion, a bis(alkylsulfonyl)imido anion, tris(alkylsulfonyl)methide anion or the like.

The aliphatic moiety of the aliphatic sulfonate anion and the aliphatic carboxylate anion may be an alkyl group or a cycloalkyl group, being preferably a linear or branched alkyl group having 1 to 30 carbon atoms or a cycloalkyl group having 3 to 30 carbon atoms.

As a preferred aromatic group of the aromatic sulfonate anion and the aromatic carboxylate anion, there can be mentioned an aryl group having 6 to 14 carbon atoms, for example, a phenyl group, a tolyl group, a naphthyl group or the like.

The alkyl group, cycloalkyl group and aryl group mentioned above may have a substituent. As the substituent, there can be mentioned, for example, a nitro group, a halogen atom (e.g., a fluorine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms) or the like. The aryl group or ring structure of these groups may further have an alkyl group (preferably having 1 to 15 carbon atoms) as its substituent.

As a preferred aralkyl group of the aralkyl carboxylate anion, there can be mentioned an aralkyl group having 6 to 12 carbon atoms, for example, a benzyl group, a phenethyl group, a naphthylmethyl group, a naphthylethyl group, a naphthylbutyl group or the like.

As the sulfonylimido anion, there can be mentioned, for example, a saccharin anion.

The alkyl group of the bis(alkylsulfonyl)imido anion and tris(alkylsulfonyl)methide anion is preferably an alkyl group having 1 to 5 carbon atoms. As a substituent of these alkyl groups, there can be mentioned a halogen atom, an alkyl group substituted with a halogen atom, an alkoxy group, an alkylthio group, an alkyloxysulfonyl group, an aryloxysulfonyl group, a cycloalkylaryloxysulfonyl group or the like. A fluorine atom or an alkyl group substituted with a fluorine atom is preferred.

As the other nonnucleophilic anions, there can be mentioned, for example, phosphorus fluoride, boron fluoride, antimony fluoride and the like.

The nonnucleophilic anion represented by $Z^-$ is preferably selected from among an aliphatic sulfonate anion substituted at its α-position of sulfonic acid with a fluorine atom, an aromatic sulfonate anion substituted with a fluorine atom or a group having a fluorine atom, a bis(alkylsulfonyl)imido anion whose alkyl group is substituted with a fluorine atom and a tris(alkylsulfonyl)methide anion whose alkyl group is substituted with a fluorine atom. More preferably, the nonnucleophilic anion is a perfluorinated aliphatic sulfonate anion (still more preferably having 4 to 8 carbon atoms) or a benzene sulfonate anion having a fluorine atom. Still more preferably, the nonnucleophilic anion is a nonafluorobutane sulfonate anion, a perfluorooctane sulfonate anion, a pentafluorobenzene sulfonate anion or a 3,5-bis(trifluoromethyl)benzene sulfonate anion.

From the viewpoint of acid strength, it is preferred for the pKa value of generated acid to be −1 or less so as to ensure a sensitivity enhancement.

As the organic groups represented by $R_{201}$, $R_{202}$ and $R_{203}$, there can be mentioned an aryl group (preferably having 6 to 15 carbon atoms), a linear or branched alkyl group (preferably having 1 to 10 carbon atoms), a cycloalkyl group (preferably having 3 to 15 carbon atoms) and the like.

Preferably, at least one of $R_{201}$, $R_{202}$ and $R_{203}$ is an aryl group. More preferably, these three are simultaneously aryl groups. The aryl groups include not only a phenyl group, a naphthyl group and the like but also heteroaryl groups, such as an indole residue and a pyrrole residue. Substituents may further be introduced in these aryl groups. As the substituents, there can be mentioned a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms) and the like. The appropriate substituents are not limited to these.

Two selected from among $R_{201}$, $R_{202}$ and $R_{203}$ may be bonded via a single bond or a connecting group to each other. The connecting group may be any of an alkylene group (preferably having 1 to 3 carbon atoms), —O—, —S—, —CO—, —SO$_2$— and the like. These in no way limit the scope of appropriate connecting groups.

As preferred structures in which at least one of $R_{201}$, $R_{202}$ and $R_{203}$ is not an aryl group, there can be mentioned the cation structures of the compounds set forth in Sections 0047 and 0048 of JP-A-2004-233661, compounds set forth in Sections 0040 to 0046 of JP-A-2003-35948, compounds of formulae (I-1) to (I-70) shown as examples in US 2003/0224288 A1, compounds of formulae (IA-1) to (IA-54) and (IB-1) to (IB-24) shown as examples in US 2003/0077540 A1 and the like.

In general formulae (ZII) and (ZIII),
each of $R_{204}$ to $R_{207}$ independently represents an aryl group, an alkyl group or a cycloalkyl group.

The examples of the aryl group, alkyl group and cycloalkyl group represented by $R_{204}$ to $R_{207}$ are the same as mentioned with respect to general formula (ZI) above.

The aryl group, alkyl group and cycloalkyl group represented by $R_{204}$ to $R_{207}$ may have a substituent. As a possible substituent on the aryl group, alkyl group and cycloalkyl group, there can also be mentioned the same as in general formula (ZI) above.

$Z^-$ represents a nonnucleophilic anion. As such, there can be mentioned the same nonnucleophilic anions as mentioned with respect to the $Z^-$ of general formula (ZI).

As the concomitant acid generators, there can be further mentioned the compounds of formulae (ZIV), (ZV) and (ZVI) below.

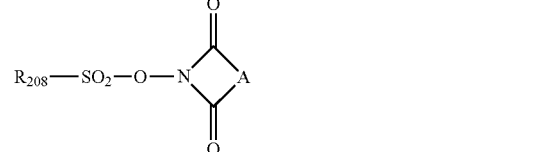
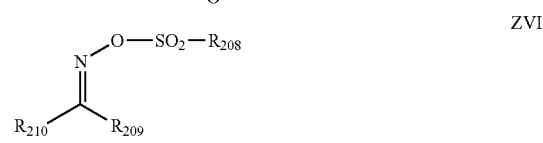

In general formulae (ZIV) to (ZVI),
each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Especially preferred examples of the concomitant acid generators are as follows.

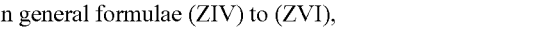
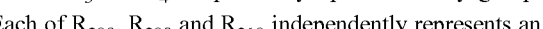
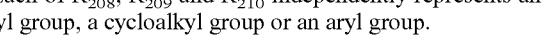
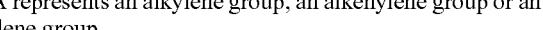
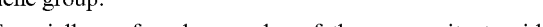
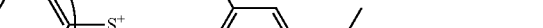

-continued
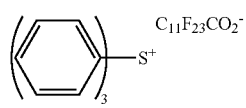 (z7)
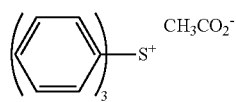 (z9)
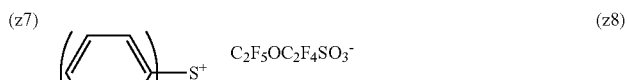 (z8)
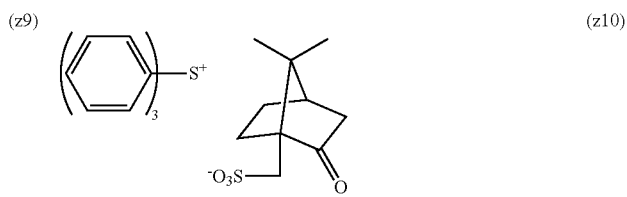 (z10)
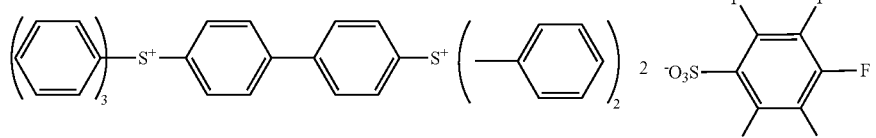 (z11)
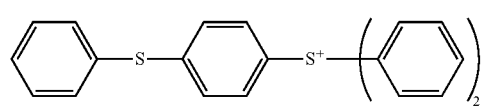 (z13)
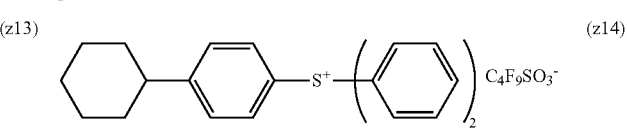 (z12)
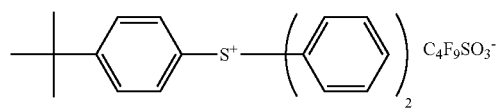 (z15)
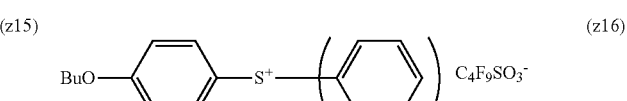 (z14)
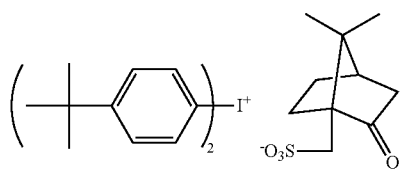 (z17)
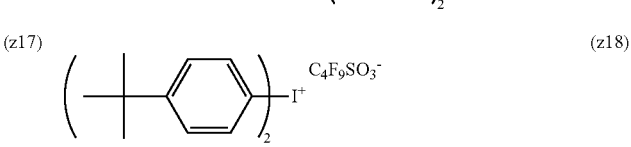 (z16)
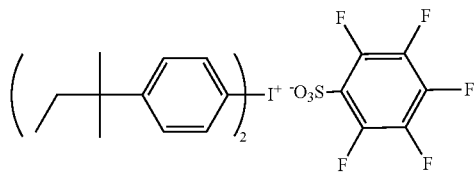 (z19)
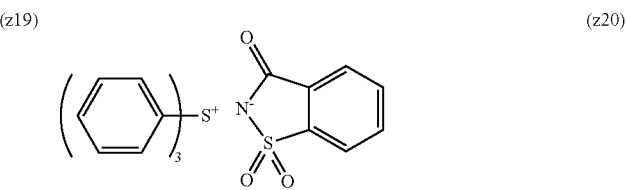 (z18)
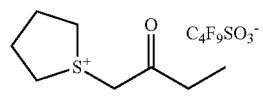 (z21)
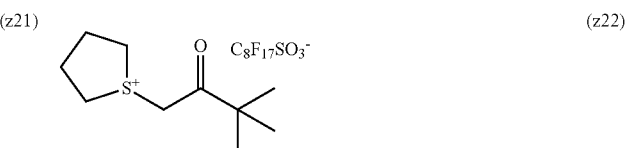 (z20)
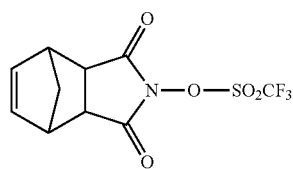 (z23)
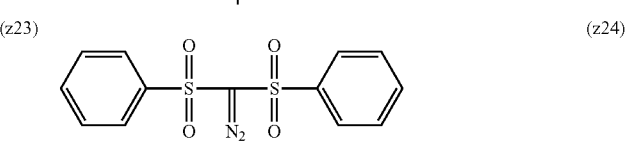 (z22)
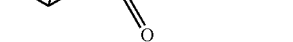
 (z24)

-continued
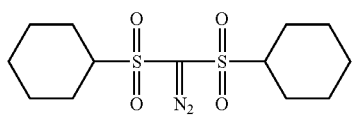 (z25)
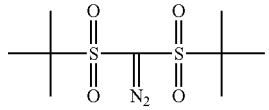 (z26)
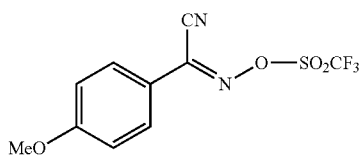 (z27)
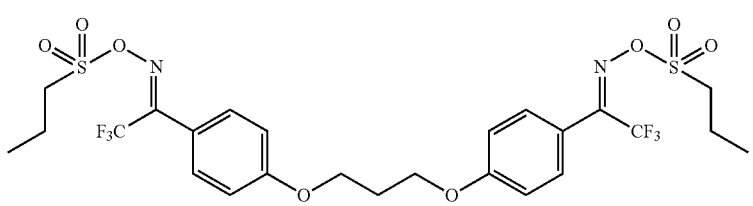 (z28)
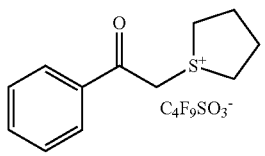 (z29)
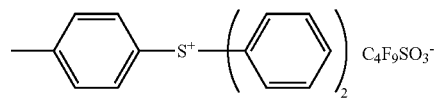 (z30)
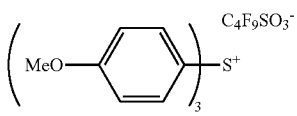 (z31)
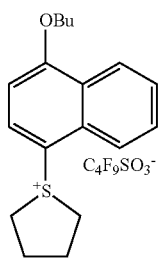 (z32)
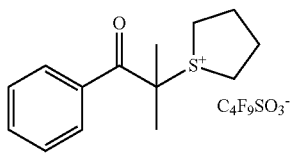 (z33)
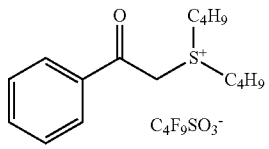 (z34)
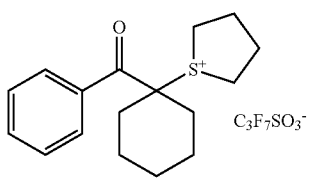 (z35)
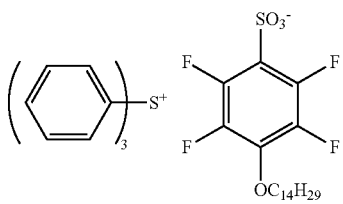 (z36)
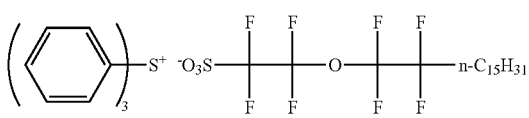 (z37)
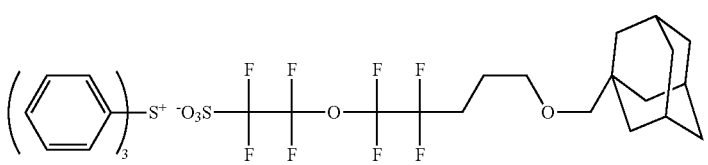 (z38)

-continued
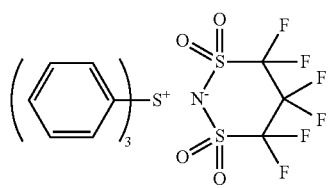 (z39)
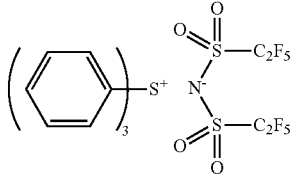 (z40)
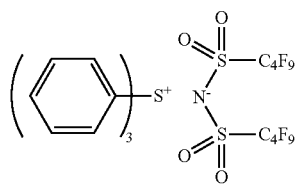 (z41)
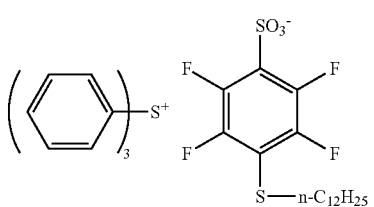 (z42)
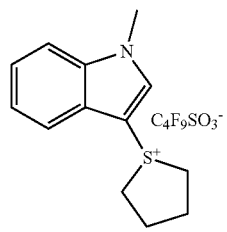 (z43)
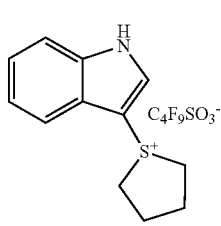 (z44)
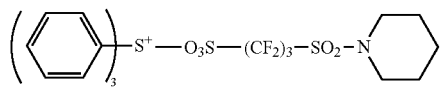 (z45)
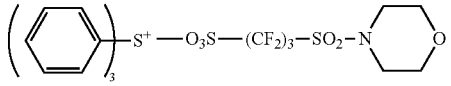 (z46)
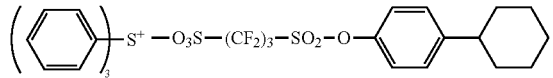 (z47)
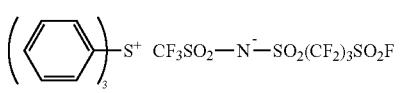 (z48)
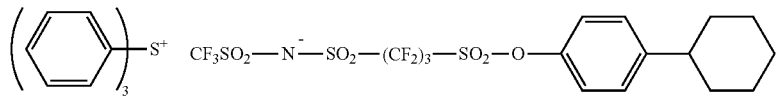 (z49)
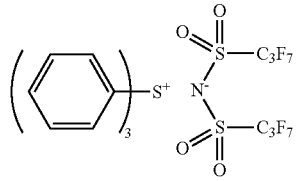 (z50)
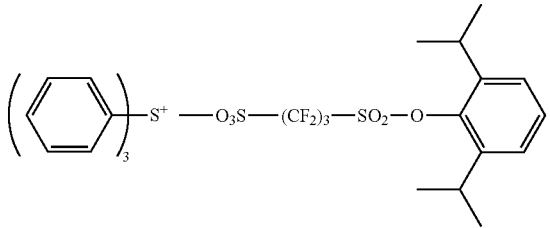 (z51)
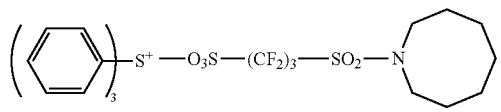 (z52)
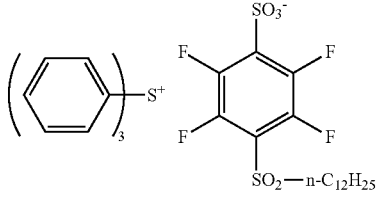 (z53)
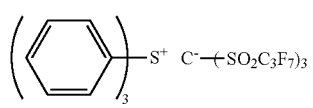 (z54)
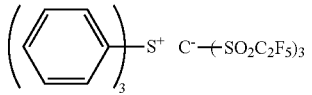 (z55)

-continued
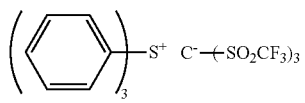 (z56)
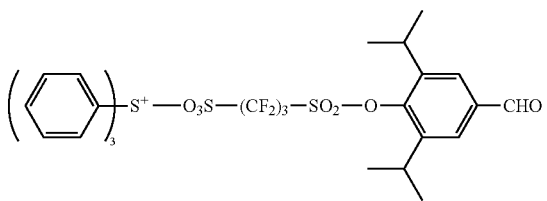 (z57)
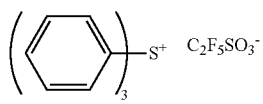 (z58)
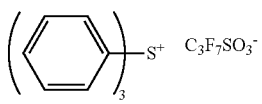 (z59)
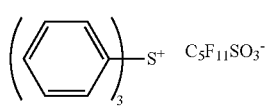 (z60)
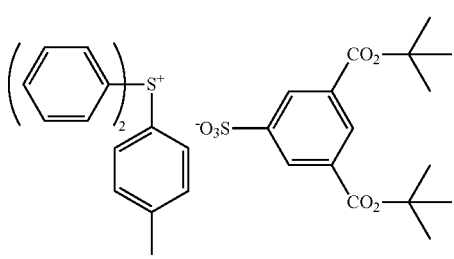 (z61)
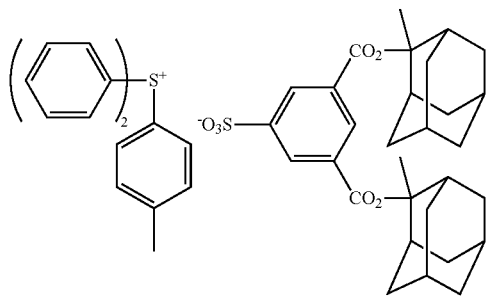 (z62)
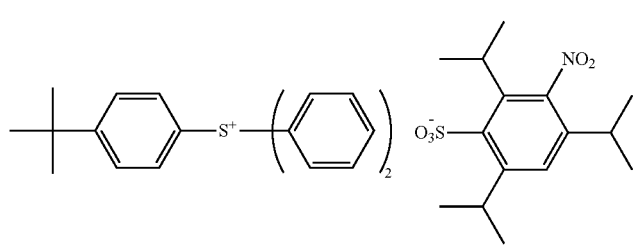 (z63)
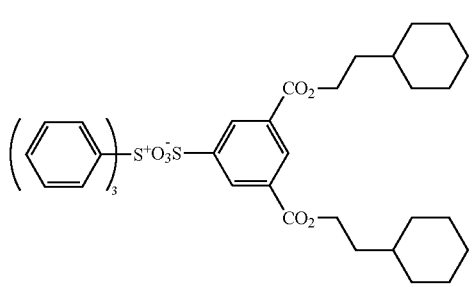 (z64)
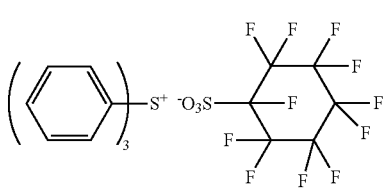 (z65)
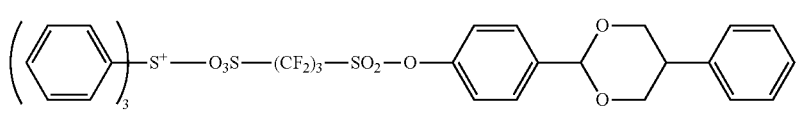 (z66)

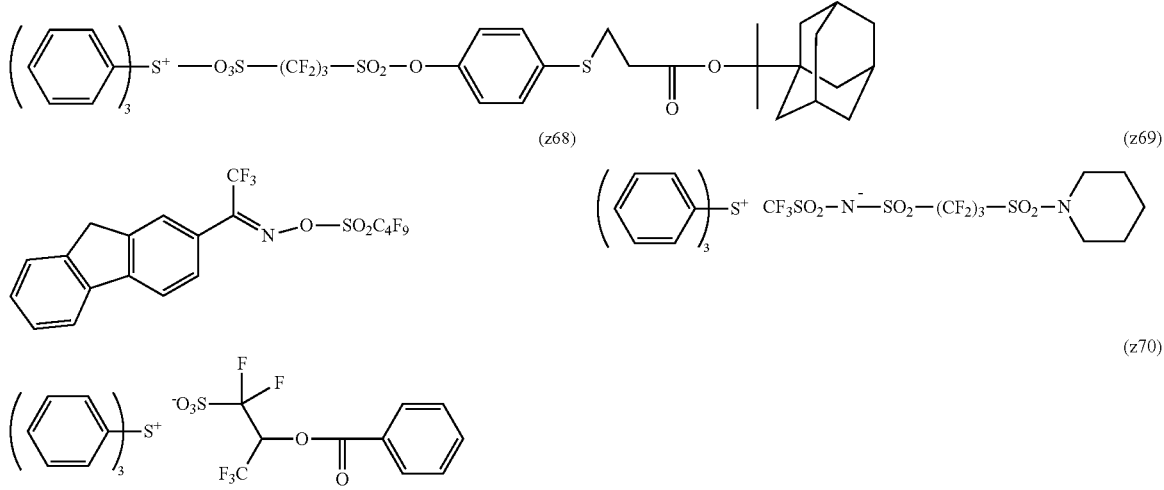

The ratio of compound (B) to the whole amount of photoacid generators is, for example, in the range of 50 to 99 mass %, typically 80 to 99 mass %. The ratio of added photoacid generators to the whole composition is preferably in the range of 0.1 to 20 mass %, more preferably 0.5 to 15 mass % and further more preferably 1 to 12 mass %, based on the total solids thereof.

The resist composition of the present invention may further contain components other than the foregoing components. The optionally added components will be described below.

(C) Basic Compound

The composition of the present invention preferably contains a basic compound in order to suppress any performance change over time from exposure to bake.

As the basic compound, there can be mentioned, for example, any of the compounds of general formula (PDA-1) below.

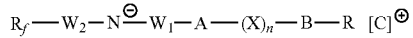

In the formula,

Rf represents an alkyl group, a cycloalkyl group or an aryl group.

Each of $W_1$ and $W_2$ independently represents —$SO_2$— or —CO—.

A represents a single bond or a bivalent connecting group.

X represents —$SO_2$— or —CO—, and n is 0 or 1.

B represents a single bond, an oxygen atom or —N(Rx)Ry-, in which Rx represents a hydrogen atom or a monovalent organic group, and Ry represents a single bond or a bivalent organic group, provided that Rx may be bonded to Ry to thereby form a ring or may be bonded to R to thereby form a ring.

R represents a monovalent organic group containing the functional group with proton acceptor properties.

$[C]^+$ represents a counter cation. This counter cation is, for example, the same as mentioned above in connection with the concomitant acid generator. The counter cation is preferably a triarylsulfonium cation. The aryl group contained in the triarylsulfonium cation is preferably a phenyl group.

Preferably, at least one of $W_1$ and $W_2$ is —$SO_2$—. It is especially preferred for both thereof to be —$SO_2$—.

Rf is preferably an optionally fluorinated alkyl group having 1 to 6 carbon atoms, more preferably a perfluoroalkyl group having 1 to 6 carbon atoms and further more preferably a perfluoroalkyl group having 1 to 3 carbon atoms.

The bivalent connecting group represented by A is preferably a bivalent connecting group having 2 to 12 carbon atoms. As such, there can be mentioned, for example, an alkylene group, a phenylene group or the like. An alkylene group containing at least one fluorine atom is more preferred, which has preferably 2 to 6 carbon atoms, more preferably 2 to 4 carbon atoms. A connecting group, such as an oxygen atom or a sulfur atom, may be introduced in the alkylene chain. In particular, the alkylene group, 30 to 100% by number of the hydrogen atoms of which are substituted with fluorine atoms, is preferred. It is more preferred for the carbon atom bonded to the Q-moiety to have a fluorine atom. Further, perfluoroalkylene groups are preferred. A perfluoroethylene group, a perfluoropropylene group and a perfluorobutylene group are more preferred.

When B is —N(Rx)Ry-, the monovalent organic group represented by Rx preferably has 1 to 30 carbon atoms. As such, there can be mentioned, for example, an alkyl group, a cycloalkyl group, an aryl group, an aralkyl group, an alkenyl group or the like. Substituents may further be introduced in these groups.

A substituent may be introduced in the alkyl group represented by Rx. The alkyl group is preferably a linear or branched alkyl group having 1 to 20 carbon atoms. An oxygen atom, a sulfur atom or a nitrogen atom may be introduced in the alkyl chain.

As the substituted alkyl group, in particular, there can be mentioned a linear or branched alkyl group substituted with a cycloalkyl group (for example, an adamantylmethyl group, an adamantylethyl group, a cyclohexylethyl group, a camphor residue, or the like).

A substituent may be introduced in the cycloalkyl group represented by Rx. The cycloalkyl group preferably has 3 to 20 carbon atoms. An oxygen atom may be introduced in the ring.

A substituent may be introduced in the aryl group represented by Rx. The aryl group preferably has 6 to 14 carbon atoms.

A substituent may be introduced in the aralkyl group represented by Rx. The aralkyl group preferably has 7 to 20 carbon atoms.

A substituent may be introduced in the alkenyl group represented by Rx. For example, there can be mentioned groups each resulting from the introduction of a double bond at an arbitrary position of any of the alkyl groups mentioned above as being represented by Rx.

When B is —N(Rx)Ry-, the bivalent organic group represented by Ry is preferably an alkylene group. Further, in that instance, as the ring structure formed by the mutual bonding of Rx and Ry, there can be mentioned, for example, a 5- to 8-membered ring containing a nitrogen atom. A 6-membered ring is especially preferred.

When B is —N(Rx)Ry-, it is preferred for R and Rx to be bonded to each other to thereby form a ring. When a ring structure is formed, the stability of the compound is enhanced, and thus the storage stability of the composition containing the same is enhanced. The number of carbon atoms constituting the ring is preferably in the range of 4 to 20. The ring may be monocyclic or polycyclic, and an oxygen atom, a sulfur atom or a nitrogen atom may be introduced in the ring.

As the monocyclic structure, there can be mentioned a nitrogen-atom-containing 4-, 5-, 6-, 7- or 8-membered ring or the like. As the polycyclic structure, there can be mentioned a structure resulting from a combination of two, three or more monocyclic structures. Substituents may be introduced in the monocyclic structure and polycyclic structure. As preferred substituents, there can be mentioned, for example, a halogen atom, a hydroxyl group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 15 carbon atoms), an acyloxy group (preferably 2 to 15 carbon atoms), an alkoxycarbonyl group (preferably 2 to 15 carbon atoms), an aminoacyl group (preferably 2 to 20 carbon atoms) and the like. With respect to the ring structure of the aryl group, cycloalkyl group, etc., further an alkyl group (preferably 1 to 15 carbon atoms) can be mentioned as a substituent. With respect to the aminoacyl group as well, further an alkyl group (preferably 1 to 15 carbon atoms) can be mentioned as a substituent.

As the functional group with proton acceptor properties represented by R, there can be mentioned, for example, a crown ether, azacrown ether, primary to tertiary amine, pyridine, imidazole or pyrazine structure or the like.

The group containing such a structure preferably has 4 to 30 carbon atoms. As such, there can be mentioned an alkyl group, a cycloalkyl group, an aryl group, an aralkyl group, an alkenyl group or the like.

The alkyl group, cycloalkyl group, aryl group, aralkyl group and alkenyl group contained in the alkyl group, cycloalkyl group, aryl group, aralkyl group and alkenyl group containing a functional group with proton acceptor properties, or an ammonium group, represented by R are the same as the alkyl group, cycloalkyl group, aryl group, aralkyl group and alkenyl group set forth above as being represented by Rx.

As substituents that may be introduced in these groups, there can be mentioned, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably 2 to 20 carbon atoms) and the like. With respect to the ring structure of the aryl group, cycloalkyl group, etc. and the aminoacyl group, further an alkyl group (preferably 1 to 20 carbon atoms) can be mentioned as a substituent.

It is preferred for the compound (PDA) to be an ionic compound. A sulfonium salt and an iodonium salt are especially preferred. When the compound (PDA) is an ionic compound, the functional group with proton acceptor properties may be contained in whichever moiety, an anion moiety or a cation moiety.

The structure shown below is preferred as one form of the atomic group R of general formula (PDA-1) above.

(PB-II)

In general formula (PB-II), $R_{21}$ represents a hydrogen atom or a monovalent organic group, and $R_{22}$ represents a bivalent organic group, provided that $R_{21}$ and $R_{22}$ may be bonded to each other to thereby form a ring. Moreover, when B of general formula (PDA-1) is —N(Rx)Ry-, $R_{21}$ and Rx may be bonded to each other to thereby form a ring structure.

L represents a functional group of −0.1 or greater as the $\sigma_p$ value of Hammett's rule, excluding a hydrogen atom, and

* represents a site of bonding to A⁻.

General formula (PB-II) will be described in detail below.

L represents a functional group of −0.1 or greater as the $\sigma_p$ value of Hammett's rule (reference: Hansch et al., Chemical Reviews, 1991, Vol. 91, No. 2, pp. 165-195). L is preferably a functional group of −0.05 or greater as the $\sigma_p$ value, more preferably a functional group of −0.03 to 0.5 as the $\sigma_p$ value. With respect to the functional groups not listed in the reference, separately, the $\sigma_p$ value thereof can be calculated from the difference from the pKa value of benzoic acid by ACD/ChemSketch (ACD/Labs 8.00 Release Product Version: 8.08). As the functional group of −0.1 or greater as the $\sigma_p$ value, there can be mentioned, for example, an aryl group (for example, a phenyl group), an acyl group (for example, an acetyl group), an alkoxycarbonyl group (for example, a methoxycarbonyl group or a t-butoxycarbonyl group), an alkylcarbonyloxy group (for example, a methylcarbonyloxy group), a carboxyl group, an alkoxy group (for example, a methoxy group), a cyano group, a nitro group, a halogen atom, an alkyl group substituted with any of these functional groups, a group containing a lactone structure, or the like. The basic strength of the nitrogen atom contained in formula (PB-II) can be regulated so as to fall within an appropriate range by selecting these groups.

As the substituted alkyl group, it is especially preferred to use an alkyl group substituted with an acyl group, an alkoxycarbonyl group, an alkoxy group or a cyano group.

Among the above functional groups, those containing the following lactone structures are preferred.

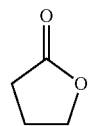

KA-1-1

-continued

KA-1-2 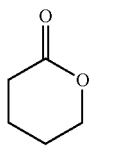

KA-1-3 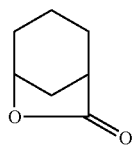

KA-1-4 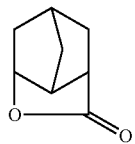

KA-1-5 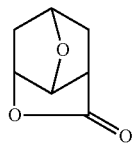

KA-1-6 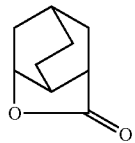

KA-1-7 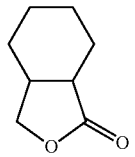

KA-1-8 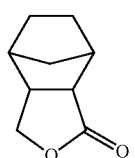

KA-1-9 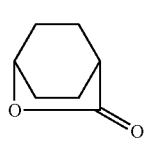

KA-1-10 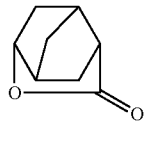

KA-1-11 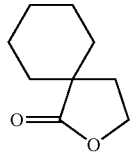

-continued

KA-1-12 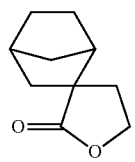

KA-1-13 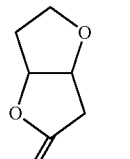

KA-1-14 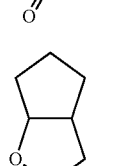

KA-1-15 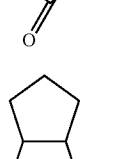

KA-1-16 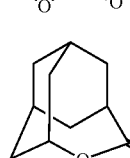

KA-1-17 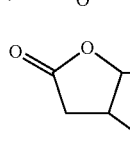

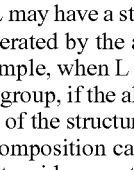

L may have a structure that can be decomposed by the acid generated by the above-mentioned photoacid generator. For example, when L has a structure containing an alkoxycarbonyl group, if the alkyl group of the alkoxycarbonyl group has any of the structures of the formula —C(R$_{36}$)(R$_{37}$)(R$_{38}$), the decomposition can be induced by the acid generated by the photoacid generator. In the formula, each of R$_{36}$ to R$_{38}$ independently represents an alkyl group, a cycloalkyl group, an aryl group, an aralkyl group or an alkenyl group. R$_{36}$ and R$_{37}$ may be bonded to each other to thereby form a ring.

The number of atoms as constituents of L (excluding hydrogen atoms) is not particularly limited. Generally, the number is in the range of 1 to 20. The number is preferably in the range of 1 to 15, more preferably 1 to 10.

The organic group represented by R$_{21}$ preferably has 1 to 40 carbon atoms. As such, there can be mentioned, for example, an alkyl group, a cycloalkyl group, an aryl group, an aralkyl group, an alkenyl group or the like.

A substituent may be introduced in the alkyl group represented by R$_{21}$. The alkyl group is preferably a linear or branched alkyl group having 1 to 30 carbon atoms. The alkyl group in its chain may contain an oxygen atom, a sulfur atom or a nitrogen atom. For example, there can be mentioned a linear alkyl group, such as a methyl group, an ethyl group, an n-propyl group, an n-butyl group, an n-pentyl group, an n-hexyl group, an n-octyl group, an n-dodecyl group, an n-tetradecyl group or an n-octadecyl group, and a branched alkyl group, such as an isopropyl group, an isobutyl group, a t-butyl group, a neopentyl group or a 2-ethylhexyl group.

A substituent may be introduced in the cycloalkyl group represented by $R_{21}$. The cycloalkyl group preferably has 3 to 20 carbon atoms. The cycloalkyl group in its ring may contain an oxygen atom or a nitrogen atom. As examples thereof, there can be mentioned a cyclopropyl group, a cyclopentyl group, a cyclohexyl group, a norbornyl group, an adamantyl group and the like.

A substituent may be introduced in the aryl group represented by $R_{21}$. The aryl group preferably has 6 to 14 carbon atoms. For example, there can be mentioned a phenyl group and a naphthyl group.

A substituent may be introduced in the aralkyl group represented by $R_{21}$. The aralkyl group preferably has 7 to 20 carbon atoms. For example, there can be mentioned a benzyl group, a phenethyl group, a naphthylmethyl group and a naphthylethyl group.

A substituent may be introduced in the alkenyl group represented by $R_{21}$. There can be mentioned groups resulting from the introduction of a double bond at an arbitrary position of any of the above alkyl groups.

As substituents that may be introduced in these groups, there can be mentioned, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably 2 to 10 carbon atoms) and the like. With respect to the ring structure of the aryl group, cycloalkyl group, etc., further an alkyl group (preferably 1 to 10 carbon atoms) can be mentioned as a substituent. With respect to the aminoacyl group as well, further an alkyl group (preferably 1 to 10 carbon atoms) can be mentioned as a substituent. As substituted alkyl groups, there can be mentioned, for example, perfluoroalkyl groups, such as a perfluoromethyl group, a perfluoroethyl group, a perfluoropropyl group and a perfluorobutyl group.

The bivalent organic group represented by $R_{22}$ is preferably an alkylene group, a phenylene group or the like. An alkylene group is especially preferred. The alkylene group preferably has 1 to 10 carbon atoms, more preferably 1 to 8 carbon atoms and further more preferably 1 to 5 carbon atoms.

Specific examples of the compounds (PDA) are shown below.

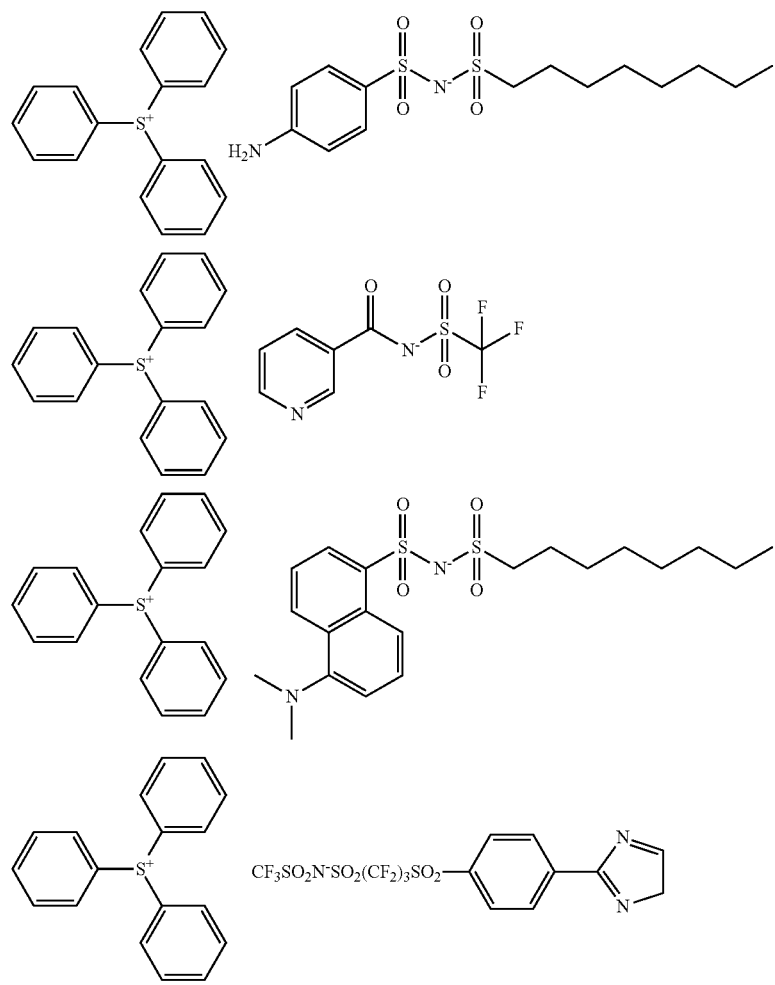

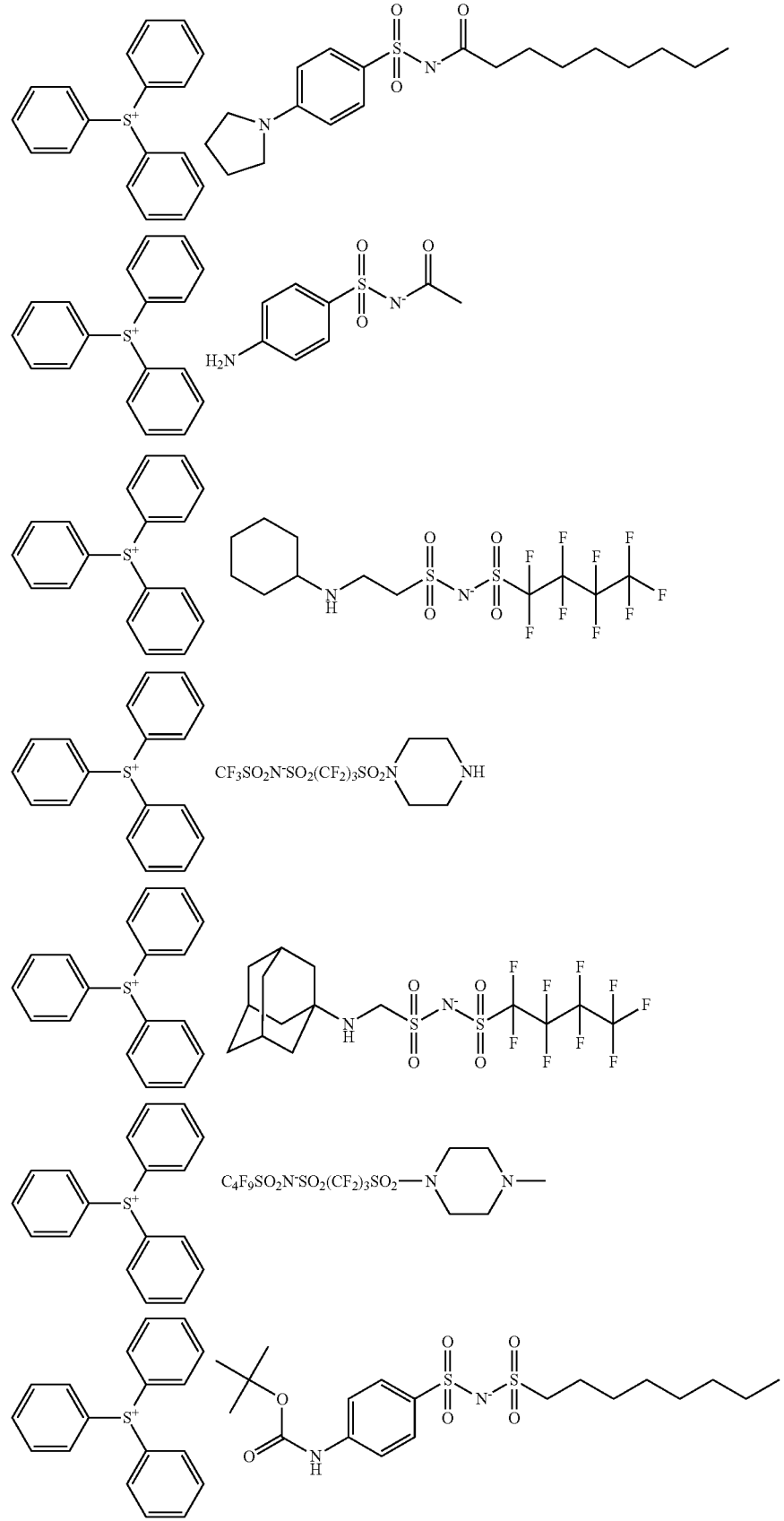

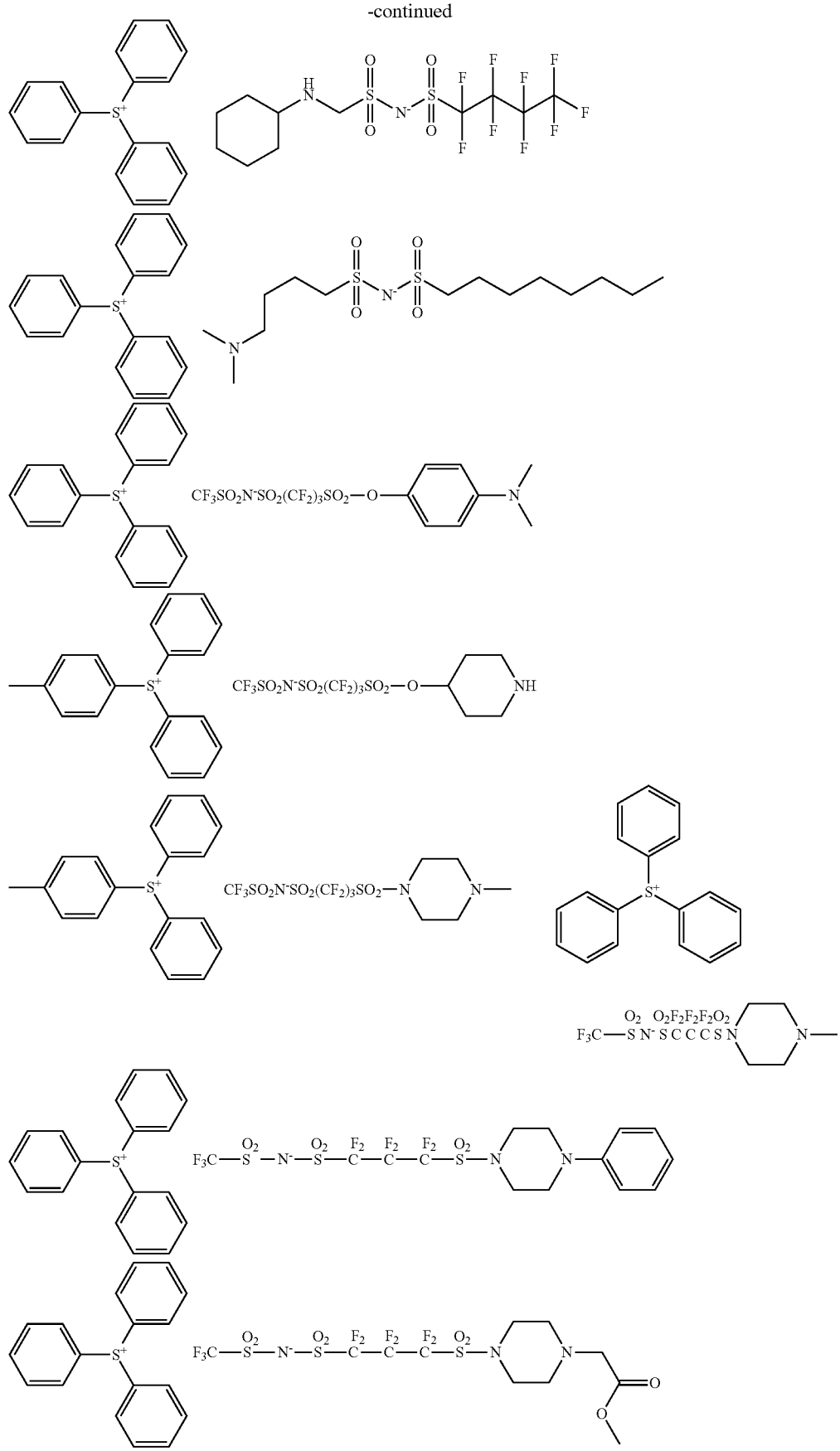

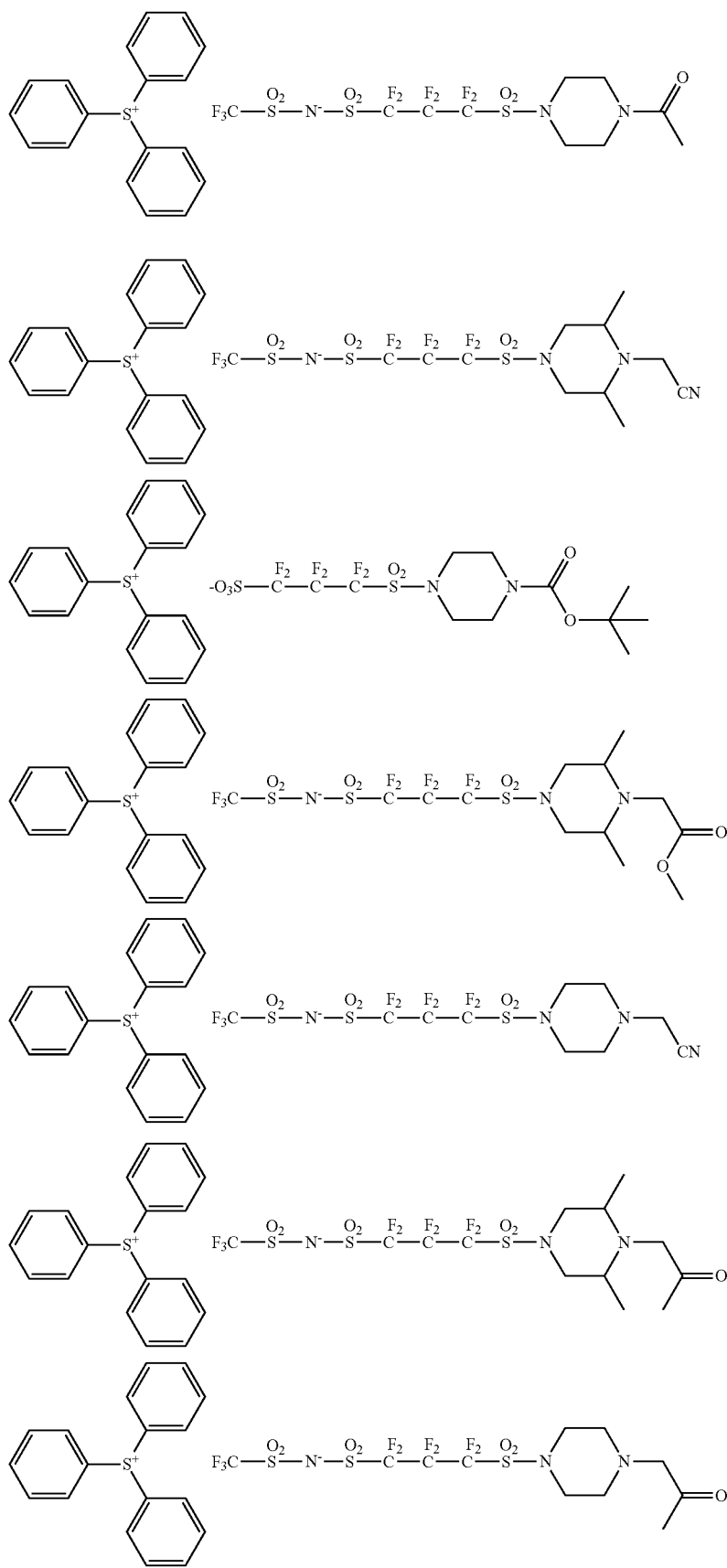

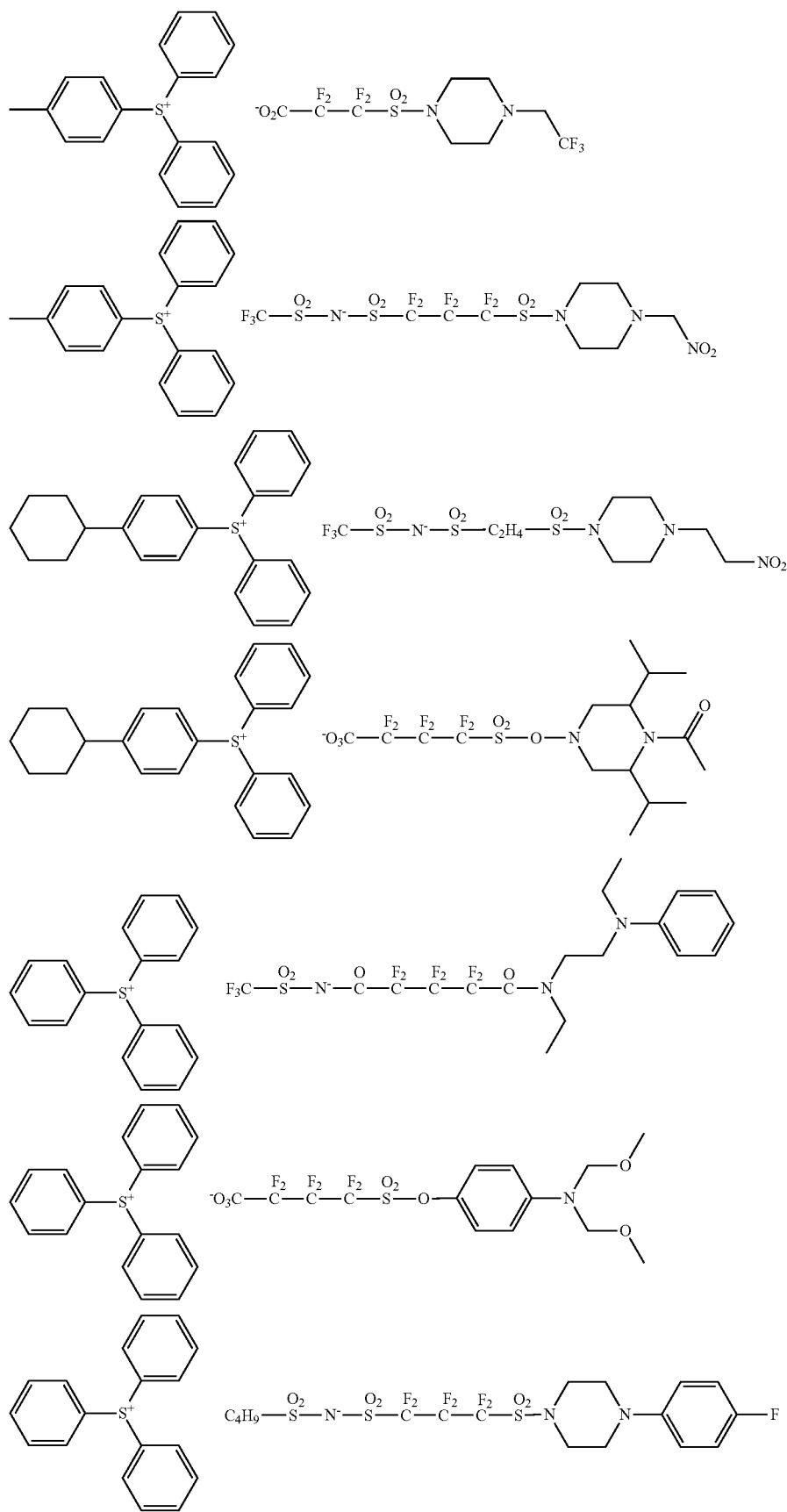

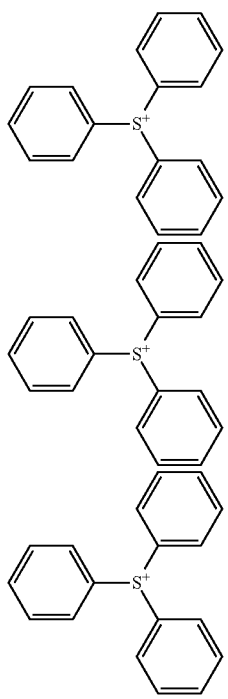
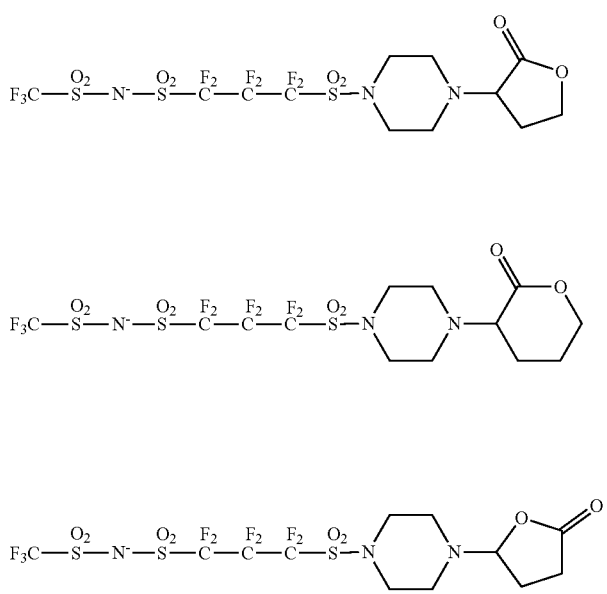

One of the compounds (PDA) may be used alone, or two or more thereof may be used in combination.

When the composition of the present invention contains any of the compounds (PDA), the addition ratio thereof to the composition as a whole is preferably in the range of 0.01 to 15 mass %, more preferably 0.1 to 12 mass % and further more preferably 2 to 10 mass % based on the total solids of the composition.

As basic compounds, the compounds having the structures of formulae (A) to (E) below can be used.

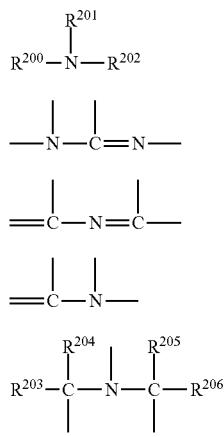

In the general formulae (A) and (E), $R^{200}$, $R^{201}$ and $R^{202}$ may be identical to or different from each other and each represent a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded with each other to thereby form a ring. $R^{203}$, $R^{204}$, $R^{205}$ and $R^{206}$ may be identical to or different from each other and each represent an alkyl group having 1 to 20 carbon atoms.

With respect to the above alkyl group, as a preferred substituted alkyl group, there can be mentioned an aminoalkyl group having 1 to 20 carbon atoms, a hydroxyalkyl group having 1 to 20 carbon atoms or a cyanoalkyl group having 1 to 20 carbon atoms.

More preferably, in these general formulae (A) and (E) the alkyl group is unsubstituted.

As preferred compounds, there can be mentioned guanidine, aminopyrrolidine, pyrazole, pyrazoline, piperazine, aminomorpholine, aminoalkylmorpholine, piperidine and the like. Further, as preferred compounds, there can be mentioned compounds with an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, aniline derivatives having a hydroxyl group and/or an ether bond and the like.

As the compounds with an imidazole structure, there can be mentioned imidazole, 2,4,5-triphenylimidazole, benzimidazole, 2-phenylbenzoimidazole and the like. As the compounds with a diazabicyclo structure, there can be mentioned 1,4-diazabicyclo[2,2,2]octane, 1,5-diazabicyclo[4,3,0]non-5-ene, 1,8-diazabicyclo[5,4,0]undec-7-ene and the like. As the compounds with an onium hydroxide structure, there can be mentioned tetrabutylammonium hydroxide, triarylsulfonium hydroxide, phenacylsulfonium hydroxide, and sulfonium hydroxides having a 2-oxoalkyl group such as triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. As the compounds with an onium carboxylate structure, there can be mentioned those having a carboxylate at the anion moiety of the compounds with an onium hydroxide structure, for example, acetate, adamantane-1-carboxylate, perfluoroalkyl carboxylate and the like. As the compounds with a trialkylamine structure, there can be mentioned tri(n-butyl)amine, tri(n-octyl)amine and the like. As the aniline compounds, there can be mentioned 2,6-diisopropylaniline, N,N-dimethylaniline, N,N-dibutylaniline, N,N-dihexylaniline and the like. As the alkylamine derivatives having a hydroxyl group and/or an ether bond, there can be mentioned ethanolamine, diethanolamine, triethanolamine, N-phenyldiethanolamine, tris(methoxyethoxyethyl) amine and the like. As the aniline derivatives having a hydroxyl group and/or an ether bond, there can be mentioned N,N-bis(hydroxyethyl)aniline and the like.

As preferred basic compounds, there can be further mentioned an amine compound having a phenoxy group, an ammonium salt compound having a phenoxy group, an amine compound having a sulfonic ester group and an ammonium salt compound having a sulfonic ester group.

Each of the above amine compound having a phenoxy group, ammonium salt compound having a phenoxy group, amine compound having a sulfonic ester group and ammonium salt compound having a sulfonic ester group preferably has at least one alkyl group bonded to the nitrogen atom thereof. Further preferably, the alkyl group in its chain contains an oxygen atom, thereby forming an oxyalkylene group. The number of oxyalkylene groups in each molecule is one or more, preferably 3 to 9 and more preferably 4 to 6. Oxyalkylene groups having the structure of —$CH_2CH_2O$—, —CH($CH_3$)$CH_2O$— or —$CH_2CH_2CH_2O$— are preferred.

As specific examples of the above amine compound having a phenoxy group, ammonium salt compound having a phenoxy group, amine compound having a sulfonic ester group and ammonium salt compound having a sulfonic ester group, there can be mentioned the compounds (C1-1) to (C3-3) shown as examples in Section [0066] of US 2007/0224539 A, which are however nonlimiting. One of the above-described basic compounds may be used alone, or two or more thereof may be used in combination.

When the composition of the present invention contains a basic compound (including the compound (PDA)), the addition ratio thereof to the composition as a whole is preferably in the range of 0.01 to 15 mass %, more preferably 0.1 to 10 mass % and further more preferably 0.5 to 7 mass % based on the total solids of the composition.

The content of basic compound is generally in the range of 0.001 to 10 mass %, preferably 0.01 to 7 mass %, based on the total solids of the composition of the present invention.

With respect to the ratio between acid generator and basic compound contained in the composition, it is preferred for the molar ratio of acid generator/basic compound to be in the range of 0.5 to 300. Namely, a molar ratio of 0.8 or higher is preferred from the viewpoint of sensitivity and resolution. A molar ratio of 300 or below is preferred from the viewpoint of suppressing any resolution decrease due to resist pattern thickening over time from exposure to baking treatment. The molar ratio of acid generator/basic compound is more preferably in the range of 0.8 to 200, further more preferably 0.8 to 150.

(D) Hydrophobic Resin

The resist composition of the present invention may further contain a hydrophobic resin containing at least either a fluorine atom or a silicon atom especially when a liquid immersion exposure is applied thereto (hereinafter also referred to as "hydrophobic resin (D)" or "resin (D)"). This localizes the hydrophobic resin (D) in the surface layer of the film. Accordingly, when the immersion medium is water, the static/dynamic contact angle of the surface of the resist film with respect to water can be increased, thereby enhancing the immersion water tracking property.

Although the hydrophobic resin (D) is unevenly localized in the interface as mentioned above, as different from surfactants, the hydrophobic resin does not necessarily have to have a hydrophilic group in its molecule and does not need to contribute toward uniform mixing of polar/nonpolar substances.

The hydrophobic resin (D) typically contains a fluorine atom and/or a silicon atom. The fluorine atom and/or silicon atom may be introduced in the principal chain of the resin or a side chain thereof.

When the hydrophobic resin (D) contains a fluorine atom, it is preferred for the resin to comprise, as a partial structure containing a fluorine atom, an alkyl group containing a fluorine atom, a cycloalkyl group containing a fluorine atom or an aryl group containing a fluorine atom.

The alkyl group containing a fluorine atom is a linear or branched alkyl group having at least one hydrogen atom thereof substituted with a fluorine atom. This alkyl group preferably has 1 to 10 carbon atoms, more preferably 1 to 4 carbon atoms. A substituent other than the fluorine atom may further be introduced in the alkyl group containing a fluorine atom.

The cycloalkyl group containing a fluorine atom is a mono- or polycycloalkyl group having at least one hydrogen atom thereof substituted with a fluorine atom. A substituent other than the fluorine atom may further be introduced in the cycloalkyl group containing a fluorine atom.

The aryl group containing a fluorine atom is an aryl group having at least one hydrogen atom thereof substituted with a fluorine atom. As the aryl group, there can be mentioned, for example, a phenyl or naphthyl group. A substituent other than the fluorine atom may further be introduced in the aryl group containing a fluorine atom.

As preferred examples of the alkyl groups each containing a fluorine atom, cycloalkyl groups each containing a fluorine atom and aryl groups each containing a fluorine atom, there can be mentioned the groups of general formulae (F2) to (F4) below, which however in no way limit the scope of the present invention.

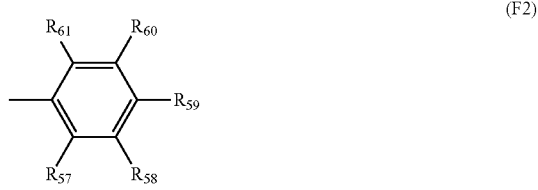

In general formulae (F2) to (F4),
each of $R_{57}$ to $R_{68}$ independently represents a hydrogen atom, a fluorine atom or an alkyl group (linear or branched), provided that at least one of each of $R_{57}$-$R_{61}$, at least one of each of $R_{62}$-$R_{64}$ and at least one of each of $R_{65}$-$R^{68}$ represent a fluorine atom or an alkyl group (preferably having 1 to 4 carbon atoms) having at least one hydrogen atom thereof substituted with a fluorine atom.

It is preferred that all of $R_{57}$-$R_{61}$ and $R_{65}$-$R_{67}$ represent fluorine atoms. Each of $R_{62}$, $R_{63}$ and $R_{68}$ preferably represents a fluoroalkyl group (especially having 1 to 4 carbon atoms), more preferably a perfluoroalkyl group having 1 to 4 carbon atoms. When each of $R_{62}$ and $R_{63}$ represents a perfluoroalkyl group, $R_{64}$ preferably represents a hydrogen atom. $R_{62}$ and $R_{63}$ may be bonded with each other to thereby form a ring.

Specific examples of the groups of general formula (F2) include a p-fluorophenyl group, a pentafluorophenyl group, a 3,5-di(trifluoromethyl)phenyl group and the like.

Specific examples of the groups of general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of general formula (F4) include —C(CF$_3$)$_2$OH, —C(C$_2$F$_5$)$_2$OH, —C(CF$_3$)(CF$_3$)OH, —CH(CF$_3$)OH and the like. —C(CF$_3$)$_2$OH is preferred.

The partial structure containing a fluorine atom may be directly bonded to the principal chain, or may be bonded to the principal chain through a group selected from the group consisting of an alkylene group, a phenylene group, an ether group, a thioether group, a carbonyl group, an ester group, an amido group, a urethane group and a ureylene group, or through a group composed of a combination of two or more of these groups.

As preferred repeating units having a fluorine atom, there can be mentioned the repeating units represented by the general formulae below.

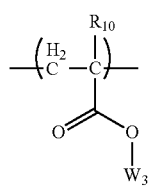

(C-Ia)

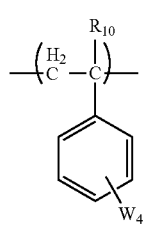

(C-Ib)

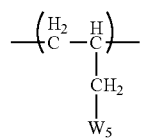

(C-Ic)

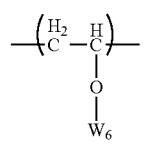

(C-Id)

In the formulae, each of $R_{10}$ and $R_{11}$ independently represents a hydrogen atom, a fluorine atom or an alkyl group. The alkyl group is preferably a linear or branched alkyl group having 1 to 4 carbon atoms. The alkyl group may have a substituent. As a substituted alkyl group, there can be mentioned, in particular, a fluorinated alkyl group.

Each of $W_3$ to $W_6$ independently represents an organic group containing at least one fluorine atom. As such, for example, there can be mentioned the atomic groups of general formulae (F2) to (F4) above.

Further, besides these, the following units may be introduced as the repeating unit containing a fluorine atom.

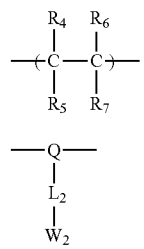

(C-II)

(C-III)

In the formulae, each of $R_4$ to $R_7$ independently represents a hydrogen atom, a fluorine atom or an alkyl group. The alkyl group is preferably a linear or branched alkyl group having 1 to 4 carbon atoms. The alkyl group may have a substituent. As a substituted alkyl group, there can be mentioned, in particular, a fluorinated alkyl group.

At least one of $R_4$ to $R_7$ represents a fluorine atom. $R_4$ and $R_5$, or $R_6$ and $R_7$ may cooperate with each other to thereby form a ring.

$W_2$ represents an organic group containing at least one fluorine atom. As such, for example, there can be mentioned the atomic groups of general formulae (F2) to (F4) above.

$L_2$ represents a single bond or a bivalent connecting group. As the bivalent connecting group, there can be mentioned a substituted or unsubstituted arylene group, a substituted or unsubstituted alkylene group, a substituted or unsubstituted cycloalkylene group, —O—, —SO$_2$—, —CO—, —N(R)— (in the formula, R is a hydrogen atom or an alkyl group), —NHSO$_2$— or a bivalent connecting group consisting of a combination of two or more of these.

Q represents an alicyclic structure. A substituent may be introduced in the alicyclic structure. The alicyclic structure may be monocyclic or polycyclic. The alicyclic structure when being polycyclic may be a bridged one. The alicyclic structure when being monocyclic is preferably a cycloalkyl group having 3 to 8 carbon atoms. As such, there can be mentioned, for example, a cyclopentyl group, a cyclohexyl group, a cyclobutyl group, a cyclooctyl group or the like. As the polycyclic one, there can be mentioned a group with, for example, a bicyclo, tricyclo or tetracyclo structure having 5 or more carbon atoms. A cycloalkyl group having 6 to 20 carbon atoms is preferred. As such, there can be mentioned, for example, an adamantyl group, a norbornyl group, a dicyclopentyl group, a tricyclodecanyl group, a tetracyclododecyl group or the like. The carbon atoms of the cycloalkyl group may be partially replaced with a heteroatom, such as an oxygen atom. It is especially preferred for Q to represent a norbornyl group, a tricyclodecanyl group, a tetracyclododecyl group or the like.

Particular examples of the repeating units each containing a fluorine atom are shown below, which in no way limit the scope of the present invention.

In the particular examples, $X_1$ represents a hydrogen atom, —$CH_3$, —F or —$CF_3$, and $X_2$ represents —F or —$CF_3$.

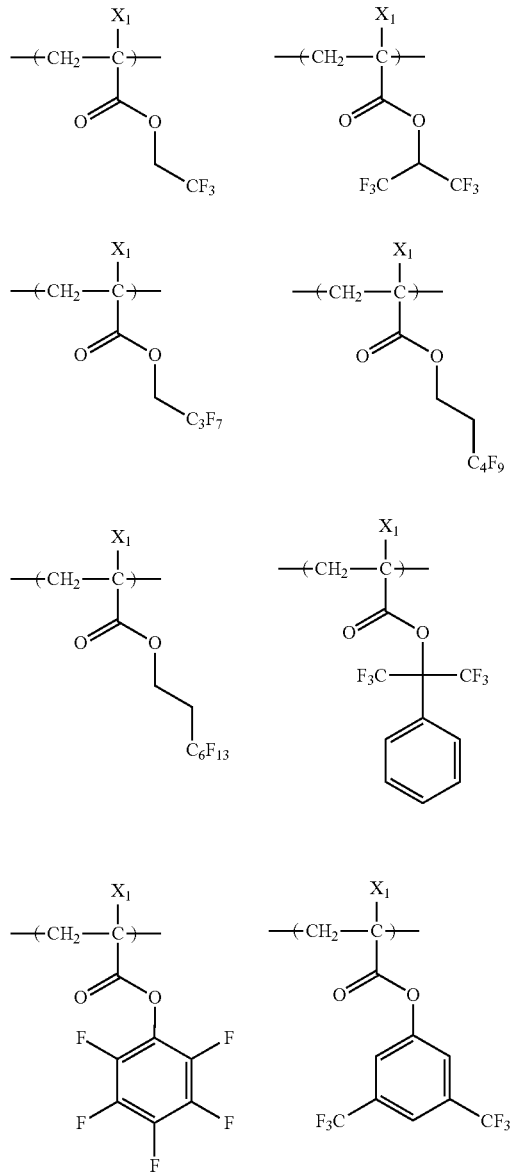
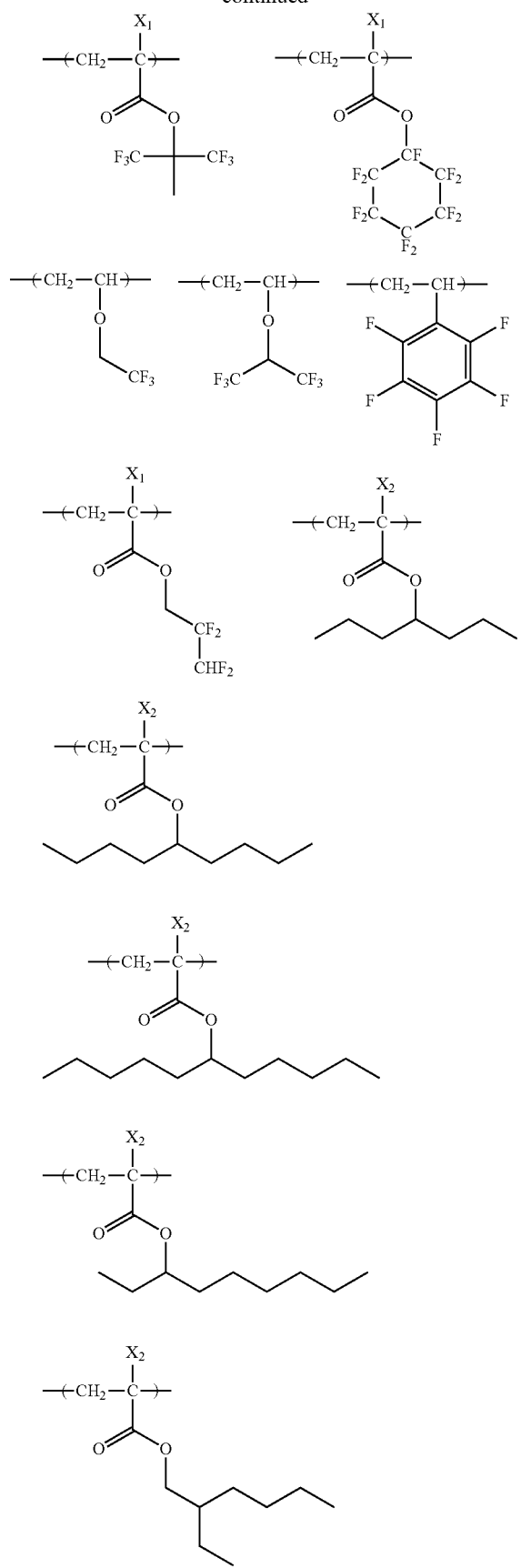

The hydrophobic resin (D) may contain a silicon atom. It is preferred for the hydrophobic resin (D) to have an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

In general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group. The sum of carbon atoms of the bivalent connecting group is preferably 12 or less.

In the formulae, n is an integer of 1 to 5. n is preferably an integer of 2 to 4.

Particular examples of the repeating units having any of the groups of general formulae (CS-1) to (CS-3) are shown below, which in no way limit the scope of the present invention.

In the particular examples, $X_1$ represents a hydrogen atom, —$CH_3$, —F or —$CF_3$.

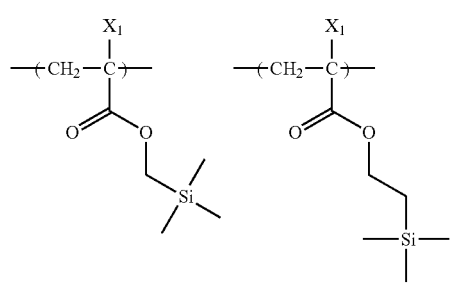
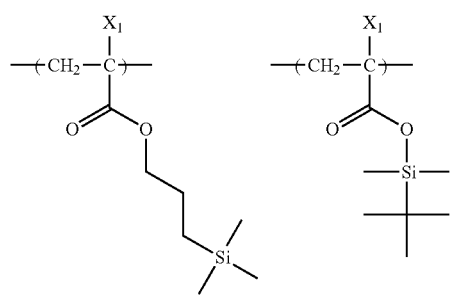
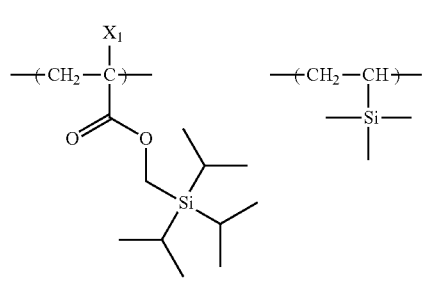
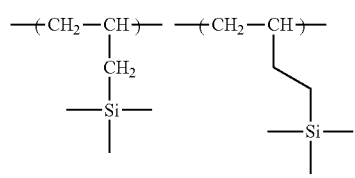
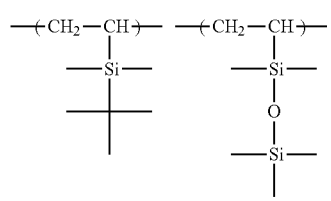
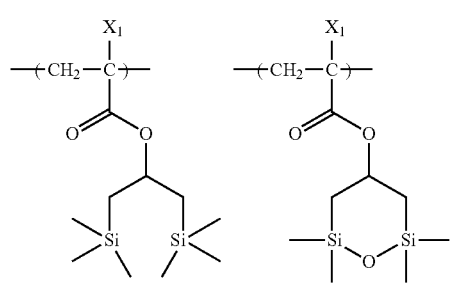
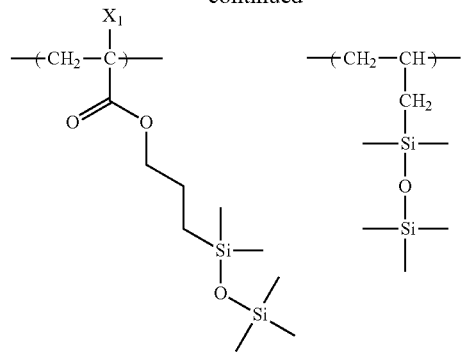
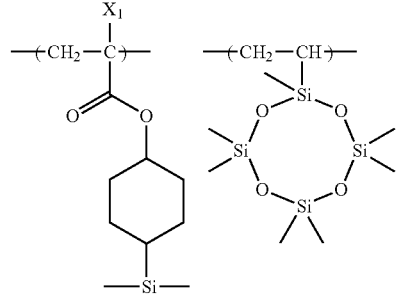
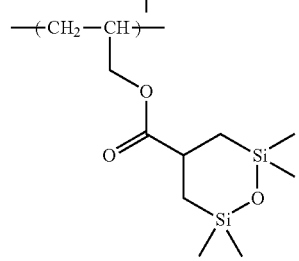
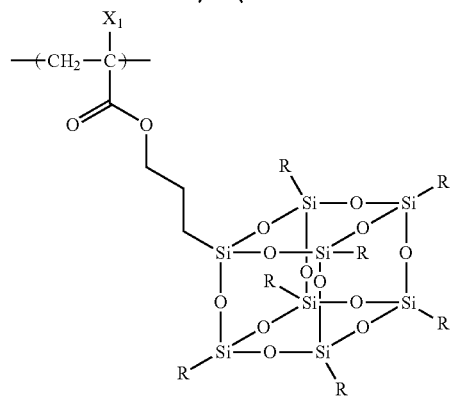
R = CH$_3$, C$_2$H$_5$, C$_3$H$_7$, C$_4$H$_9$
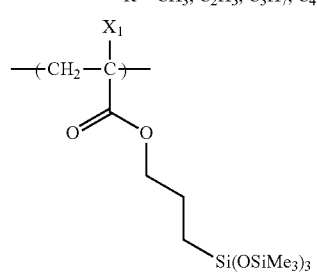
The hydrophobic resin (D) may further contain at least one group selected from the group consisting of the following groups (x) to (z).

Namely, (x) an acid group, (y) a group with a lactone structure, an acid anhydride group or an acid imido group, and (y) a group that when acted on by an acid, is decomposed.

As the acid group (x), there can be mentioned a phenolic hydroxyl group, a carboxylic acid group, a fluoroalcohol group, a sulfonic acid group, a sulfonamido group, a sulfonimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group or a tris(alkylsulfonyl)methylene group or the like.

As preferred acid groups, there can be mentioned a fluoroalcohol group, a sulfonimido group and a bis(alkylcarbonyl)methylene group. As a preferred fluoroalcohol group, there can be mentioned a hexafluoroisopropanol group.

The repeating unit containing an acid group (x) is, for example, a repeating unit wherein the acid group is directly bonded to the principal chain of a resin, such as a repeating unit derived from acrylic acid or methacrylic acid. Alternatively, this repeating unit may be a repeating unit wherein the acid group is bonded via a connecting group to the principal chain of a resin. Still alternatively, this repeating unit may be a repeating unit wherein the acid group is introduced in a terminal of the resin by using a chain transfer agent or polymerization initiator containing the acid group in the stage of polymerization. The repeating unit containing an acid group (x) may have at least either a fluorine atom or a silicon atom.

The content of the repeating unit containing an acid group (x) based on all the repeating units of the hydrophobic resin (D) is preferably in the range of 1 to 50 mol %, more preferably 3 to 35 mol % and further more preferably 5 to 20 mol %.

Particular examples of the repeating units each containing an acid group (x) are shown below. In the formulae, Rx represents a hydrogen atom, $CH_3$, $CF_3$ or $CH_2OH$.

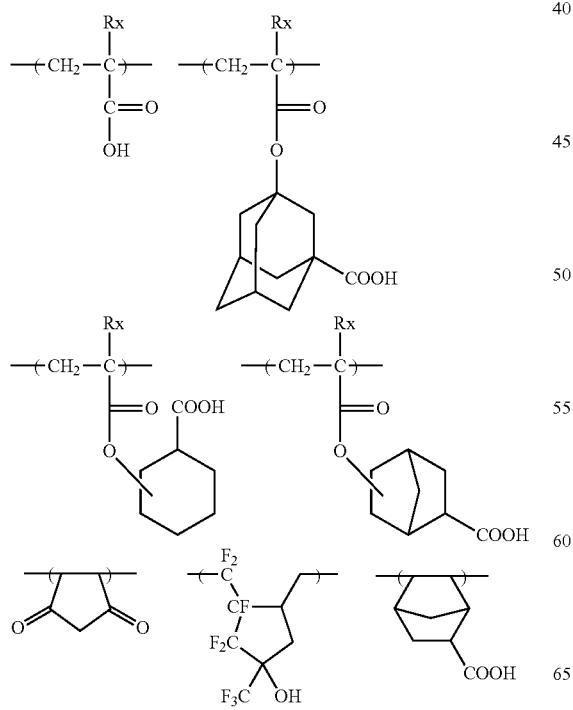

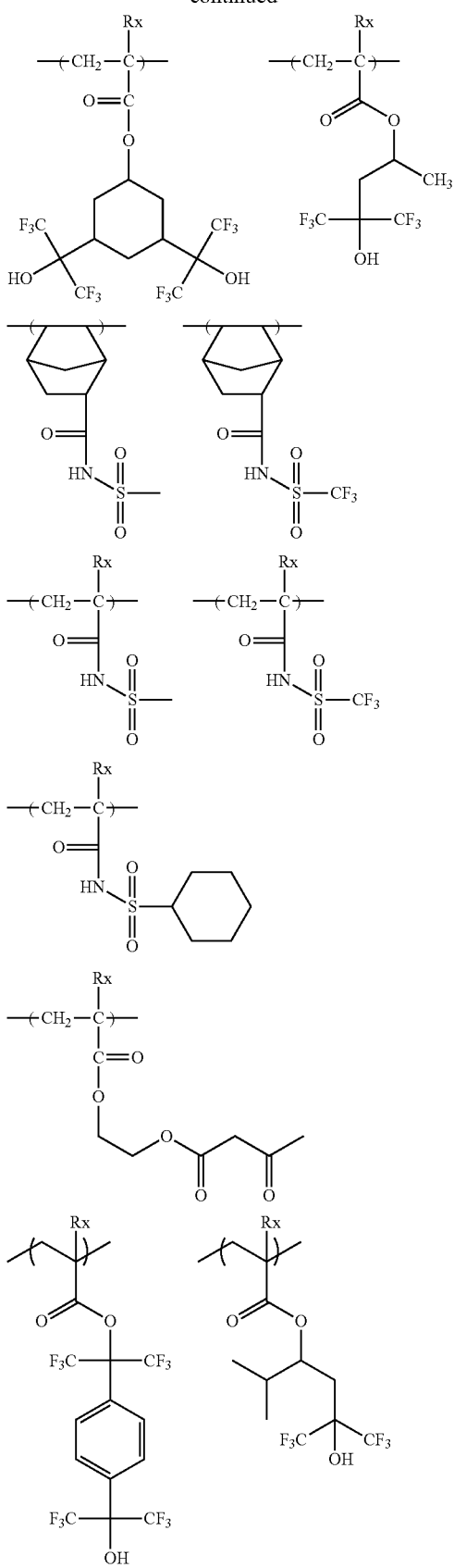

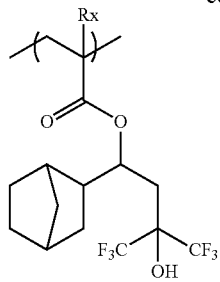

Among the group with a lactone structure, acid anhydride group and acid imido group (y), the group with a lactone structure is especially preferred.

The repeating unit containing any of these groups is, for example, a repeating unit wherein the group is directly bonded to the principal chain of a resin, such as a repeating unit derived from an acrylic ester or a methacrylic ester. Alternatively, this repeating unit may be a repeating unit wherein the group is bonded via a connecting group to the principal chain of a resin.

Still alternatively, this repeating unit may be a repeating unit wherein the group is introduced in a terminal of the resin by using a chain transfer agent or polymerization initiator containing the group in the stage of polymerization.

The content of repeating unit containing a group with a lactone structure, an acid anhydride group or an acid imido group, based on all the repeating units of the hydrophobic resin, is preferably in the range of 1 to 100 mol %, more preferably 3 to 98 mol % and further more preferably 5 to 95 mol %.

In the hydrophobic resin (D), common repeating units can be used without any particular limitation as the repeating unit having a group (z) decomposed under the action of an acid. The repeating unit having a group (z) decomposed under the action of an acid may contain at least either a fluorine atom or a silicon atom. The content of repeating unit having a group (z) decomposed under the action of an acid in the hydrophobic resin (D), based on all the repeating units of the hydrophobic resin (D), is preferably in the range of 1 to 80 mol %, more preferably 10 to 80 mol % and further more preferably 20 to 60 mol %.

The hydrophobic resin (D) may further contain any of the repeating units represented by general formula (III) below.

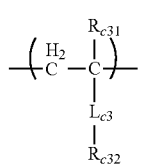 (III)

In general formula (III), $R_{c31}$ represents a hydrogen atom, an alkyl group, an alkyl group optionally substituted with one or more fluorine atoms, a cyano group or a group of the formula —$CH_2$—O—$R_{ac2}$ in which $R_{ac2}$ represents a hydrogen atom, an alkyl group or an acyl group. $R_{c31}$ is preferably a hydrogen atom, a methyl group, a hydroxymethyl group, or a trifluoromethyl group, more preferably a hydrogen atom or a methyl group.

$R_{c32}$ represents a group containing an alkyl group, a cycloalkyl group, an alkenyl group, a cycloalkenyl group, or an aryl group. These groups may be substituted with fluorine atom and/or silicon atom.

$L_{c3}$ represents a single bond or a bivalent connecting group.

In general formula (III), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms. A phenyl group and a naphthyl group are more preferred. Substituents may be introduced therein.

Preferably, $R_{c32}$ represents an unsubstituted alkyl group or an alkyl group substituted with a fluorine atom.

The bivalent connecting group represented by $L_{c3}$ is preferably an alkylene group (preferably having 1 to 5 carbon atoms), an ether bond, a phenylene group or an ester bond (group of the formula —COO—).

The content of repeating unit expressed by general formula (III), based on all the repeating units of the hydrophobic resin, is preferably in the range of 1 to 100 mol %, more preferably 10 to 90 mol % and further more preferably 30 to 70 mol %.

The hydrophobic resin (D) may further contain any of the repeating units represented by general formula (CII-AB) below.

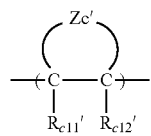

(CII-AB)

In formula (CII-AB), each of $R_{c1'}$ and $R_{c12'}$ independently represents a hydrogen atom, a cyano group, a halogen atom or an alkyl group.

Zc' represents an atomic group required for forming an alicyclic structure in cooperation with two carbon atoms (C—C) to which $R_{c11'}$ and $R_{c12'}$ are respectively bonded.

The content of repeating unit expressed by general formula (CII-AB), based on all the repeating units of the hydrophobic resin, is preferably in the range of 1 to 100 mol %, more preferably 10 to 90 mol % and further more preferably 30 to 70 mol %.

Specific examples of the repeating unit represented by general formulae (III) or (CII-AB) will be shown below, which however in no way limit the scope of the present invention. In the formulae, Ra represents H, $CH_3$, $CH_2OH$, $CF_3$ or CN.

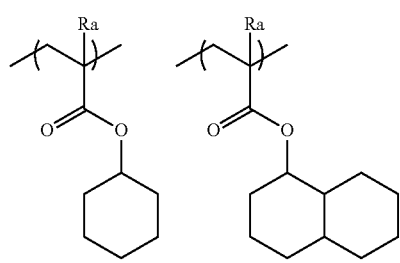

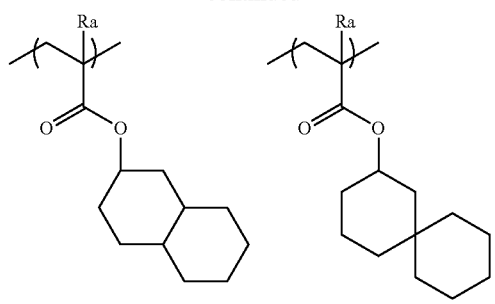

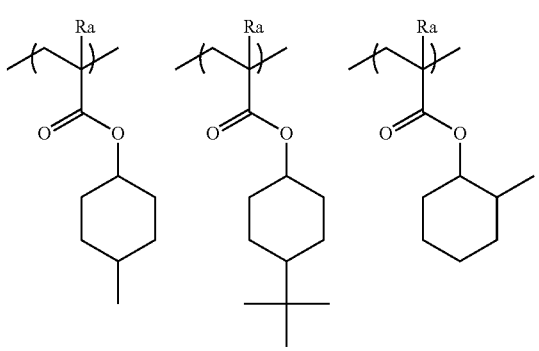

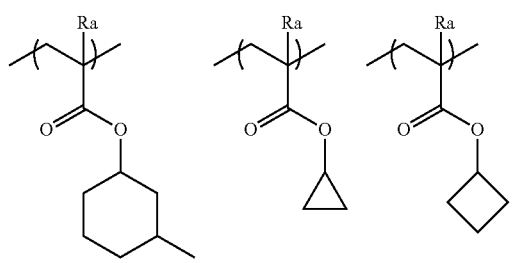

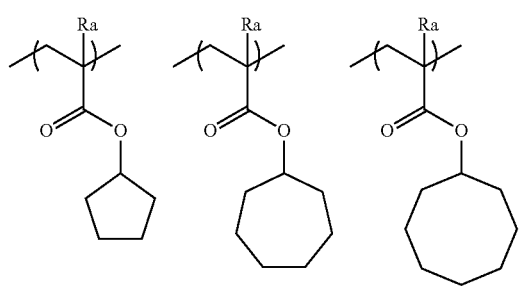

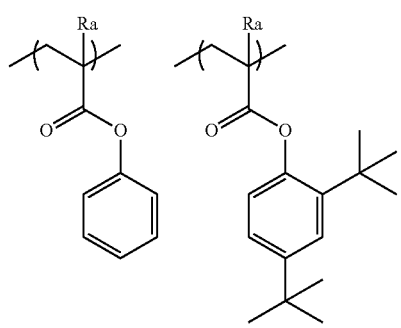

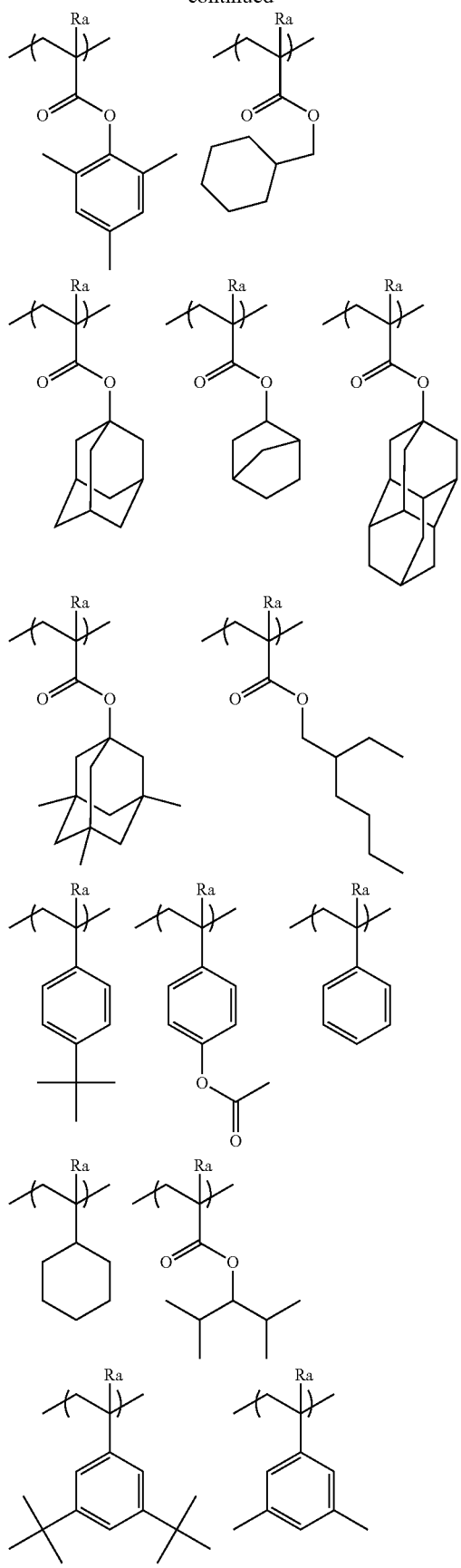
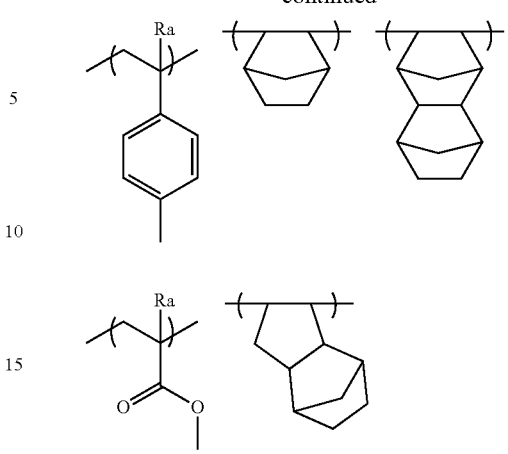
Specific examples of the hydrophobic resin (D) will be shown below. The following Table 1 shows the molar ratio of individual repeating units (corresponding to individual repeating units in order from the left), weight average molecular weight, and degree of dispersal with respect to each of the resins.
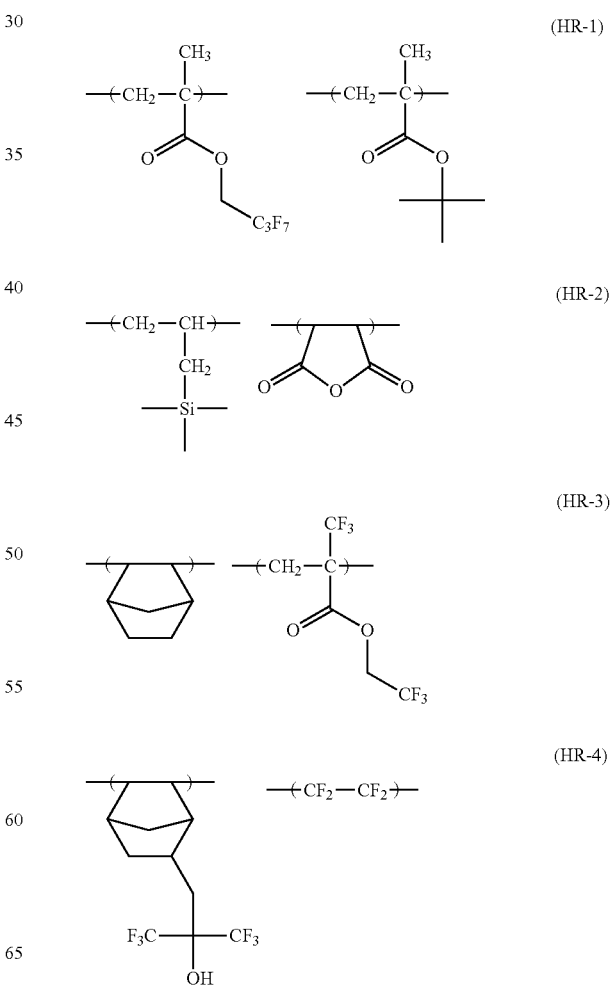

(HR-5) 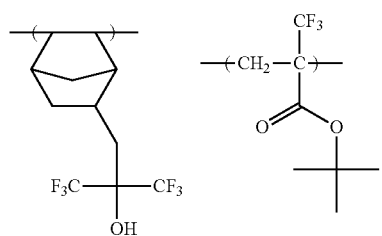
(HR-6) 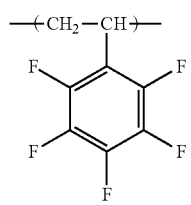
(HR-7) 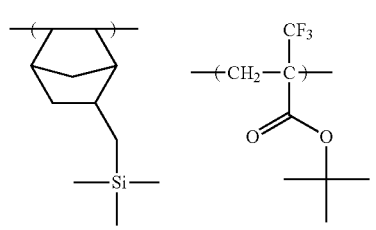
(HR-8) 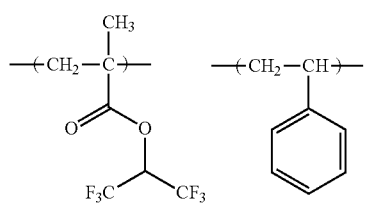
(HR-9) 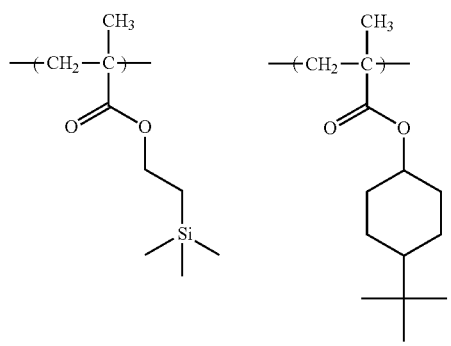
(HR-10) 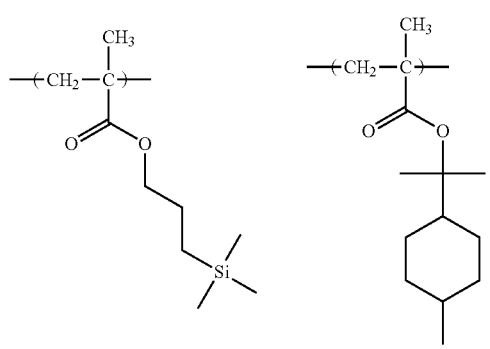
(HR-11) 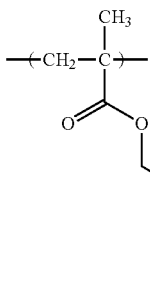 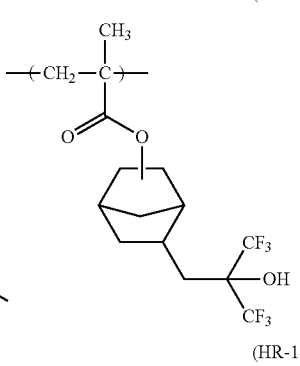
(HR-12) 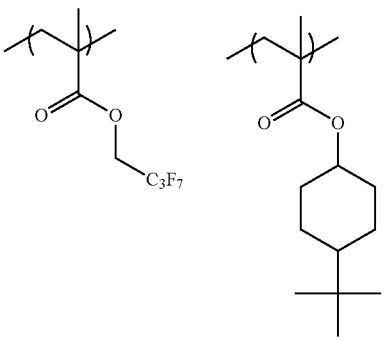
(HR-13) 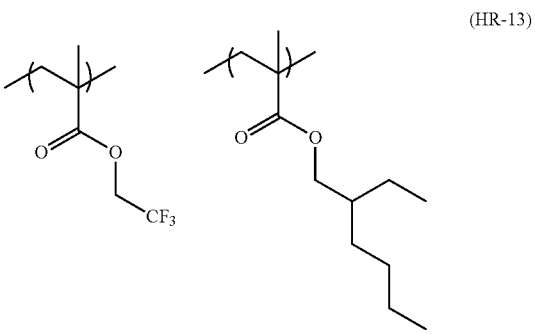
(HR-14) 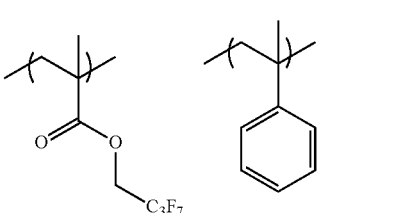
(HR-15) 
(HR-16) 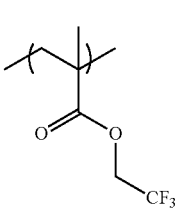

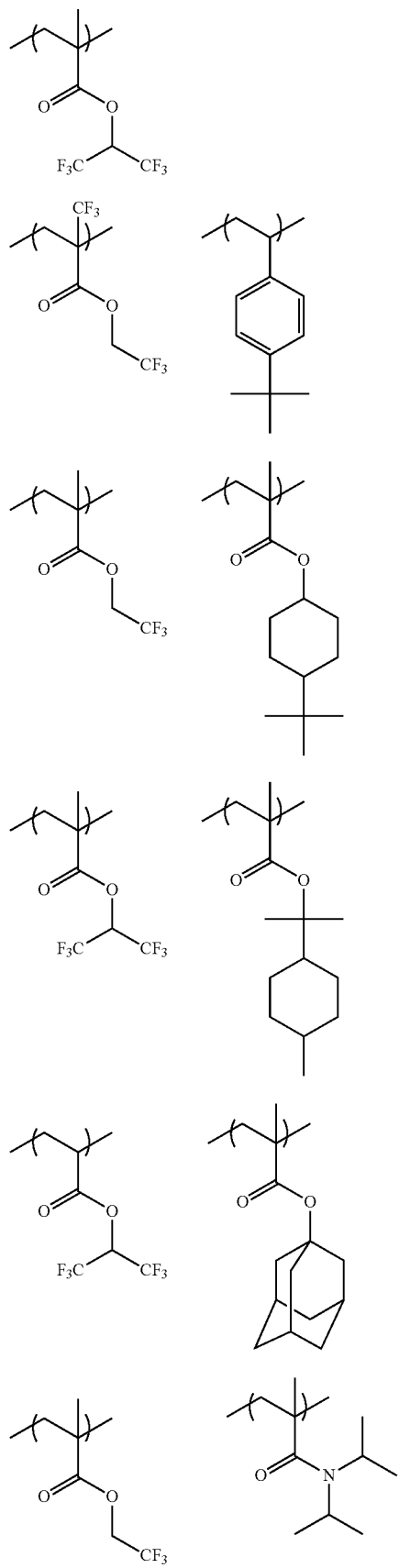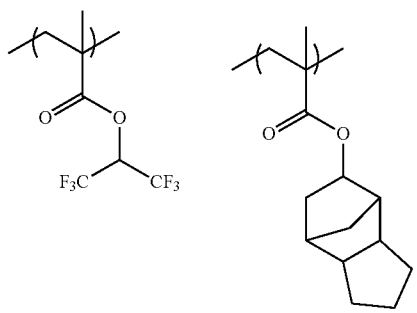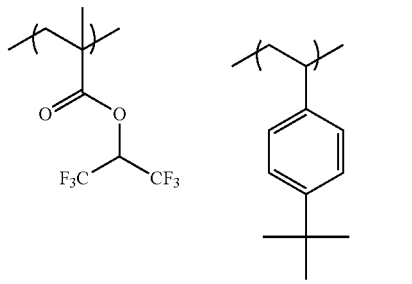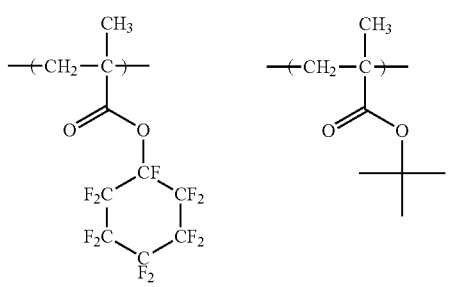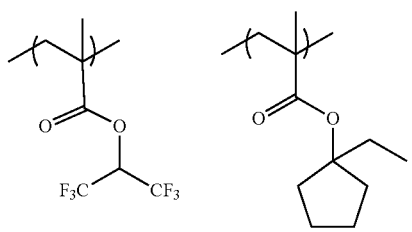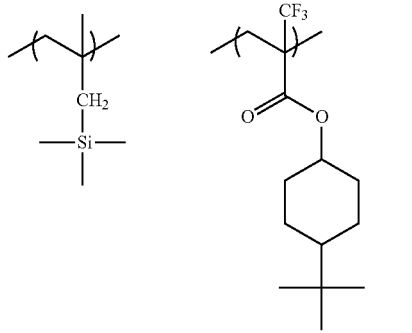

(HR-28) 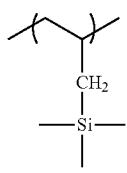 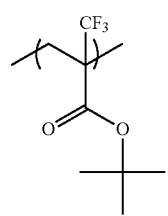
(HR-29) 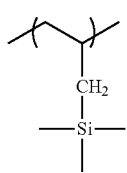 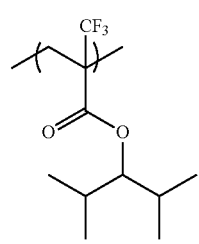
(HR-30) 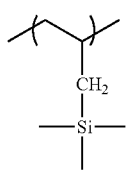 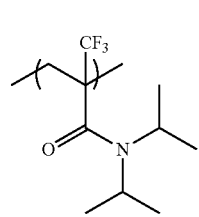
(HR-31) 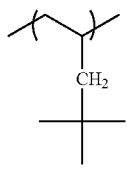 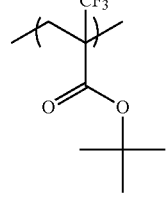
(HR-32) 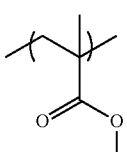
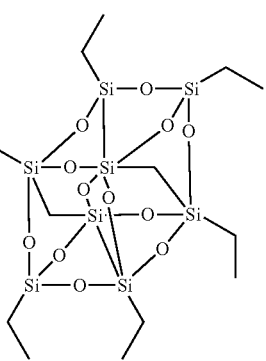
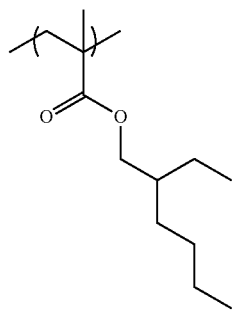
(HR-33) 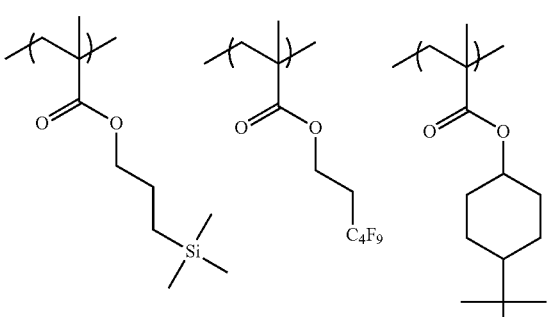
(HR-34) 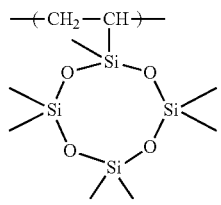
(HR-35) 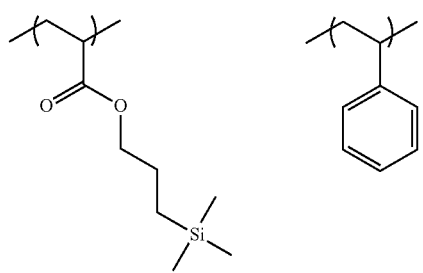
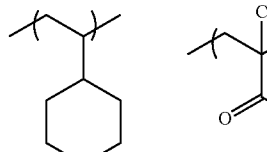
(HR-36) 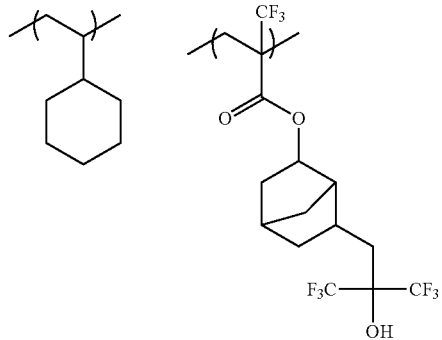

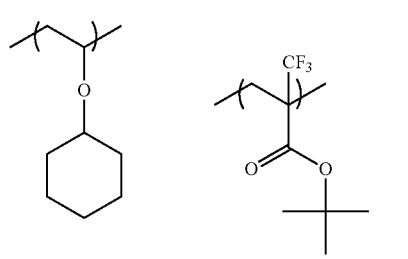
(HR-37)
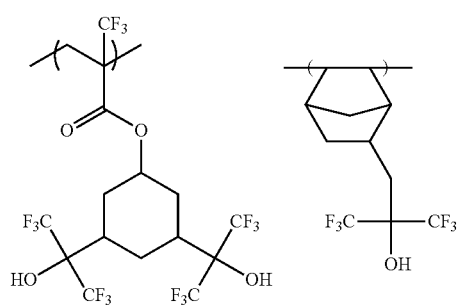
(HR-38)
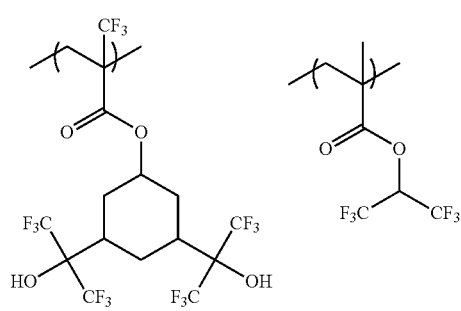
(HR-39)
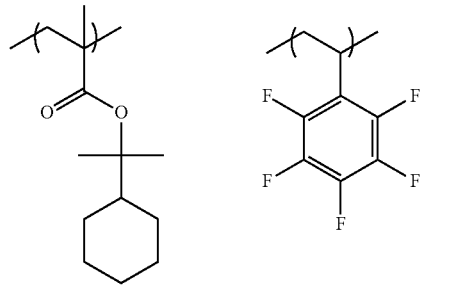
(HR-40)
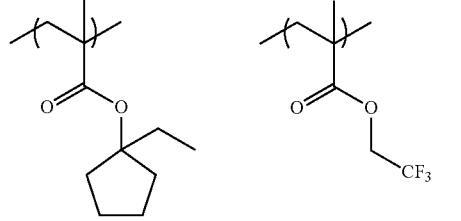
(HR-41)
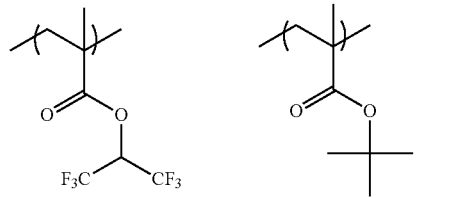
(HR-42)
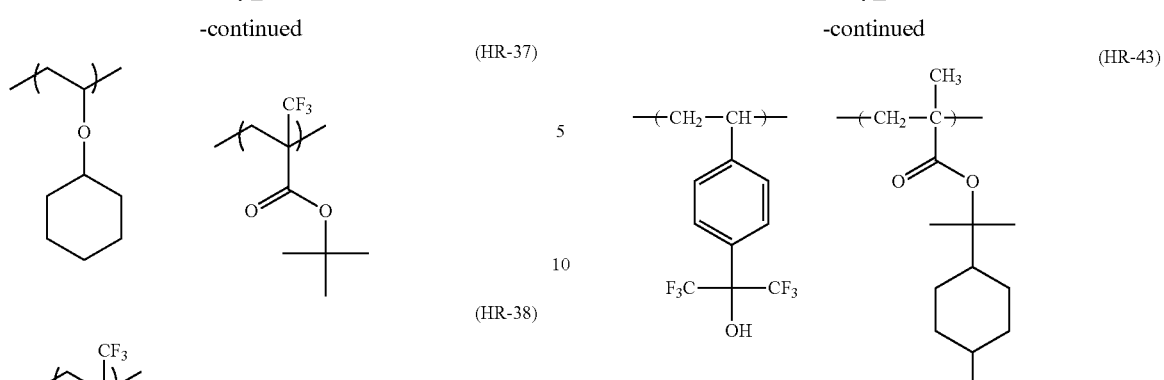
(HR-43)
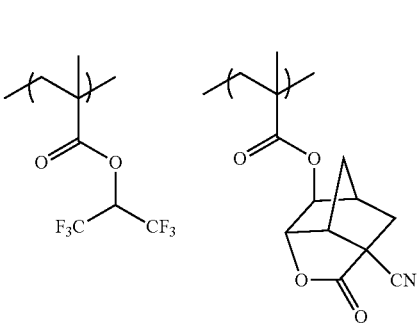
(HR-44)
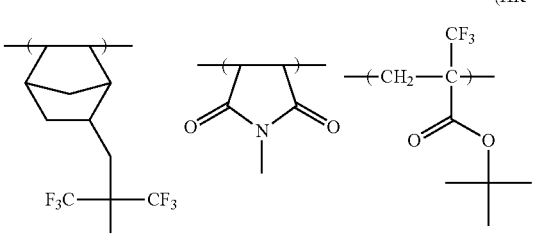
(HR-45)
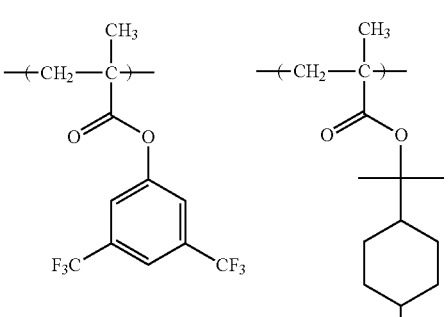
(HR-46)
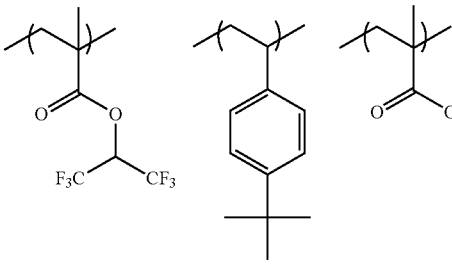
(HR-47)

(HR-48)
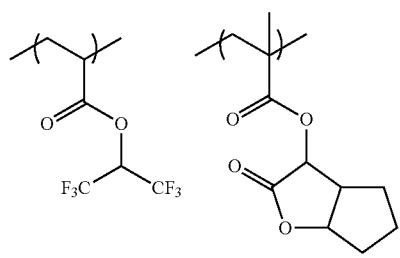
(HR-49)
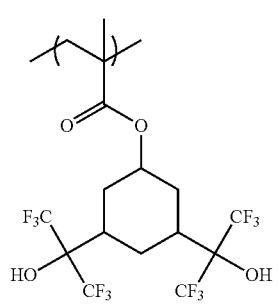
(HR-50)
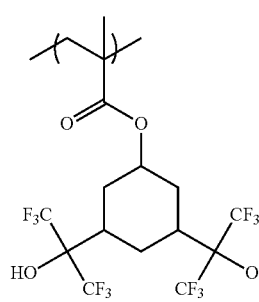 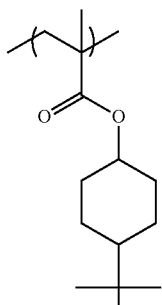
(HR-51)
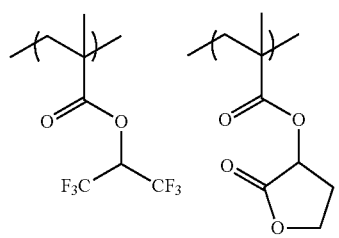
(HR-52)
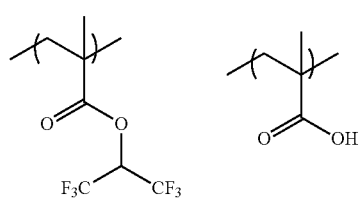
(HR-53)
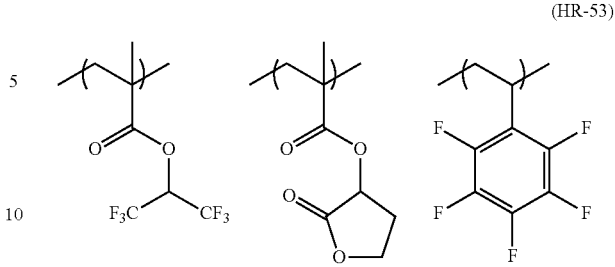
(HR-54)
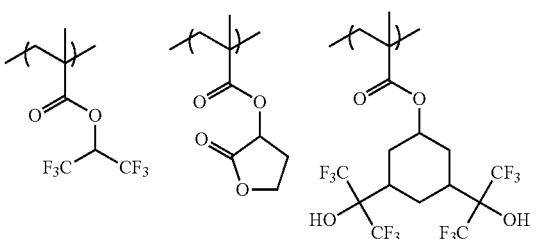
(HR-55)
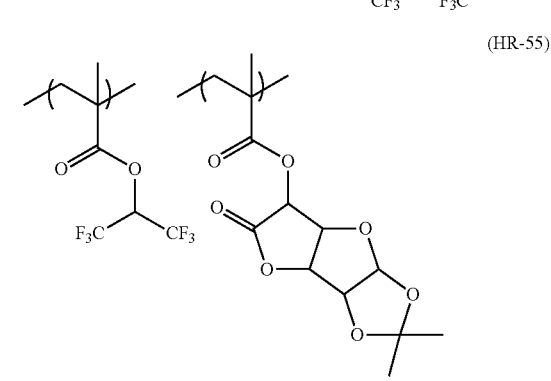
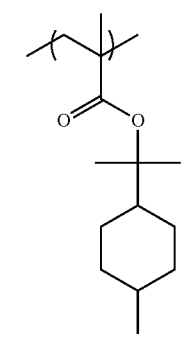
(HR-56)
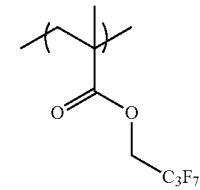
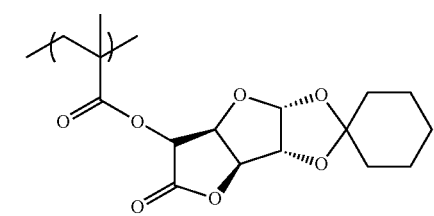

(HR-57)
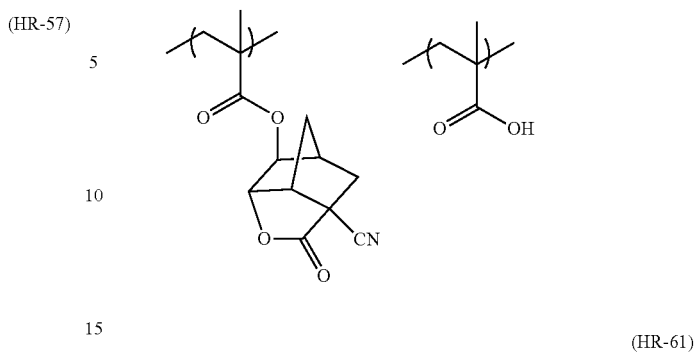
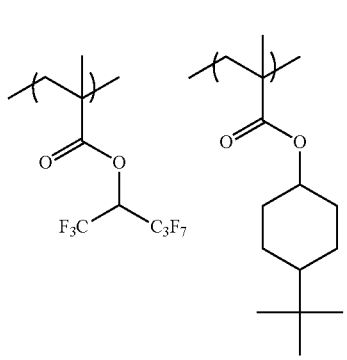
(HR-61)
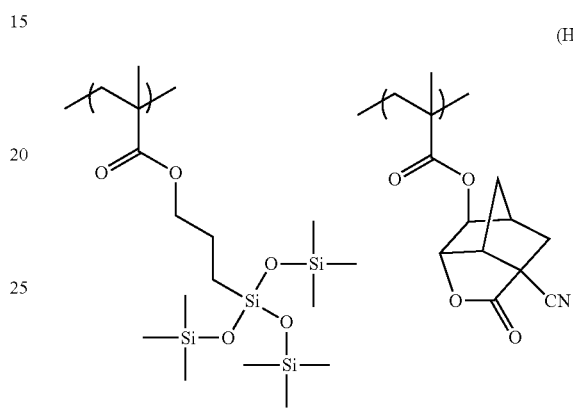
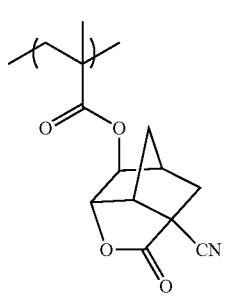
(HR-58)
(HR-62)
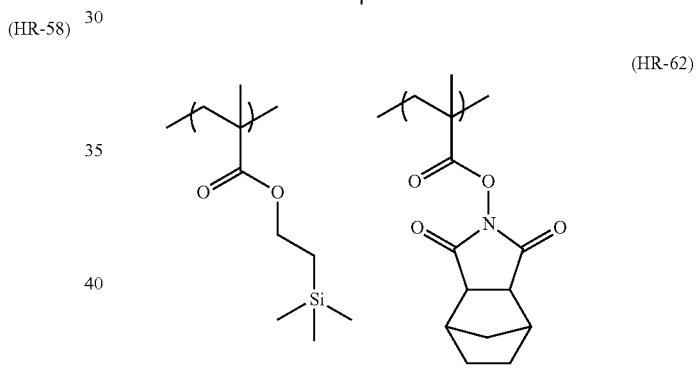
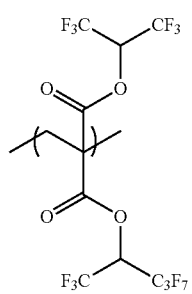
(HR-59)
(HR-63)
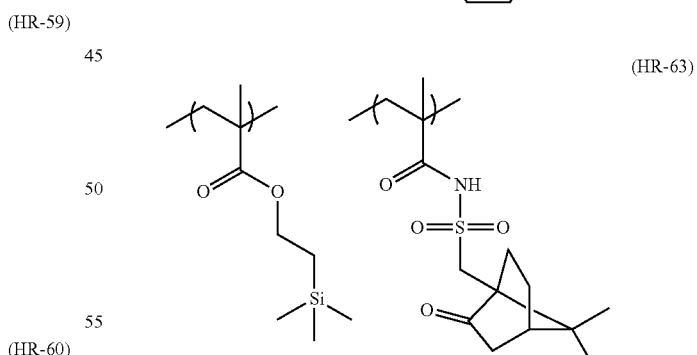
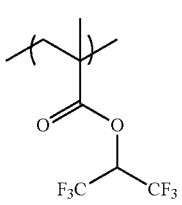
(HR-60)
(HR-64)
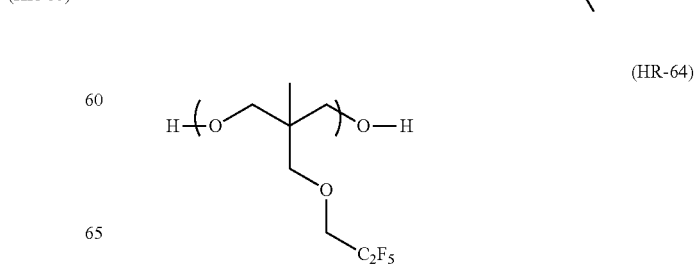
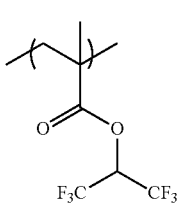

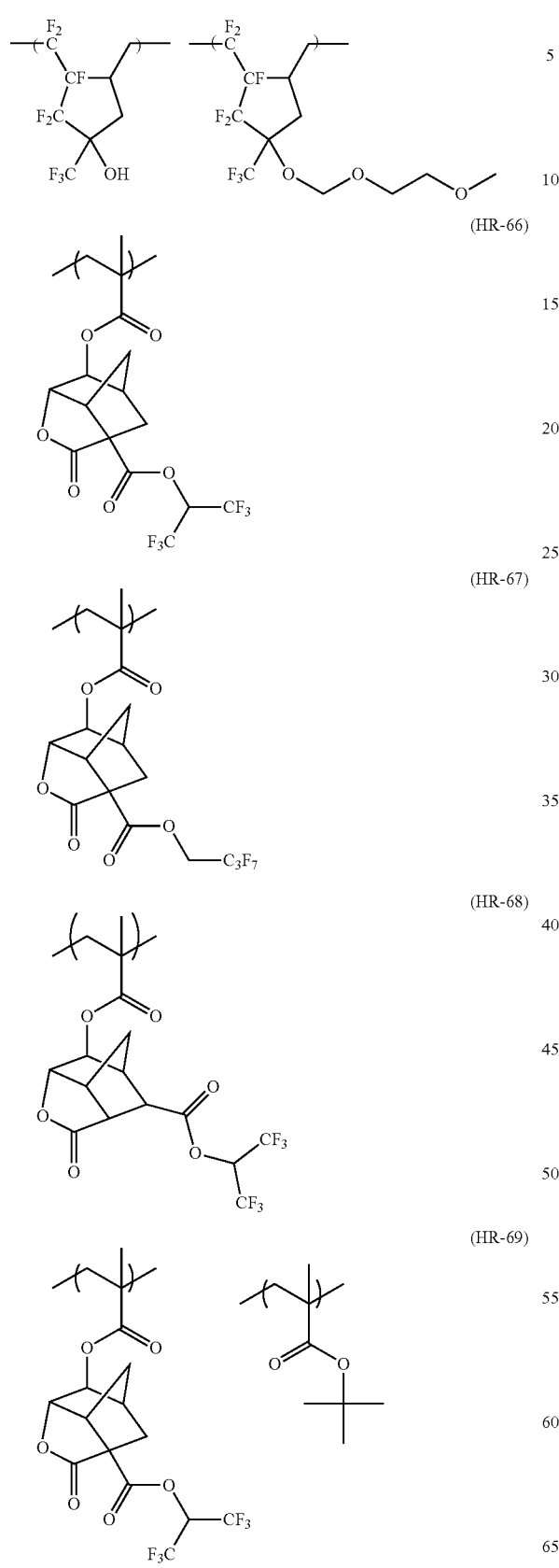
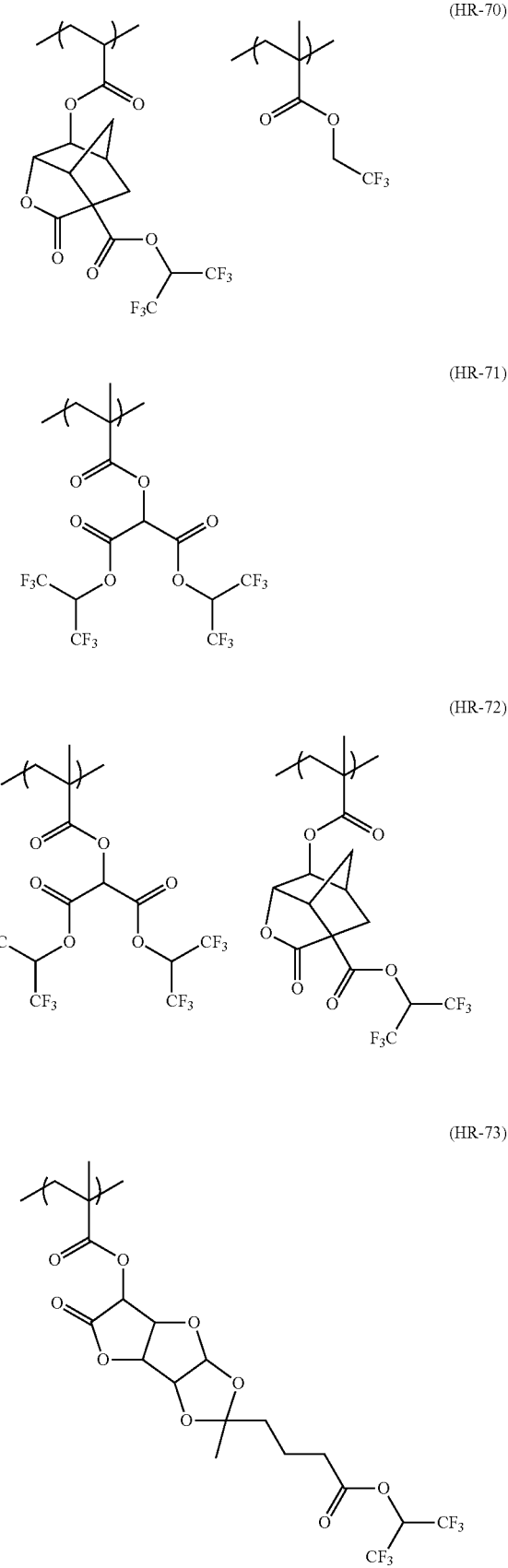

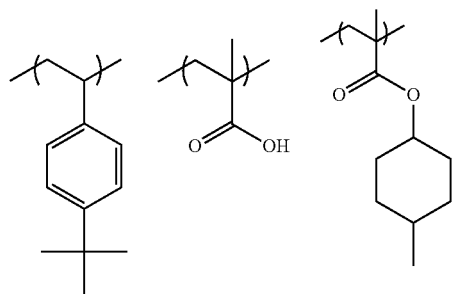
(HR-74)
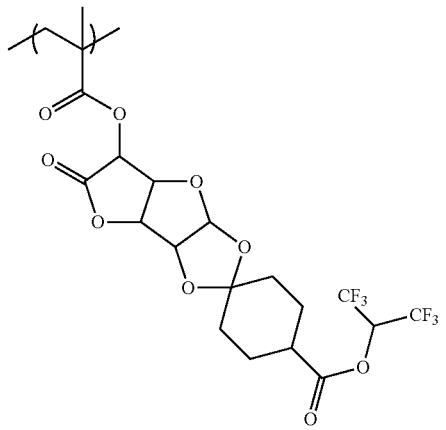
(HR-75)
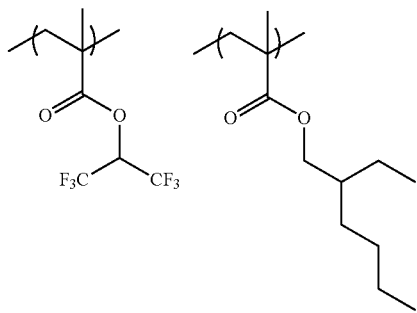
(HR-76)
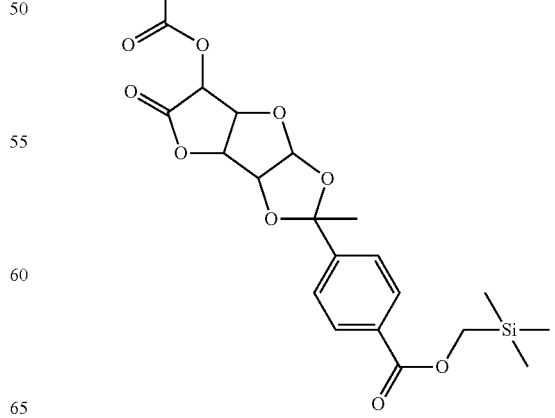
(HR-77)

(HR-78)
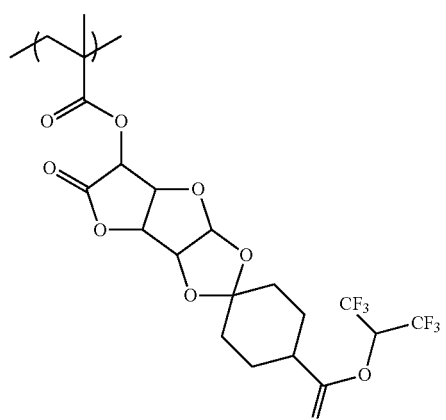
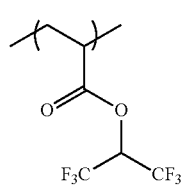
(HR-79)
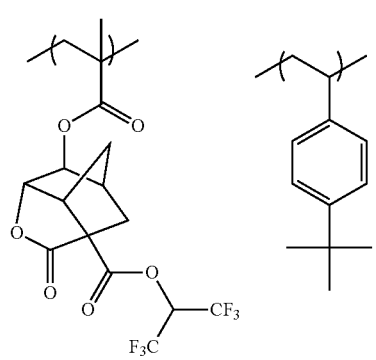
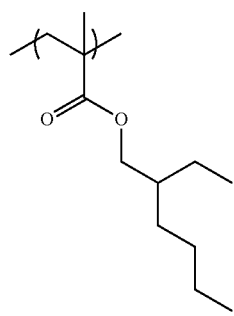
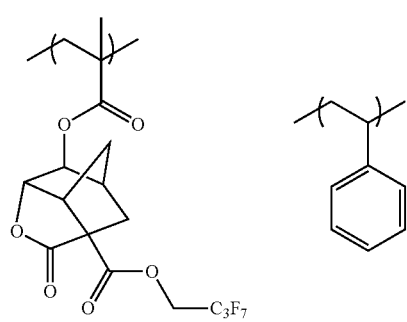
(HR-80)
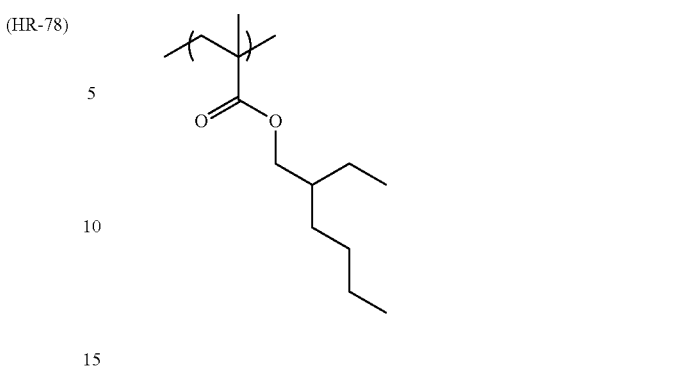
(HR-81)
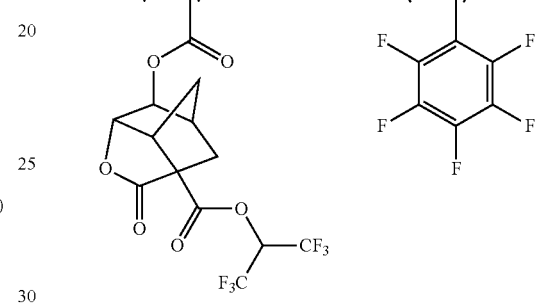
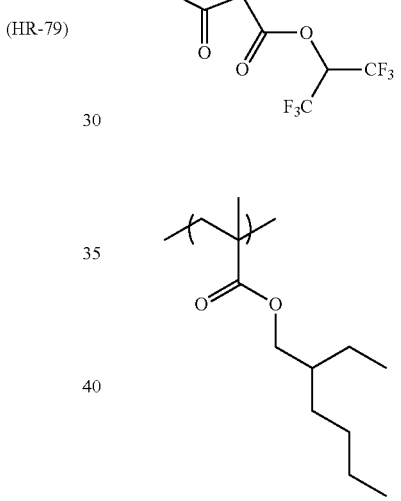
(HR-82)
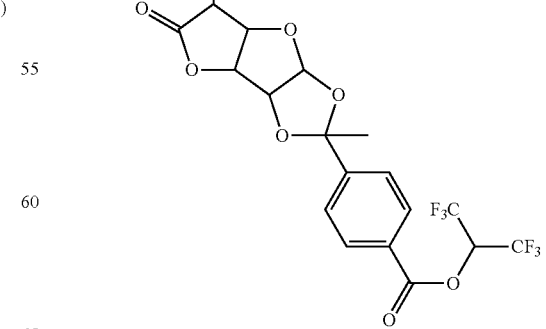

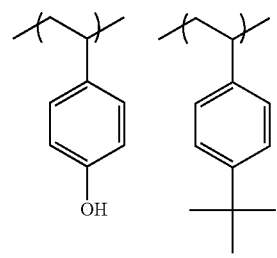
(HR-83)
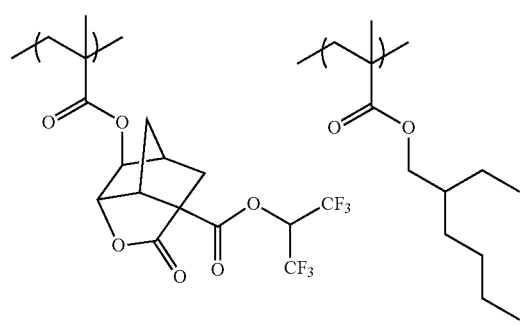
(HR-84)
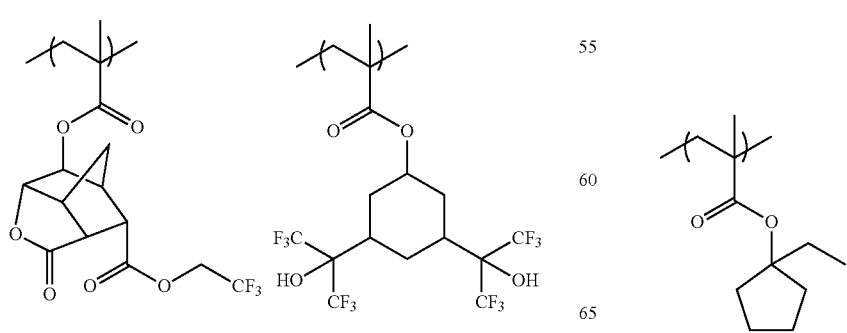
(HR-86)
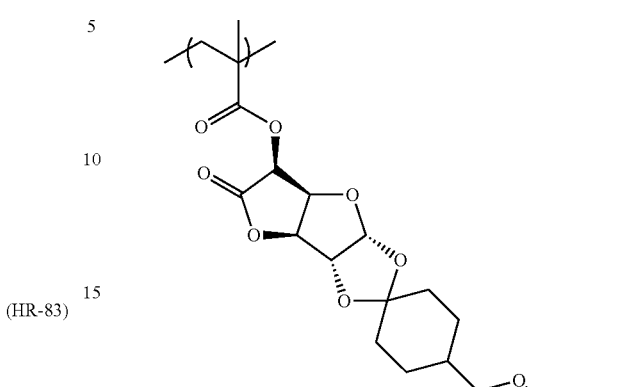
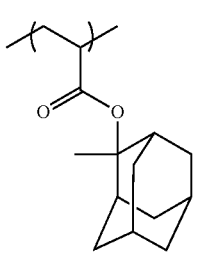
(HR-87)
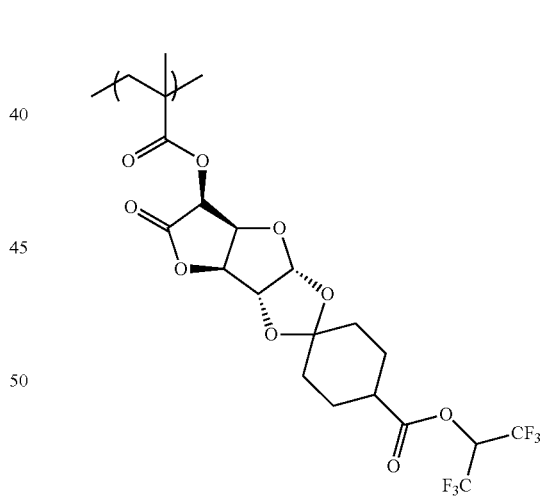

-continued

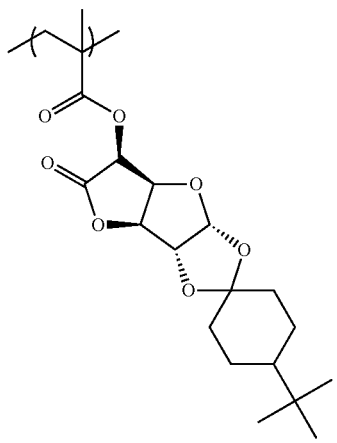
(HR-88)

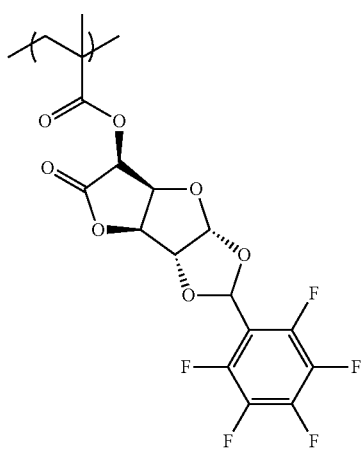
(HR-89)

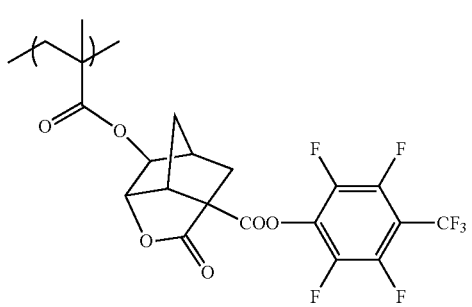
(HR-90)

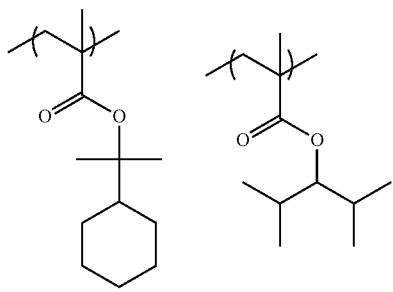

TABLE 1

| Resin | Composition | Mw | Mw/Mn |
| --- | --- | --- | --- |
| HR-1 | 50/50 | 4900 | 1.4 |
| HR-2 | 50/50 | 5100 | 1.6 |

TABLE 1-continued

| Resin | Composition | Mw | Mw/Mn |
| --- | --- | --- | --- |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |

TABLE 1-continued

| Resin | Composition | Mw | Mw/Mn |
|---|---|---|---|
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

When the hydrophobic resin (D) contains a fluorine atom, the content of fluorine atom(s) is preferably in the range of 5 to 80 mass %, more preferably 10 to 80 mass %, based on the weight average molecular weight of the hydrophobic resin. The content of the repeating unit containing a fluorine atom is preferably in the range of 10 to 100 mol %, more preferably 30 to 100 mol %, based on all the repeating units of the hydrophobic resin (D).

When the hydrophobic resin (D) contains a silicon atom, the content of silicon atom(s) is preferably in the range of 2 to 50 mass %, more preferably 2 to 30 mass %, based on the weight average molecular weight of the hydrophobic resin. The content of the repeating unit containing a silicon atom is preferably in the range of 10 to 100 mol %, more preferably 20 to 100 mol %, based on all the repeating units of the hydrophobic resin (D).

The weight average molecular weight of the hydrophobic resin (D) in terms of standard polystyrene molecular weight is preferably in the range of 1000 to 100,000, more preferably 1000 to 50,000 and still more preferably 2000 to 15,000. From the viewpoint of resolving power, resist profile, side wall of resist pattern, roughness, etc., the molecular weight distribution (Mw/Mn, also referred to as the degree of dispersal) thereof is preferably in the range of 1 to 5, more preferably 1 to 3 and still more preferably 1 to 2.

The hydrophobic resin (D) may be used either individually or in combination.

The content of the hydrophobic resin (D) in the composition is preferably in the range or 0.01 to 10 mass %, more preferably 0.05 to 8 mass % and still more preferably 0.1 to 5 mass % based on the total solid of the composition of the present invention.

(E) Surfactant

The composition according to the present invention may further contain one or more surfactants. The composition according to the present invention when containing the above surfactant would, in the use of an exposure light source of 250 nm or below, especially 220 nm or below, realize favorable sensitivity and resolving power and produce a resist pattern with less adhesion and development defects.

It is especially preferred to use a fluorinated and/or siliconized surfactant as the surfactant.

As fluorinated and/or siliconized surfactants, there can be mentioned, for example, those described in section [0276] of US Patent Application Publication No. 2008/0248425. Further, as useful commercially available surfactants, fluorinated surfactants or siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOA-GOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS) can be exemplified. Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). In particular, polymers each having a fluoroaliphatic group derived from such a fluoroaliphatic compound may be used as the surfactant. The fluorinated aliphatic compound can be synthesized by the process described in JP-A-2002-90991.

The polymer having a fluorinated aliphatic group is preferably a copolymer from a monomer having a fluorinated aliphatic group and a poly(oxyalkylene)acrylate and/or poly(oxyalkylene)methacrylate, in which copolymer may have an irregular distribution or may result from block copolymerization.

As the poly(oxyalkylene) group, a poly(oxyethylene) group, a poly(oxypropylene) group, and a poly(oxybutylene) group can be exemplified. Further, use can be made of a unit having alkylene groups of different chain lengths in a single chain, such as poly(oxyethylene-oxypropylene-oxyethylene block concatenation) or poly(oxyethylene-oxypropylene block concatenation).

Moreover, the copolymer from a monomer having a fluorinated aliphatic group and a poly(oxyalkylene) acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene) acrylates (or methacrylates), etc.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene) acrylate (or methacrylate), a copolymer from an acrylate (or methacrylate) having a $C_6F_{13}$ group, poly(oxyethylene) acrylate (or methacrylate) and poly(oxypropylene) acrylate (or methacrylate), a copolymer from an acrylate (or methacrylate) having a $C_8F_{17}$ group and a poly(oxyalkylene) acrylate (or methacrylate), a copolymer from an acrylate (or methacrylate) having a $C_8F_{17}$ group, poly(oxyethylene) acrylate (or methacrylate) and poly(oxypropylene) acrylate (or methacrylate), or the like.

Further, use may be made of surfactants other than the fluorinated and/or siliconized surfactants, described in section [0280] of US Patent Application Publication No. 2008/0248425.

These surfactants may be used either individually or in combination.

When the composition according to the present invention contains the surfactant, the content thereof based on the total solids of the composition is preferably in the range of 0.0001 to 2 mass %, more preferably 0.0001 to 1.5 mass %, and most preferably 0.0005 to 1 mass %.

(F) Carboxylic Acid Onium Salt

The composition according to the present invention may further contain a surfactant. Preferred carboxylic acid onium salt is a sulfonium salt and an iodonium salt. In particular, the especially preferred anion moiety thereof is a linear or branched alkylcarboxylate anion, and monocyclic or polycyclic cycloalkylcarboxylate anion each having 1 to 30 carbon atoms. A more preferred anion moiety is an anion of carboxylic acid wherein the alkyl group or the cycloalkyl group is partially or wholly fluorinated (hereinafter also called as fluorinated carboxylic acid anion). The alkyl or cycloalkyl chain may contain an oxygen atom. Accordingly, there would be achieved securement of the transparency in 220 nm or shorter light, enhancement of the sensitivity and resolving power, and improvement of the iso/dense dependency and exposure margin.

As the fluorinated carboxylic acid anion, any of the anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid can be exemplified.

When the composition according to the present invention contains the carboxylic acid onium salt, the total amount thereof used based on the total solids of the composition is preferably in the range of 0.1 to 20 mass %, more preferably 0.5 to 10 mass %, and most preferably 1 to 7 mass %.

(G) Other Additive

The composition of the present invention may further be loaded with a dissolution inhibiting compound, a dye, a plasticizer, a photosensitizer, a light absorber and/or a compound capable of accelerating the dissolution in a developer (for example, a phenolic compound of 1000 or less molecular weight, or a carboxylated alicyclic or aliphatic compound).

The composition of the present invention may further contain a dissolution inhibiting compound. Herein, the term "dissolution inhibiting compound" means a compound of 3000 or less molecular weight that is decomposed by the action of an acid to thereby decrease its solubility in a developer containing an organic solvent.

From the viewpoint of not lowering the transmission of light of 220 nm or shorter wavelength, it is preferred for the dissolution inhibiting compound to be an alicyclic or aliphatic compound containing an acid-decomposable group, such as any of cholic acid derivatives containing an acid-decomposable group described in Proceeding of SPIE, 2724, 355 (1996). The acid-decomposable group and alicyclic structure are, for example, the same as described above.

When the resist composition of the present invention is exposed to a KrF excimer laser or irradiated with electron beams, a compound containing a structure resulting from substitution of the phenolic hydroxyl group of a phenol compound with an acid-decomposable group is preferably used as the dissolution inhibiting compound. The phenol compound preferably contains 1 to 9 phenol skeletons, more preferably 2 to 6 phenol skeletons.

When the composition of the present invention contains the dissolution inhibiting compound, the content thereof based on the total solids of the composition is preferably in the range of 3 to 50 mass %, more preferably 5 to 40 mass %.

Specific examples of the dissolution inhibiting compounds are shown below.

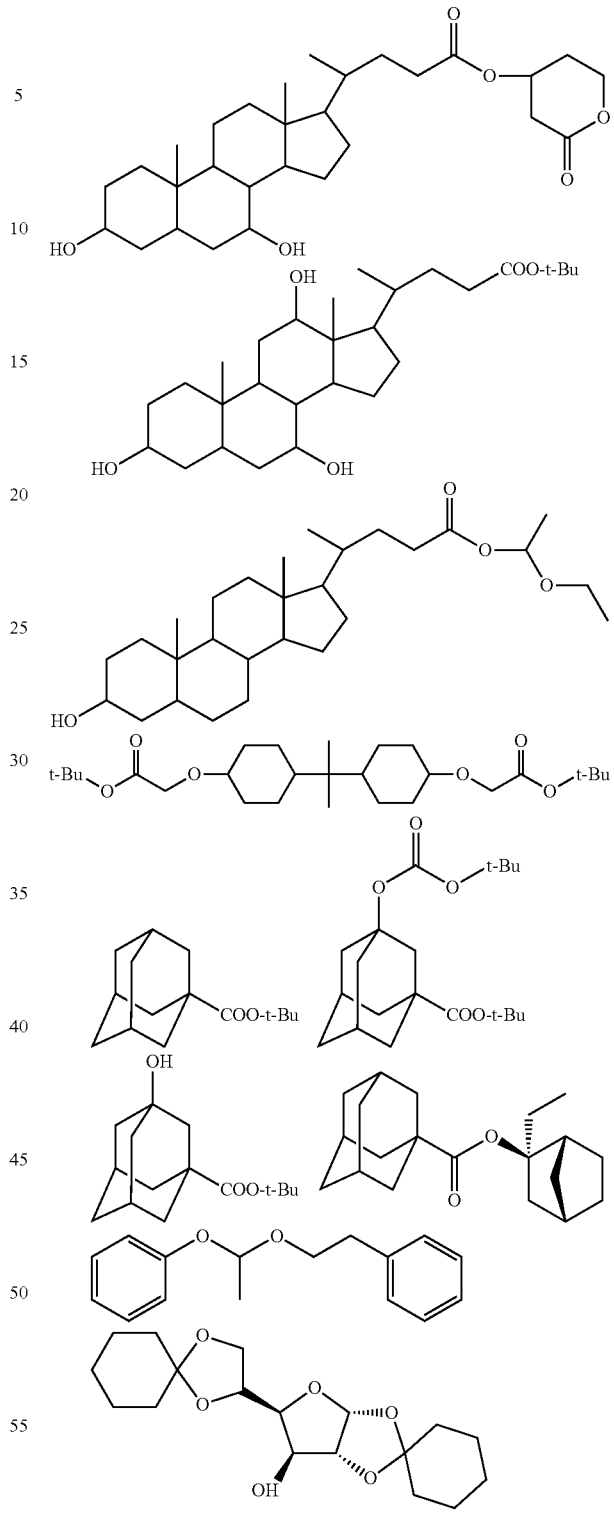

The above phenolic compound of 1000 or less molecular weight can be easily synthesized while consulting the processes described in, for example, JP-A's H4-122938 and H2-28531, U.S. Pat. No. 4,916,210 and EP 219294.

As a carboxylated alicyclic or aliphatic compound, there can be mentioned, for example, a steroid-structure-containing carboxylic acid derivative, such as cholic acid, deoxycholic acid or lithocholic acid, an adamantanecarboxylic acid derivative, adamantanedicarboxylic acid, cyclohexanecarboxylic acid or cyclohexanedicarboxylic acid.

(G) Solvent

The composition according to the present invention may further contain solvent. As the solvent, an organic solvent such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate and an alkyl pyruvate can be exemplified.

As alkylene glycol monoalkyl ether carboxylates, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate can be exemplified.

As alkylene glycol monoalkyl ethers, propylene glycol monomethyl ether, propylene glycol monoethyl ether, propylene glycol monopropyl ether, propylene glycol monobutyl ether, ethylene glycol monomethyl ether, and ethylene glycol monoethyl ether can be exemplified.

As alkyl lactates, methyl lactate, ethyl lactate, propyl lactate and butyl lactate can be exemplified.

As alkyl alkoxypropionates, ethyl 3-ethoxypropionate, methyl 3-methoxypropionate, methyl 3-ethoxypropionate, and ethyl 3-methoxypropionate can be exemplified.

As cyclolactones, β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone can be exemplified.

As optionally cyclized monoketone compounds, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone can be exemplified.

As alkylene carbonates, propylene carbonate, vinylene carbonate, ethylene carbonate, and butylene carbonate can be exemplified.

As alkyl alkoxyacetates, acetic acid 2-methoxyethyl ester, acetic acid 2-ethoxyethyl ester, acetic acid 2-(2-ethoxyethoxy)ethyl ester, acetic acid 3-methoxy-3-methylbutyl ester, and acetic acid 1-methoxy-2-propyl ester can be exemplified.

As alkyl pyruvates, methyl pyruvate, ethyl pyruvate and propyl pyruvate can be exemplified.

As a preferably usable solvent, there can be mentioned a solvent having a boiling point of 130° C. or higher measured under ordinary pressure. In particular, there can be mentioned cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy) ethyl acetate or propylene carbonate.

Each of these solvents may be used alone, or two or more thereof may be used in a mixture. In the latter instance, it is preferred to use a mixed solvent composed of a hydroxylated solvent and a nonhydroxylated solvent.

As the hydroxylated solvent, there can be mentioned, for example, an alkylene glycol monoalkyl ether or an alkyl lactate. Among the hydroxylated solvents, propylene glycol monomethyl ether and ethyl lactate are preferred.

As preferred nonhydroxylated solvents, there can be mentioned, for example, an alkylene glycol monoalkyl ether acetate, an alkyl alkoxypropionate, an optionally cyclized monoketone compound, a cyclolactone and an alkyl acetate. Of these, propylene glycol monomethyl ether acetate, ethyl ethoxypropionate, 2-heptanone, γ-butyrolactone, cyclohexanone and butyl acetate are preferred. Propylene glycol monomethyl ether acetate, ethyl ethoxypropionate and 2-heptanone are especially preferred.

When use is made of a mixed solvent composed of a hydroxylated solvent and a nonhydroxylated solvent, the mass ratio thereof is preferably in the range of 1/99 to 99/1, more preferably 10/90 to 90/10 and further more preferably 20/80 to 60/40.

When use is made of a mixed solvent containing the nonhydroxylated solvent in an amount of 50 mass % or more, strikingly excellent coating uniformity can be attained.

It is preferred for the solvent to be a mixed solvent composed of propylene glycol monomethyl ether acetate and at least one other solvent.

It is especially preferred for the solvent to contain propylene glycol monomethyl ether acetate and cyclohexanone. If so, an excellent pattern shape can be realized. In that instance, the mass ratio of propylene glycol monomethyl ether acetate to cyclohexanone is preferably in the range of 60:40 to 90:10, more preferably 60:40 to 80:20.

It is also preferred for the solvent to contain propylene glycol monomethyl ether in addition to propylene glycol monomethyl ether acetate and cyclohexanone. In that instance, the content of propylene glycol monomethyl ether in the solvent is preferably in the range of 5 to 40 mass %, more preferably 5 to 25 mass %.

The solid content of the resist composition of the present invention is generally in the range of 1.0 to 10 mass %, preferably 2.0 to 7.0 mass % and more preferably 2.5 to 6.0 mass %. If so, an in-plane uniformity of film thickness at the time of coating is enhanced.

<Method of Forming Pattern>

The method of forming a pattern according to the present invention comprises the operations of (A) forming the above-described resist composition into a film, (B) exposing the film to light and (C) developing the exposed film with a developer containing an organic solvent. The pattern formed by this development with a developer containing an organic solvent is typically a negative one. This method may further comprise (D) rinsing the developed film with a rinse liquid.

Preferably, the operation of pre-bake (PB) is performed after the operation of forming a film but prior to the operation of exposure to light. Also preferably, the operation of post-exposure bake (PEB) is performed after the operation of exposure to light but prior to the operation of development.

In both the PB operation and the PEB operation, the baking is preferably performed at 40 to 130° C., more preferably 50 to 120° C. and further more preferably 60 to 110° C. The exposure latitude (EL) and resolving power can be markedly enhanced by carrying out the PEB operation at low temperatures ranging from 60 to 90° C.

The baking time is preferably in the range of 30 to 300 seconds, more preferably 30 to 180 seconds and further more preferably 30 to 90 seconds.

In the method of forming a pattern according to the present invention, the operation of forming a film of the composition on a substrate, the operation of exposing the film to light, the baking operation and the developing operation can be carried out using generally known techniques.

The wavelength of the light source for use in the above exposure is not limited. As such, there can be mentioned, for example, a KrF excimer laser wavelength (248 nm), an ArF excimer laser wavelength (193 nm) or an $F_2$ excimer laser wavelength (157 nm).

In the exposure of the film formed from the composition of the present invention, a liquid immersion exposure may be carried out. The resolution can be enhanced by the liquid immersion exposure. Any liquid with a refractive index higher than that of air can be employed as the immersion medium. Preferably, pure water is employed.

In the liquid immersion exposure, the above-mentioned hydrophobic resin may be added to the composition in advance. Alternatively, the formation of the film may be followed by providing thereon a film that is highly insoluble in the immersion liquid (hereinafter also referred to as a "top coat"). The expected performance of the top coat, the method of using the same, etc. are described in Chapter 7 of "Process and Material of Liquid Immersion Lithography" published by CMC Publishing Co., Ltd.

From the viewpoint of the transparency to a laser of 193 nm wavelength, the top coat is preferably formed of a polymer not abundantly containing an aromatic moiety. As such a polymer, there can be mentioned, for example, a hydrocarbon polymer, an acrylic ester polymer, polymethacrylic acid, polyacrylic acid, polyvinyl ether, a siliconized polymer or a fluoropolymer. Any of the above-mentioned hydrophobic resins can be appropriately used as the top coat, and commercially available top coat materials can also be appropriately used.

At the detachment of the top coat after the exposure, use may be made of a developer. Alternatively, a separate peeling agent may be used. The peeling agent is preferably a solvent exhibiting less permeation into the film. Detachability by a developer is preferred from the viewpoint of simultaneously performing the detachment operation and the operation of film development processing.

The substrate for film formation in the present invention is not particularly limited. Use can be made of substrates commonly employed in a semiconductor production process for an IC or the like, a circuit board production process for a liquid crystal, a thermal head or the like and other photoapplication lithography processes. As such substrates, there can be mentioned, for example, inorganic substrates of silicon, SiN, $SiO_2$ and the like, and coated inorganic substrates, such as SOG. Further, according to necessity, an organic antireflection film may be provided between the film and the substrate.

As the developers containing an organic solvent, there can be mentioned, for example, developers containing a polar solvent, such as a ketone solvent, an ester solvent, an alcohol solvent, an amide solvent or an ether solvent, and developers containing a hydrocarbon solvent.

As the ketone solvent, there can be mentioned, for example, 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone or propylene carbonate.

As the ester solvent, there can be mentioned, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate (EEP), 3-methoxybutyl acetate, 3-methyl-3-methoxybutyl acetate, methyl formate, ethyl formate, butyl formate, propyl formate, ethyl lactate, butyl lactate, propyl lactate, methyl propionate, ethyl propionate or propyl propionate. In particular, acetic acid alkyl esters, such as methyl acetate, butyl acetate, ethyl acetate, isopropyl acetate and amyl acetate, and propionic acid alkyl esters, such as methyl propionate, ethyl propionate and propyl propionate, are preferred.

As the alcohol solvent, there can be mentioned, for example, an alcohol, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol, such as ethylene glycol, diethylene glycol or triethylene glycol; or a glycol ether, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol.

As the ether solvent, there can be mentioned, for example, not only any of the above-mentioned glycol ethers but also dioxane, tetrahydrofuran or the like.

As the amide solvent, there can be mentioned, for example, N-methyl-2-pyrrolidone, N,N-dimethylacetamide, N,N-dimethylformamide, hexamethylphosphoric triamide or 1,3-dimethyl-2-imidazolidinone.

As the hydrocarbon solvent, there can be mentioned, for example, an aromatic hydrocarbon solvent, such as toluene or xylene, or an aliphatic hydrocarbon solvent, such as pentane, hexane, octane or decane.

Two or more of these solvents may be mixed together before use. Alternatively, each of the solvents may be used in a mixture with water and/or a solvent other than those mentioned above within a proportion not detrimental to the exertion of satisfactory performance. However, it is preferred for the water content of the developer as a whole to be controlled at less than 10 mass %. More preferably, the developer substantially does not contain any amount of water. Namely, this developer is preferably one consisting essentially of an organic solvent. Even in that instance, this developer can contain a surfactant to be described hereinafter. Also, in that instance, the developer may contain unavoidable impurities derived from the atmosphere.

The amount of organic solvent used in the developer is preferably in the range of 80 to 100 mass %, more preferably 90 to 100 mass % and further more preferably 95 to 100 mass %, based on the total amount of the developer.

It is especially preferred for the organic solvent contained in the developer to be at least one member selected from among a ketone solvent, an ester solvent, an alcohol solvent, an amide solvent and an ether solvent. Most preferably, the organic solvent contained in the developer is an ester solvent.

The vapor pressure of the developer containing an organic solvent at 20° C. is preferably 5 kPa or below, more preferably 3 kPa or below and most preferably 2 kPa or below. When the vapor pressure of the developer is 5 kPa or below, the evaporation of the developer on the substrate or in a development cup can be suppressed so that the temperature uniformity within the plane of the wafer can be enhanced to thereby improve the dimensional uniformity within the plane of the wafer.

As particular examples of the developers exhibiting a vapor pressure of 5 kPa or below, there can be mentioned a ketone solvent, such as 1-octanone, 2-octanone, 1-nonanone, 2-nonanone, 4-heptanone, 2-hexanone, diisobutyl ketone, cyclohexanone, methylcyclohexanone, phenylacetone or methyl isobutyl ketone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, butyl formate, propyl formate, ethyl lactate, butyl lactate or propyl lactate; an alcohol solvent, such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an ether solvent, such as tetrahydrofuran; an amide solvent, such as N-methyl-2-pyrrolidone, N,N-dimethylacetamide or N,N-dimethylformamide; an aromatic hydrocarbon solvent, such as toluene or xylene, and an aliphatic hydrocarbon solvent, such as octane or decane.

As particular examples of the developers exhibiting a vapor pressure of 2 kPa or below, there can be mentioned a ketone solvent, such as 1-octanone, 2-octanone, 1-nonanone, 2-nonanone, 4-heptanone, 2-hexanone, diisobutyl ketone, cyclohexanone, methylcyclohexanone or phenylacetone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, ethyl lactate, butyl lactate or propyl lactate; an alcohol solvent, such as n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an amide solvent, such as N-methyl-2-pyrrolidone, N,N-dimethylacetamide or N,N-dimethylformamide; an aromatic hydrocarbon solvent, such as xylene, and an aliphatic hydrocarbon solvent, such as octane or decane.

According to necessity, an appropriate amount of surfactant can be added to the developer.

The surfactant is not particularly limited. For example, use can be made of any of ionic and nonionic fluorinated and/or siliconized surfactants. As such fluorinated and/or siliconized surfactants, there can be mentioned, for example, those described in JP-A's S62-36663, S61-226746, S61-226745, S62-170950, S63-34540, H7-230165, H8-62834, H9-54432 and H9-5988 and U.S. Pat. Nos. 5,405,720, 5,360,692, 5,529,881, 5,296,330, 5,436,098, 5,576,143, 5,294,511 and 5,824,451. Nonionic surfactants are preferred. Using a nonionic fluorinated surfactant or siliconized surfactant is more preferred.

The amount of surfactant used is generally in the range of 0.001 to 5 mass %, preferably 0.005 to 2 mass % and further more preferably 0.01 to 0.5 mass % based on the whole amount of the developer.

As the development method, use can be made of, for example, a method in which the substrate is dipped in a tank filled with a developer for a given period of time (dip method), a method in which a developer is puddled on the surface of the substrate by its surface tension and allowed to stand still for a given period of time to thereby effect development (puddle method), a method in which a developer is sprayed onto the surface of the substrate (spray method), or a method in which a developer is continuously discharged onto the substrate being rotated at a given speed while scanning a developer discharge nozzle at a given speed (dynamic dispense method).

In the above various development methods, when the operation of discharging a developer toward the resist film through a development nozzle of a development apparatus is included, the discharge pressure of discharged developer (flow rate per area of discharged developer) is preferably 2 ml/s/mm$^2$ or below, more preferably 1.5 ml/s/mm$^2$ or below and further more preferably 1 ml/s/mm$^2$ or below. There is no particular lower limit of the flow rate. However, from the viewpoint of through-put, it is preferred for the flow rate to be 0.2 ml/s/mm$^2$ or higher.

Pattern defects attributed to any resist residue after development can be markedly reduced by regulating the discharge pressure of discharged developer so as to fall within the above range.

The detail of the mechanism thereof is not apparent. However, it is presumed that regulating the discharge pressure so as to fall within the above range would lower the pressure on the resist film exerted by the developer, thereby inhibiting any inadvertent shaving or crumbling of the resist film and resist pattern.

The discharge pressure of developer (ml/s/mm$^2$) refers to a value at the outlet of the development nozzle of the development apparatus.

As the method of regulating the discharge pressure of the developer, there can be mentioned, for example, a method in which the discharge pressure is regulated by means of a pump or the like, a method in which the discharge pressure of the developer is changed through the pressure regulation by supply from a pressure tank, or the like.

The method of forming a pattern according to the present invention may include, after the operation of development, the operation of discontinuing the development while replacing the solvent with another solvent.

The pattern forming method of the present invention preferably comprises the rinse operation (operation of rinsing the film with a rinse liquid containing an organic solvent) to be performed after the developing operation.

The rinse liquid for use in the rinse operation is not particularly limited as long as it substantially does not dissolve the pattern after the development. Any solutions containing common organic solvents can be used.

As the rinse liquid, there can be mentioned, for example, one comprising at least one organic solvent selected from among a hydrocarbon solvent, a ketone solvent, an ester solvent, an alcohol solvent, an amide solvent and an ether solvent. The rinse liquid preferably comprises at least one organic solvent selected from among a ketone solvent, an ester solvent, an alcohol solvent and an amide solvent, and more preferably comprises an alcohol solvent or an ester solvent.

Further more preferably, the rinse liquid comprises a monohydric alcohol. Still further more preferably, the rinse liquid comprises a monohydric alcohol having 5 or more carbon atoms.

This monohydric alcohol may be in the form of a linear chain, a branched chain or a ring. As such a monohydric alcohol, there can be mentioned, for example, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol or 4-octanol. As the monohydric alcohol having 5 or more carbon atoms, there can be mentioned, for example, 1-hexanol, 2-hexanol, 4-methyl-2-pentanol, 1-pentanol or 3-methyl-1-butanol.

Two or more of these components may be mixed together before use. Also, they may be mixed with other organic solvents before use.

The water content of the rinse liquid is preferably below 10 mass %, more preferably below 5 mass % and further more preferably below 3 mass %. Namely, the amount of organic solvent used in the rinse liquid is preferably in the range of 90 to 100 mass %, more preferably 95 to 100 mass % and most preferably 97 to 100 mass % based on the total amount of the rinse liquid. Favorable development performance can be attained by controlling the water content of the rinse liquid at below 10 mass %.

The vapor pressure of the rinse liquid is preferably in the range of 0.05 to 5 kPa, more preferably 0.1 to 5 kPa and further more preferably 0.12 to 3 kPa at 20° C. When the vapor pressure of the rinse liquid is in the range of 0.05 to 5 kPa, not only can the temperature uniformity within the plane of the wafer be enhanced but also the swell attributed to the penetration of the rinse liquid can be suppressed to thereby improve the dimensional uniformity within the plane of the wafer.

The rinse liquid may be loaded with an appropriate amount of surfactant.

In the rinse operation, the wafer having undergone the development is rinsed using the above-mentioned rinse liquid. The method of rinse treatment is not particularly limited. For example, use can be made of any of a method in which the rinse liquid is continuously applied onto the substrate being rotated at a given speed (spin application method), a method in which the substrate is dipped in a tank filled with the rinse liquid for a given period of time (dip method) and a method in which the rinse liquid is sprayed onto the surface of the substrate (spray method). Preferably, the rinse treatment is carried out according to the spin application method among the above methods, and thereafter the substrate is rotated at a rotating speed of 2000 to 4000 rpm to thereby remove the rinse liquid from the top of the substrate.

The pattern forming method of the present invention may comprise the operation of development using an alkali developer (operation of forming a positive pattern) in addition to the operation of development by a developer containing an organic solvent. The sequence of the operation of development using an alkali developer and the operation of development using a developer containing an organic solvent is not particularly limited. However, it is preferred to perform the development using an alkali developer prior to the development using a developer containing an organic solvent. Also preferably, the baking operation precedes each of the development operations.

The type of alkali developer is not particularly limited. However, generally, use is made of an aqueous solution of tetramethylammonium hydroxide. An appropriate amount of alcohol and/or surfactant may be added to the alkali developer.

The alkali concentration of the alkali developer is generally in the range of 0.1 to 20 mass %. The pH value of the alkali developer is generally in the range of 10.0 to 15.0. A 2.38 mass % aqueous tetramethylammonium hydroxide solution is most preferably used as the alkali developer.

When the rinse treatment is performed after the development using an alkali developer, pure water is typically used as the rinse liquid. An appropriate amount of surfactant may be added to the rinse liquid.

EXAMPLE

The present invention will be described in greater detail below by way of its examples. However, the gist of the present invention is in no way limited to these examples.

Acid-Decomposable Resin

Synthetic Example 1

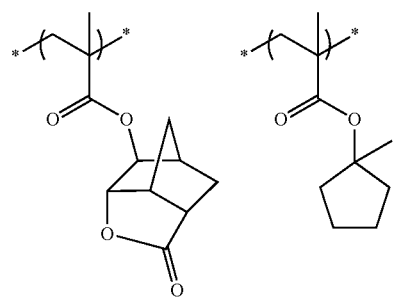

P-1

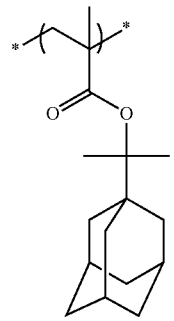

The above resin (P-1) was synthesized in the following manner.

In a nitrogen gas stream, 206.9 parts by mass of cyclohexanone was heated to 80° C. While agitating the liquid, a solution consisting of a mixture of 44.5 parts by mass of monomer of structural formula (AM) below, 33.7 parts by mass of monomer of structural formula (IM) below, 26.2 parts by mass of monomer of structural formula (JM) below, 384.3 parts by mass of cyclohexanone and 4.61 parts by mass of dimethyl 2,2'-azobisisobutyrate [V601, produced by Wako Pure Chemical Industries, Ltd.] was dropped thereinto over a period of three hours. After the completion of the dropping, the mixture was further agitated at 80° C. for two hours. The thus obtained reaction liquid was allowed to stand still to cool, and the cooled reaction liquid was re-precipitated in a large volume of hexane/ethyl acetate and filtered. The thus obtained solid was dried in vacuum, thereby obtaining 88.7 parts by mass of resin (P-1).

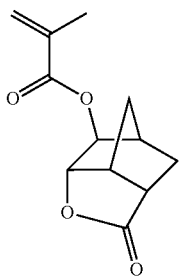

(AM)

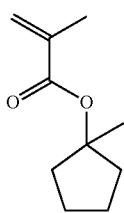

(IM)

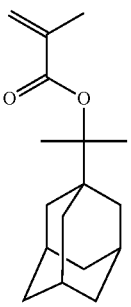

(JM)

The weight average molecular weight (Mw: polystyrene equivalent) of the obtained resin (P-1) as determined by GPC (carrier: tetrahydrofuran (THF)) was 10,500, and the dispersity (Mw/Mn) thereof was 1.65.

The resins (P-2) to (P-11) and (X-1) to (X-8) indicated in Table 2 below were synthesized in the same manner as described above. In Table 2, the characters "A" to "P" denote the structures of repeating units shown hereinafter. The numerical values on the line corresponding to each of the resins denote the molar ratios of individual repeating units. In the synthesis of each of the resins, the weight average molecular weight was regulated by changing the amount of added initiator.

TABLE 2

| Resin | A | B | C | D | E | F | G | H | I | J | K | L | M | N | O | P | Mw | Mw/Mn |
|---|---|---|---|---|---|---|---|---|---|---|---|---|---|---|---|---|---|---|
| P-1 | 40 | | | | | | | | 40 | 20 | | | | | | | 10,500 | 1.65 |
| P-2 | | 40 | | | | | | | 40 | 20 | | | | | | | 9,800 | 1.6 |
| P-3 | 40 | | | | | | | | 10 | | 50 | | | | | | 10,200 | 1.4 |
| P-4 | 40 | | | | | | | | | 20 | | 40 | | | | | 10,100 | 1.5 |
| P-5 | 40 | | | | | | | 30 | | | 30 | | | | | | 10,000 | 1.5 |
| P-6 | 50 | | | | | | | | | 20 | | | 30 | | | | 9,800 | 1.6 |
| P-7 | | | 50 | | | | | 30 | | 20 | | | | | | | 9,600 | 1.4 |
| P-8 | | | | 30 | | | | | 40 | 30 | | | | | | | 9,700 | 1.5 |
| P-9 | 40 | | | | | | | | | | | 10 | | 50 | | | 10,300 | 1.6 |
| P-10 | 60 | | | | | | | | | 10 | 30 | | | | | | 9,800 | 1.5 |
| P-11 | 40 | | | | | | | | 40 | 20 | | | | | | | 41,000 | 1.8 |
| P-12 | 40 | | | | | | | | | 20 | | | | 40 | | | 9,900 | 1.5 |
| P-13 | 40 | | | | | | | | | 25 | | | | 35 | | | 9,750 | 1.4 |
| P-14 | 40 | | | | | | | 50 | | 10 | | | | | | | 10,100 | 1.5 |
| X-1 | 40 | | | | | | | | | 20 | | | | 40 | | | 9,500 | 1.4 |
| X-2 | 30 | | | | | 10 | | | 40 | 20 | | | | | | | 9,700 | 1.5 |
| X-3 | 30 | | | | | | 10 | | 40 | 20 | | | | | | | 10,200 | 1.5 |
| X-4 | 40 | | | | | 10 | | | | | 50 | | | | | | 9,800 | 1.6 |
| X-5 | 40 | | | | | | | 10 | | | 50 | | | | | | 10,100 | 1.4 |
| X-6 | | | | | 40 | | | | 40 | 20 | | | | | | | 9,900 | 1.5 |
| X-7 | | | | 40 | | | | | 40 | 20 | | | | | | | 10,000 | 1.5 |
| X-8 | 40 | | | | | | | | | 20 | | | | | 40 | | 9,800 | 1.5 |
| Resin | A | B | C | D | E | F | G | H | I | J | K | L | M | N | O | P | Mw | Mw/Mn |

(A)  (B)  (C)

TABLE 2-continued
| Resin | A | B | C | D | E | F | G | H | I | J | K | L | M | N | O | P | Mw | Mw/Mn |
|-------|---|---|---|---|---|---|---|---|---|---|---|---|---|---|---|---|----|-------|
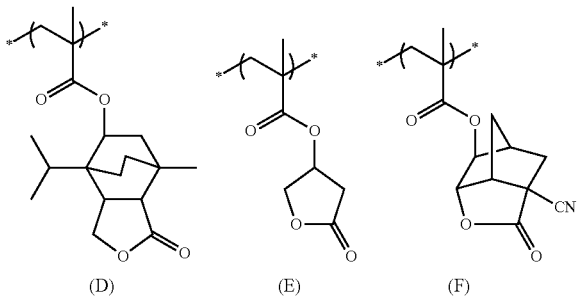
(D)　(E)　(F)
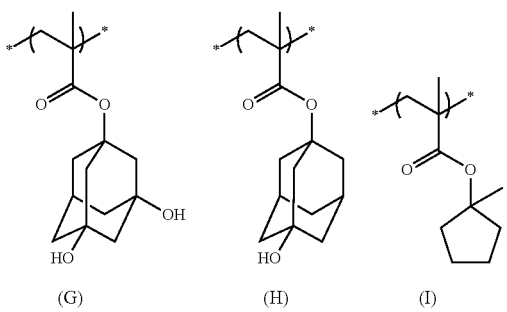
(G)　(H)　(I)
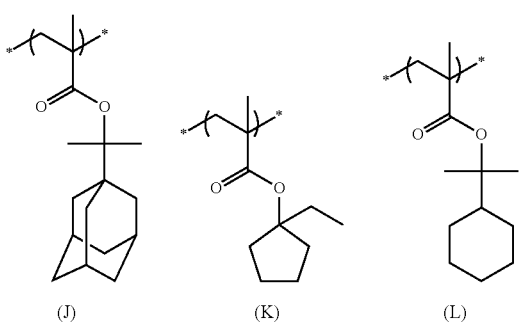
(J)　(K)　(L)
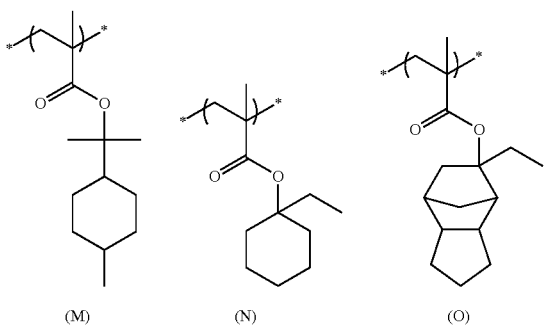
(M)　(N)　(O)
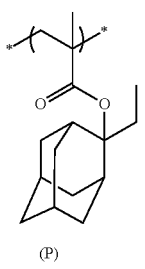
(P)

Acid Generator

Synthetic Example 2

The compounds (A-1) to (A-4), (A-6) and (A-7) shown below were synthesized with reference to the methods described in JP-A-2006-257078 and JP-A-2005-266766. WPAG-773 (produced by Wako Pure Chemical Industries, Ltd.) was used as the compound (A-5) shown below.

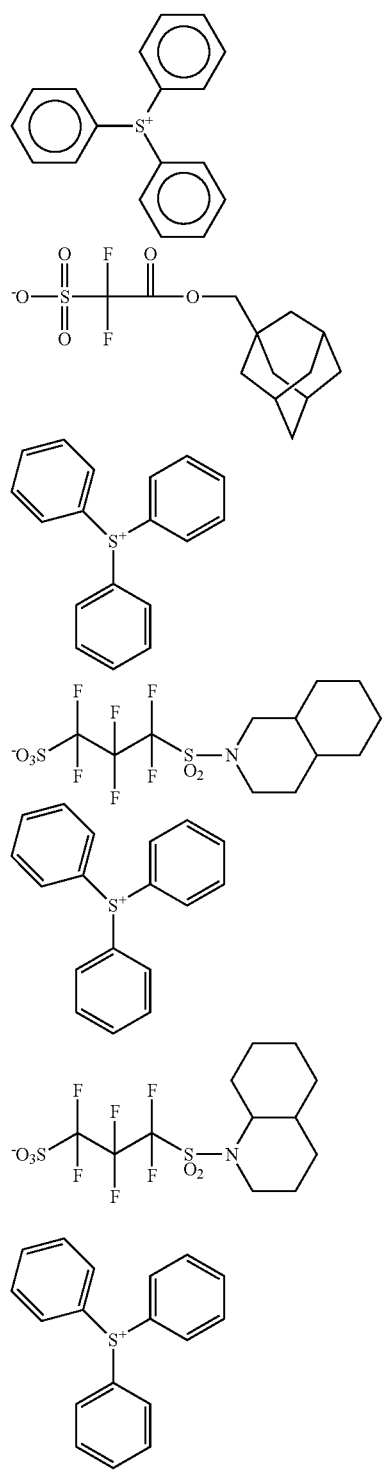

(A-1)

(A-2)

(A-3)

(A-4)

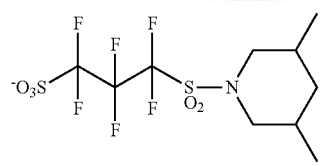

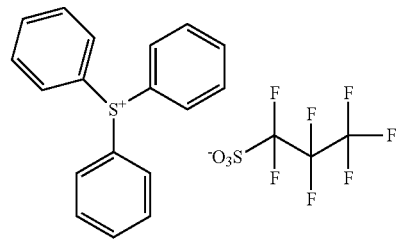

(A-5)

(A-6)

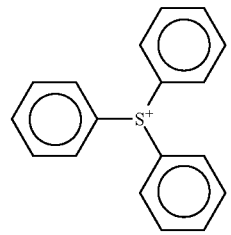

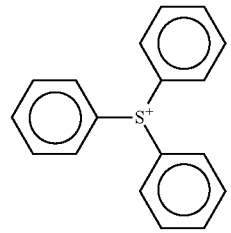

(A-7)

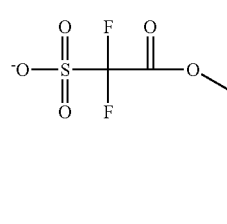

Basic Compound

Synthetic Example 3

The compound (B-1) shown below was synthesized with reference to the method described in JPA-2006-330098. Further, the compound (B-3) shown below was provided.

In addition, the compound (B-2) shown below was synthesized in the following manner.

Synthetic Example 4

Synthesis of Compound (B-2)

In a nitrogen gas stream, a mixture of 3.35 g (10.6 mmol) of 1,1,2,2,3,3-hexafluoropropane-1,3-disulfonyl fluoride and 10 ml of THF was cooled with ice. A solution consisting of a mixture of 1.80 g (10.6 mmol) of α-(piperidin-1-yl)-γ-butyrolactone and 10.73 g (106 mmol) of triethylamine was dropped into the cooled mixture over a period of 60 minutes. The mixture was agitated while cooling with ice for an hour and warmed to room temperature at which the mixture was agitated for 12 hours. Thereafter, 1.58 g (10.6 mmol) of trifluoromethanesulfonamide was added to the mixture, and agitated at 80° C. for 9 hours. Further, 100 ml of ethyl acetate and 100 ml of 1N aqueous hydrochloric acid were added to the mixture, followed by liquid separating operation, and the resultant organic phase was concentrated. The obtained concentrate was loaded with 100 ml of methanol and 3.43 g (10 mmol) of triphenylsulfonium bromide, and agitated at room temperature for 30 minutes. Thereafter, 25 ml of aqueous sodium bicarbonate (8 wt %) was added thereto, and agitated at room temperature for three hours. The methanol was evaporated off to thereby concentrate the reaction liquid. Chloroform amounting to 60 ml was added to the concentrate, and the thus obtained organic phase was washed with water. The solvent was evaporated off, and the residue was purified by column chromatography (SiO₂, chloroform/methanol=10/1 vol. ratio). Thus, 6.5 g of desired white solid compound (B-2) was obtained.

\<Surfactant\>
The following surfactant was used.
W-1: PF-6320 (produced by OMNOVA SOLUTIONS, INC.).

\<Hydrophobic Resin\>
The following hydrophobic resin was used.
Z1: compound of repeating units shown below (Mw=5000, Mw/Mn=1.4)

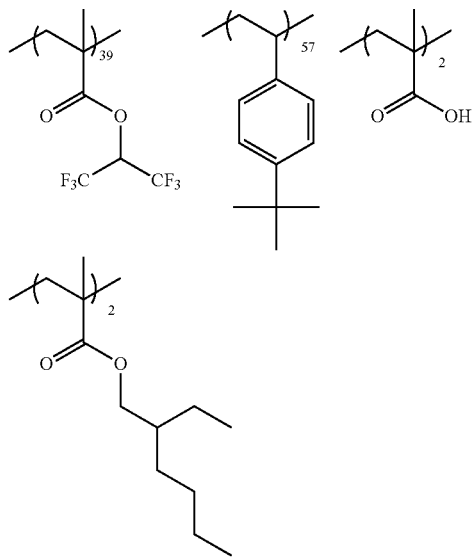

(B-1)

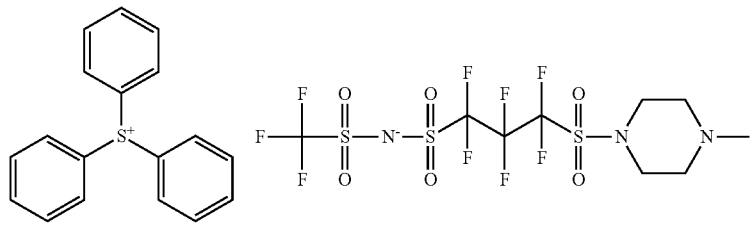

(B-2)

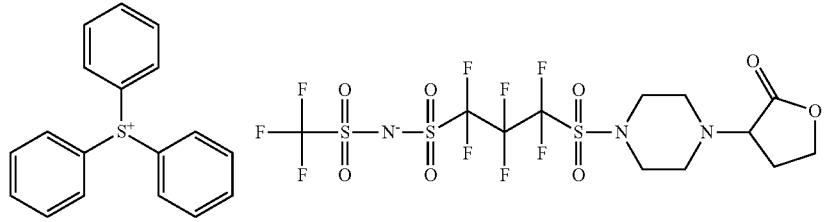

(B-3)

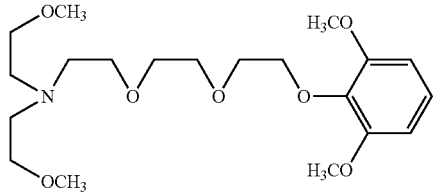

\<Solvent\>
Appropriate mixtures of the following solvents were used.
Y1: propylene glycol monomethyl ether acetate (PGMEA; also known as 1-methoxy-2-acetoxypropane),
Y2: propylene glycol monomethyl ether (PGME; also known as 1-methoxy-2-propanol),
Y3: cyclohexanone, and
Y4: 2-heptanone.

\<Preparation of Resist Composition\>

Components of Table 3 below were dissolved in solvents of the same table, thereby obtaining solutions each of 3.2 mass % solid content. The solutions were each passed through a polyethylene filter of 0.03 μm pore size, thereby obtaining resist compositions (Ar-01) to (Ar-30).

TABLE 3

| Composition | Resin (mass %) | Photoacid generator (mass %) | Basic compound (mass %) | Solvent (mass ratio) | Surfactant (mass %) | Hydrophobic resin (mass %) |
|---|---|---|---|---|---|---|
| Ar-01 | (P-1) 89.7 | (A-1) 5.0 | (B-1) 4.5 | (Y1/Y2/Y3) 60/20/20 | (W-1) 0.3 | (Z-1) 0.5 |
| Ar-02 | (P-2) 90.0 | (A-2) 5.0 | (B-2) 4.5 | (Y1/Y3) 70/30 | — | (Z-1) 0.5 |
| Ar-03 | (P-3) 89.7 | (A-1) 5.0 | (B-1) 4.5 | (Y1/Y3) 70/30 | (W-1) 0.3 | (Z-1) 0.5 |
| Ar-04 | (P-4) 89.7 | (A-1) 5.0 | (B-1) 4.5 | (Y1/Y2/Y3) 60/20/20 | (W-1) 0.3 | (Z-1) 0.5 |
| Ar-05 | (P-5) 90.0 | (A-1) 5.0 | (B-1) 4.5 | (Y1/Y2/Y3) 60/20/20 | — | (Z-1) 0.5 |
| Ar-06 | (P-6) 90.0 | (A-2) 5.0 | (B-2) 4.5 | (Y1/Y3) 70/30 | — | (Z-1) 0.5 |
| Ar-07 | (P-7) 89.7 | (A-2) 5.0 | (B-2) 4.5 | (Y1/Y3) 70/30 | (W-1) 0.3 | (Z-1) 0.5 |
| Ar-08 | (P-8) 90.0 | (A-3) 5.0 | (B-1) 4.5 | (Y1/Y3) 70/30 | — | (Z-1) 0.5 |
| Ar-09 | (P-9) 86.7 | (A-1) 11.0 | (B-3) 1.5 | (Y1/Y3) 70/30 | (W-1) 0.3 | (Z-1) 0.5 |
| Ar-10 | (P-10) 89.7 | (A-1) 5.0 | (B-1) 4.5 | (Y1/Y3) 70/30 | (W-1) 0.3 | (Z-1) 0.5 |
| Ar-11 | (P-11) 89.7 | (A-1) 5.0 | (B-1) 4.5 | (Y1/Y2/Y3) 60/20/20 | (W-1) 0.3 | (Z-1) 0.5 |
| Ar-12 | (P-1) 87.7 | (A-1) 8.0 | (B-1/B-3) 3.0/0.5 | (Y1/Y2/Y3) 60/20/20 | (W-1) 0.3 | (Z-1) 0.5 |
| Ar-13 | (P-3) 89.7 | (A-4) 5.0 | (B-1) 4.5 | (Y1/Y3) 70/30 | (W-1) 0.3 | (Z-1) 0.5 |
| Ar-14 | (P-1/P-2) 45.0/44.7 | (A-1) 5.0 | (B-1) 4.5 | (Y1/Y2/Y3) 60/20/20 | (W-1) 0.3 | (Z-1) 0.5 |
| Ar-15 | (P-1) 89.7 | (A-1/A-5) 4.0/1.0 | (B-1) 4.5 | (Y1/Y2/Y3) 60/20/20 | (W-1) 0.3 | (Z-1) 0.5 |
| Ar-16 | (P-2) 87.0 | (A-2) 11.0 | (B-3) 1.5 | (Y1/Y3) 70/30 | — | (Z-1) 0.5 |
| Ar-17 | (P-12) 89.7 | (A-1) 5.0 | (B-1) 4.5 | (Y1/Y2/Y3) 60/20/20 | (W-1) 0.3 | (Z-1) 0.5 |
| Ar-18 | (P-13) 89.7 | (A-1) 5.0 | (B-1) 4.5 | (Y1/Y2/Y3) 60/20/20 | (W-1) 0.3 | (Z-1) 0.5 |
| Ar-19 | (P-14) 89.7 | (A-1) 5.0 | (B-1) 4.5 | (Y1/Y2/Y3) 60/20/20 | (W-1) 0.3 | (Z-1) 0.5 |
| Ar-20 | (P-1) 89.7 | (A-1) 5.0 | (B-1) 4.5 | (Y1/Y4) 70/30 | (W-1) 0.3 | (Z-1) 0.5 |
| Ar-21 | (X-1) 86.7 | (A-1) 11.0 | (B-3) 1.5 | (Y-1/Y-2) 80/20 | (W-1) 0.3 | (Z-1) 0.5 |
| Ar-22 | (X-2) 86.7 | (A-1) 11.0 | (B-3) 1.5 | (Y-1/Y-2) 80/20 | (W-1) 0.3 | (Z-1) 0.5 |
| Ar-23 | (X-3) 86.7 | (A-1) 11.0 | (B-3) 1.5 | (Y-1/Y-2) 80/20 | (W-1) 0.3 | (Z-1) 0.5 |
| Ar-24 | (X-4) 86.7 | (A-1) 11.0 | (B-3) 1.5 | (Y-1/Y-2) 80/20 | (W-1) 0.3 | (Z-1) 0.5 |
| Ar-25 | (X-5) 86.7 | (A-1) 11.0 | (B-3) 1.5 | (Y-1/Y-2) 80/20 | (W-1) 0.3 | (Z-1) 0.5 |
| Ar-26 | (X-6) 86.7 | (A-1) 11.0 | (B-3) 1.5 | (Y-1/Y-2) 80/20 | (W-1) 0.3 | (Z-1) 0.5 |
| Ar-27 | (X-7) 86.7 | (A-1) 11.0 | (B-3) 1.5 | (Y-1/Y-2) 80/20 | (W-1) 0.3 | (Z-1) 0.5 |
| Ar-28 | (X-8) 86.7 | (A-2) 11.0 | (B-3) 1.5 | (Y-1/Y-2) 80/20 | (W-1) 0.3 | (Z-1) 0.5 |
| Ar-29 | (P-1) 86.7 | (A-6) 11.0 | (B-3) 1.5 | (Y-1/Y-2) 80/20 | (W-1) 0.3 | (Z-1) 0.5 |
| Ar-30 | (P-1) 86.7 | (A-7) 11.0 | (B-3) 1.5 | (Y-1/Y-2) 80/20 | (W-1) 0.3 | (Z-1) 0.5 |

<Formation of Pattern>

An organic antireflection film ARC29SR (produced by Nissan Chemical Industries, Ltd.) was applied onto a silicon wafer and baked at 205° C. for 60 seconds, thereby forming a 95 nm-thick antireflection film. Each of the resist compositions Ar-01 to Ar-26 was applied thereonto and baked at 100° C. for 60 seconds, thereby forming an 85 nm-thick resist film.

The resultant wafer was patternwise exposed through an exposure mask A or B defined below by means of an ArF liquid-immersion excimer laser scanner (manufactured by ASML, XT1700i, NA 1.2, C-Quad 20, σo/σi=0.8/0.65, XY polarization). Ultrapure water was used as the immersion liquid.

FIG. 1 is a view schematically showing the mask employed in the first exposure condition. The exposure mask A of FIG. 1 is a half-tone (HT) mask of tetragonal array in which the hole size is 90 nm and the ratio between hole size and inter-hole pitch is 1:5.

Figure 2:
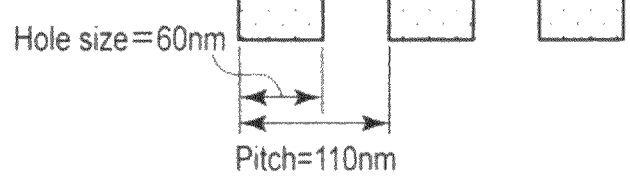
FIG. 2 is a view schematically showing the mask employed in the second exposure condition.

FIG. 2 is a view schematically showing the mask employed in the second exposure condition. The exposure mask B of FIG. 2 is a half-tone (HT) mask of tetragonal array in which the hole size is 60 nm and the inter-hole pitch is 110 nm.

Because the pattern formation conducted herein is "negative," in the mask patterns, light transmittance is blocked at the portions corresponding to holes.

Figure 3:
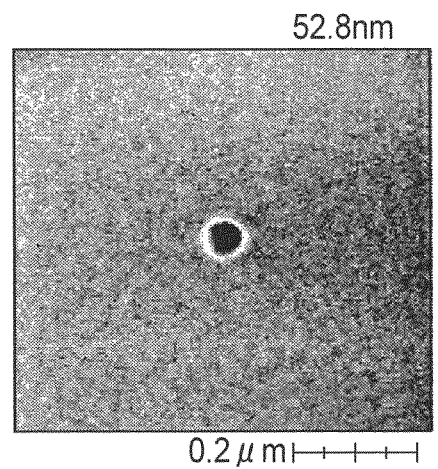
FIG. 3 is a photograph showing an example of pattern formed using the exposure mask of FIG. 1.
Figure 4:
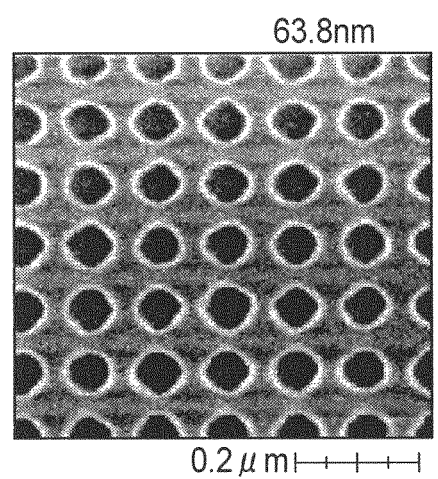
FIG. 4 is a photograph showing an example of pattern formed using the exposure mask of FIG. 2.

After the patternwise exposure, the wafer was baked at 100° C. for 60 seconds. The thus baked wafer was developed by puddling with a negative developer (butyl acetate) for 30 seconds and rinsed by puddling with a rinse liquid [methyl isobutyl carbinol (MIBC)] for 30 seconds. The rinsed wafer was rotated at a rotating speed of 4000 rpm for 30 seconds. As a result, when the exposure mask A was used, a 53 nm contact hole pattern was obtained. On the other hand, when the exposure mask B was used, a 62 nm contact hole pattern was obtained. FIG. 3 is a photograph showing an example of pattern formed using the exposure mask of FIG. 1. FIG. 4 is a photograph showing an example of pattern formed using the exposure mask of FIG. 2.

<Evaluation Method>
[Focal Depth Margin (DOF)]

The optimum exposure amount and optimum focus were respectively defined as the exposure amount and focus with which a 53 nm isolated-contact-hole pattern was formed using the exposure mask A. The focus range that allowed ±10% of the pattern size when the focus was changed (defocused) while maintaining the exposure amount at the optimum exposure amount was determined. The larger the value of the focus range, the less the change of performance per focus change and the better the depth of focus (DOF).

[Sensitivity (Eopt)]

With respect to the patterns having undergone exposure using the exposure mask B and development, the hole sizes thereof were observed by means of a critical dimension scanning electron microscope (SEM model S-9380II manufactured by Hitachi, Ltd.). The sensitivity (Eopt, mJ/cm$^2$) was defined as the optimum exposure amount in which a contact hole resist pattern of 62 nm hole size was resolved. The smaller this value, the higher the sensitivity.

[Mask Error Enhancement Factor (MEEF)]

With respect to the exposure mask A used in Examples and Comparative Examples, the hole size of the mask was varied while fixing the pitch of the mask (sum of the hole size and the space width). The change of the diameter of the hole pattern obtained at the pattern formation in the optimum exposure amount defined in the sensitivity evaluation was observed. MEEF was defined as the absolute value of the gradient thereof. Namely, MEEF defined by the following formula was calculated. The closer to 1 this value, the better the performance as resist.

Hole size of pattern (nm)=a×variation of hole size of mask (nm)+b wherein the absolute value of a=MEEF, and b=constant.

[Local Pattern Dimension Uniformity (Local CDU)]

The optimum exposure amount and optimum focus were respectively defined as the exposure amount and focus with which a 62 nm contact hole pattern was formed using the exposure mask B. While maintaining the exposure amount at the optimum exposure amount and maintaining the focus at the optimum focus, the sizes of a total of 180 holes, namely, arbitrary 20 holes in each of nine 1 µm interspaced localities, were measured. The standard deviation of measurements was determined, and 3σ was computed therefrom. The smaller the value thereof, the more favorable the performance exhibited.

[Shape of Pattern]

Upon the exposure though the mask A, the shape of the cross section of each of the patterns formed in the optimum exposure amount was observed by means of a scanning electron microscope (model S-9380II manufactured by Hitachi, Ltd.). The pattern shape was evaluated according to the following criteria.

5: the shape of cross section was rectangular, and no roughening was observed on the pattern surface.

4: the shape of cross section was approximately rectangular, and no roughening was observed on the pattern surface.

3: the shape of cross section was approximately rectangular, and roughening was observed on the pattern surface.

2: the shape of cross section was tapering or inverted tapering, and roughening was partially observed on the pattern surface.

1: the shape of cross section was tapering or inverted tapering, and roughening was observed on the pattern surface.

The obtained evaluation results are given in Table 4 below.

TABLE 4

| | Composition | DOF (µm) | Eopt (mJ/cm$^2$) | MEEF | Local CDU(nm) | Shape of pattern |
|---|---|---|---|---|---|---|
| Ex. 1 | Ar-01 | 0.14 | 18 | 2.0 | 4.0 | 5 |
| Ex. 2 | Ar-02 | 0.13 | 20 | 2.1 | 4.5 | 5 |
| Ex. 3 | Ar-03 | 0.13 | 19 | 2.0 | 4.3 | 5 |
| Ex. 4 | Ar-04 | 0.11 | 20 | 2.3 | 4.3 | 5 |
| Ex. 5 | Ar-05 | 0.11 | 21 | 2.3 | 4.5 | 5 |
| Ex. 6 | Ar-06 | 0.11 | 22 | 2.3 | 4.5 | 5 |
| Ex. 7 | Ar-07 | 0.09 | 25 | 2.5 | 4.6 | 4 |
| Ex. 8 | Ar-08 | 0.09 | 25 | 2.5 | 4.9 | 4 |
| Ex. 9 | Ar-09 | 0.08 | 24 | 2.5 | 4.6 | 4 |
| Ex. 10 | Ar-10 | 0.07 | 27 | 2.2 | 4.5 | 3 |
| Ex. 11 | Ar-11 | 0.07 | 27 | 2.2 | 4.8 | 3 |
| Ex. 12 | Ar-12 | 0.11 | 21 | 2.4 | 4.6 | 4 |
| Ex. 13 | Ar-13 | 0.08 | 27 | 2.7 | 4.3 | 4 |
| Ex. 14 | Ar-14 | 0.12 | 20 | 2.1 | 4.3 | 5 |
| Ex. 15 | Ar-15 | 0.10 | 22 | 3.0 | 4.5 | 4 |
| Ex. 16 | Ar-16 | 0.08 | 26 | 2.6 | 4.8 | 3 |
| Ex. 17 | Ar-17 | 0.13 | 19 | 2.1 | 4.0 | 5 |
| Ex. 18 | Ar-18 | 0.14 | 18 | 2.1 | 4.0 | 5 |
| Ex. 19 | Ar-19 | 0.13 | 21 | 2.2 | 4.0 | 4 |
| Ex. 20 | Ar-20 | 0.12 | 19 | 2.1 | 4.0 | 3 |
| Comp. Ex. 1 | Ar-21 | 0.07 | 35 | 4.0 | 5.5 | 4 |
| Comp. Ex. 2 | Ar-22 | 0.05 | 33 | 2.2 | 5.0 | 1 |
| Comp. Ex. 3 | Ar-23 | 0.04 | 32 | 2.1 | 4.9 | 1 |
| Comp. Ex. 4 | Ar-24 | 0.05 | 33 | 2.2 | 4.8 | 1 |
| Comp. Ex. 5 | Ar-25 | 0.05 | 33 | 2.2 | 4.7 | 1 |
| Comp. Ex. 6 | Ar-26 | 0.06 | 25 | 2.5 | 5.0 | 2 |
| Comp. Ex. 7 | Ar-27 | 0.06 | 27 | 2.4 | 5.0 | 2 |
| Comp. Ex. 8 | Ar-28 | 0.06 | 23 | 3.0 | 5.1 | 1 |
| Comp. Ex. 9 | Ar-29 | 0.05 | 30 | 3.0 | 5.3 | 1 |
| Comp. Ex. 10 | Ar-30 | 0.05 | 32 | 3.1 | 5.2 | 1 |

As apparent from Table 4, the compositions of Examples excelled the compositions of Comparative Examples in the focal depth margin (DOF) in forming an isolated contact hole pattern. Further, the compositions of Examples exhibited excellent performance in the sensitivity, mask error enhancement factor (MEEF), local pattern dimension uniformity (local CDU) and pattern shape.

<Evaluation Upon Use of Other Developer>

Patterns were formed in the same manner as mentioned above except that as the developer, EEP, MAK (methyl amyl ketone), amyl acetate and a mixed solvent of butyl acetate and MAK (mass ratio 1:1) were used in place of butyl acetate. The obtained patterns were evaluated in the same manner as mentioned above. As a result, it was ascertained that excellent performance could also be attained when developers other than butyl acetate were used.

<Evaluation Upon Skipping of Rinse Operation>

Patterns were formed in the same manner as mentioned above except that the rinse operation was skipped. The obtained patterns were evaluated in the same manner as mentioned above. As a result, it was ascertained that excellent performance could also be attained even when the rinse operation was skipped.

The composition according to the present invention can find appropriate application as a lithography process in the manufacturing of a variety of electronic devices including semiconductor elements, recording media and the like.

What is claimed is:

1. A resist composition comprising:
a resin (A) containing any of repeating units (a) of general formulae (I-a) and (I-b) below and any of repeating units (b) of general formula (II) below but containing no repeating unit in which an alcoholic hydroxyl group is introduced, wherein the resin (A) further contains a repeating unit (c) different from the repeating units (b), the repeating units (b) and the repeating unit (c) contain a group that when acted on by an acid, is decomposed, the repeating unit (c) is expressed by general formula (IV) below, and the resin (A) has a molecular weight dispersity of 1.5 to 2.0, and
a photoacid generator that when exposed to actinic rays or radiation, generates an acid, which resist composition comprises at least any of compounds (B) of general formula (III-a) below, as the photoacid generator,

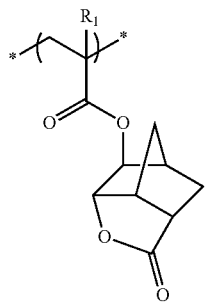
(I-a)

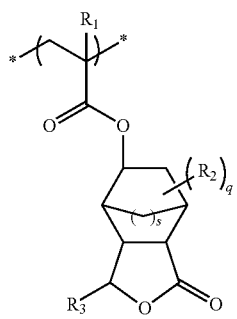
(I-b)

in which
$R_1$ represents a hydrogen atom or a methyl group,
$R_2$, when $q \geq 2$ each independently, represents an alkyl group,
$R_3$ represents a hydrogen atom or an alkyl group,
q is an integer of 0 to 3, and
s is an integer of 1 to 3,

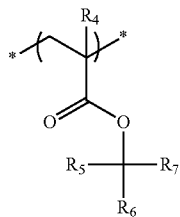
(II)

in which
$R_4$ represents a hydrogen atom or a methyl group, and
any one of $R_5$, $R_6$ and $R_7$ independently represents an alkyl group or a monocycloalkyl group, provided that the other two of $R_5$, $R_6$ and $R_7$ are bonded to each other to thereby form a monocyclic hydrocarbon structure, and

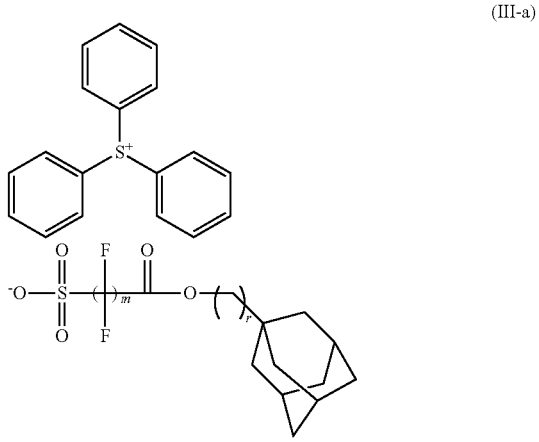
(III-a)

in which
m is an integer of 1 to 5, and
r is 1,

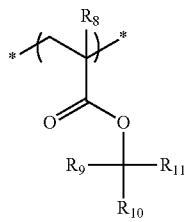
(IV)

in which
$R_8$ represents a hydrogen atom or a methyl group, and
each of $R_9$, $R_{10}$ and $R_{11}$ independently represents an alkyl group or a cycloalkyl group, provided that at least one of $R_9$, $R_{10}$ and $R_{11}$ represents a polycycloalkyl group or that any two of $R_9$, $R_{10}$ and $R_{11}$ may be bonded to each other to thereby form a polycyclic hydrocarbon structure.

2. The composition according to claim 1, wherein the resin (A) contains the repeating unit (a) in an amount of 30 to 55 mol %, the repeating unit (b) in an amount of 30 to 65 mol % and the repeating unit (c) in an amount of 5 to 30 mol %.

3. The composition according to claim 1, wherein the resin (A) has a weight average molecular weight ranging from 5000 to 30,000.

4. The composition according to claim 1, further comprising any of compounds of general formula (PDA-1) below,

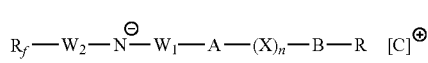

in which
Rf represents an alkyl group, a cycloalkyl group or an aryl group,
each of $W_1$ and $W_2$ independently represents —$SO_2$— or —CO—,
A represents a single bond or a bivalent connecting group,
X represents —$SO_2$— or —CO—,
n is 0 or 1,
B represents a single bond, an oxygen atom or —N(Rx)Ry-, in which Rx represents a hydrogen atom or a monovalent organic group, and Ry represents a single bond or a bivalent organic group, provided that Rx may be bonded to Ry to thereby form a ring or may be bonded to R to thereby form a ring,
R represents a monovalent organic group containing the functional group with proton acceptor properties, and
[C]$^+$ represents a counter cation.

5. The composition according to claim 4, wherein in general formula (PDA-1) X represents —$SO_2$—.

6. The composition according to claim 1, further comprising a solvent containing propylene glycol monomethyl ether acetate and cyclohexanone.

7. The composition according to claim 1, wherein the resin (A) contains the repeating unit (a) in an amount of 30 to 55 mol %, the repeating unit (b) in an amount of 30 to 65 mol % and the repeating unit (c) in an amount of 5 to 30 mol %,
wherein the resin (A) has a weight average molecular weight ranging from 5000 to 30,000, and
wherein the composition further comprises a solvent containing propylene glycol monomethyl ether acetate and cyclohexanone.

8. The composition according to claim 7, wherein a ratio of compound (B) to the whole amount of photoacid generators is more than 80 mass %.

9. The composition according to claim 7, wherein a ratio of compound (B) to the whole amount of photoacid generators is 100 mass %.

10. The composition according to claim 1, wherein the resin (A) includes only the repeating unit (b) and the repeating unit (c) as the repeating units having a group that when acted on by an acid, is decomposed.

11. A method of forming a negative pattern, comprising:
forming the composition according to claim 1 into a film,
exposing the film to light, and
developing the exposed film with a developer containing an organic solvent.

12. The method of forming a negative pattern according to claim 11, further comprising rinsing the developed film.

* * * * *